United States Patent
Ishii et al.

(10) Patent No.: US 9,255,221 B2
(45) Date of Patent: Feb. 9, 2016

(54) COMPOSITION CONTAINING BORANE COMPOUND AND CONJUGATED POLYMER COMPOUND, AND ELEMENT

(75) Inventors: Yusuke Ishii, Ibaraki (JP); Noboru Kitamura, Sapporo (JP); Eri Sakuda, Sapporo (JP); Akitaka Ito, Sapporo (JP); Kazuyoshi Kawanishi, Ibaraki (JP)

(73) Assignees: SUMITOMO CHEMICAL COMPANY, LIMITED, Tokyo (JP); NATIONAL UNIVERSITY CORPORATION HOKKAIDO UNIVERSITY, Sapporo-shi (JP)

( * ) Notice: Subject to any disclaimer, the term of this patent is extended or adjusted under 35 U.S.C. 154(b) by 165 days.

(21) Appl. No.: 14/240,905

(22) PCT Filed: Aug. 23, 2012

(86) PCT No.: PCT/JP2012/071317
§ 371 (c)(1),
(2), (4) Date: Feb. 25, 2014

(87) PCT Pub. No.: WO2013/031638
PCT Pub. Date: Mar. 7, 2013

(65) Prior Publication Data
US 2014/0191160 A1    Jul. 10, 2014

(30) Foreign Application Priority Data
Aug. 31, 2011 (JP) .................... 2011-189464

(51) Int. Cl.
| | |
|---|---|
| H01L 51/50 | (2006.01) |
| C09K 11/02 | (2006.01) |
| C08K 5/55 | (2006.01) |
| H01L 51/00 | (2006.01) |
| C08K 5/00 | (2006.01) |
| C09K 11/06 | (2006.01) |
| C08L 65/00 | (2006.01) |

(52) U.S. Cl.
CPC .............. *C09K 11/02* (2013.01); *C08K 5/0091* (2013.01); *C08K 5/55* (2013.01); *C09K 11/025* (2013.01); *C09K 11/06* (2013.01); *H01L 51/0035* (2013.01); *H01L 51/0095* (2013.01); *H01L 51/5012* (2013.01); *C08G 2261/3142* (2013.01); *C08G 2261/3162* (2013.01); *C08G 2261/411* (2013.01); *C08G 2261/5242* (2013.01); *C08G 2261/95* (2013.01); *C08L 65/00* (2013.01)

(58) Field of Classification Search
CPC . C09K 11/06; H01L 51/0039; H01L 51/5012
See application file for complete search history.

(56) References Cited

U.S. PATENT DOCUMENTS 6,767,654 B2    7/2004   Tamao et al.
6,835,473 B2 *  12/2004  Matsuura ............... C09K 11/06
                                                257/102

(Continued)

FOREIGN PATENT DOCUMENTS

JP      11-255902 A      9/1999
JP      2003-031367 A    1/2003

(Continued)

OTHER PUBLICATIONS

Kinb Luan, et al., "Organic EL Devices Having Lewis-Acid-Doped Polymer as a Hole-Injecting Layer", Journal of Photopolymer Science and Technology, 2002, pp. 261-264, vol. 15, No. 2.

(Continued)

*Primary Examiner* — Carol M Koslow
(74) *Attorney, Agent, or Firm* — Sughrue Mion, PLLC

(57) ABSTRACT

Provided is an organic material which can be employed for manufacturing an organic electroluminescent device having a long luminance half-lifetime. The organic material is a composition containing: a borane compound represented by Formula (B1):

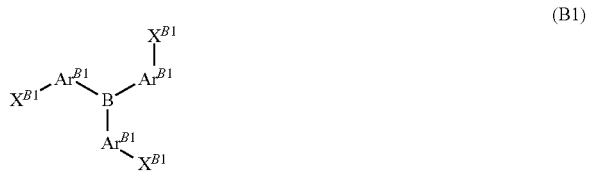

(B1)

wherein three $Ar^{B1}$ represent an arylene group or a divalent aromatic heterocyclic group; and three $X^{B1}$ represent an aromatic amino group, a monovalent aromatic heterocyclic group, an alkyl group, or a hydrogen atom; and a conjugated polymer compound represented by Formula (P1):

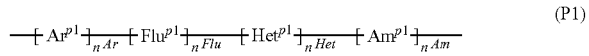

(P1)

wherein $Ar^{P1}$ represents an arylene group, with the proviso that $Ar^{P1}$ is different from $Flu^{P1}$; $Flu^{P1}$ represents a fluorene-diyl group; $Het^{P1}$ represents a divalent aromatic heterocyclic group; $Am^{P1}$ represents a divalent aromatic amine residue; $n^{Ar}$, $n^{Flu}$, $n^{Het}$ and $n^{Am}$ are numbers representing molar ratios of $Ar^{P1}$, $Flu^{P1}$, $Het^{P1}$ and $Am^{P1}$, respectively, and numbers satisfying $0.4 \leq n^{Flu} \leq 1$, $0 \leq n^{Ar} \leq 0.6$, $0 \leq n^{Het} \leq 0.6$ and $0 \leq n^{Am} \leq 0.6$ when defining $n^{Ar}+n^{Flu}+n^{Het}+n^{Am}=1$.

17 Claims, No Drawings

(56) References Cited

U.S. PATENT DOCUMENTS

| | | |
|---|---|---|
| 7,951,874 B2 | 5/2011 | Kanitz et al. |
| 2003/0152800 A1 | 8/2003 | Tamao et al. |
| 2003/0157366 A1 | 8/2003 | Matsuura et al. |
| 2006/0229431 A1 | 10/2006 | Kanitz et al. |
| 2007/0108894 A1 | 5/2007 | Hosokawa et al. |
| 2007/0191587 A1 | 8/2007 | Kanitz et al. |
| 2008/0284318 A1* | 11/2008 | Deaton ............... H01L 51/5016 313/504 |
| 2009/0114906 A1 | 5/2009 | Kanitz |

FOREIGN PATENT DOCUMENTS

| | | |
|---|---|---|
| JP | 2003-234192 A | 8/2003 |
| JP | 2004-355898 A | 12/2004 |
| JP | 2006-273792 A | 10/2006 |
| JP | 2006-525395 A | 11/2006 |
| JP | 2007-012510 A | 1/2007 |
| JP | 2007-070282 A | 3/2007 |
| JP | 2011-020970 A | 2/2011 |
| WO | 00/40586 A1 | 7/2000 |
| WO | 2007/032437 A1 | 3/2007 |

OTHER PUBLICATIONS

Masao Oda, et al., "Circularly Polarized Electroluminescence from Liquid-Crystalline Chiral Polyfluorenes", Advanced Materials, Communications, 2000, p. 362-365, vol. 12, No. 5.

* cited by examiner

COMPOSITION CONTAINING BORANE COMPOUND AND CONJUGATED POLYMER COMPOUND, AND ELEMENT

CROSS REFERENCE TO RELATED APPLICATIONS

This application is a National Stage of International Application No. PCT/JP2012/071317 filed Aug. 23, 2012, claiming priority based on Japanese Patent Application No. 2011-189464 filed Aug. 31, 2011, the contents of all of which are incorporated herein by reference in their entirety.

TECHNICAL FIELD

The present invention relates to a composition containing a borane compound and a conjugated polymer compound, a film manufactured using the composition, and a device including the film.

BACKGROUND ART

An organic electroluminescent device (hereinafter may be referred to as an "organic EL device" or a "device") includes an organic layer such as a light-emitting layer and a charge transport layer between a pair of electrodes. In recent years, an organic electroluminescent display using the device is attracting attention as a next-generation display. Particularly, there is actively developed an organic EL device using a polymer compound which enables film formation with an application method suitable for enlarging an area of the display. For example, as a technique using a conjugated polymer compound excellent in charge transport property, there are reports of a technique using polyfluorene (Non Patent Document 1) and a technique using a polymer compound containing, as a structural unit, fluorenes and arylenes (Patent Document 1).

RELATED ART DOCUMENT

Non Patent Document

Non Patent Document 1: Advanced Materials, Vol. 12 (2000), 362-365

Patent Document

Patent Document 1: International Publication No. WO 07/032437

SUMMARY OF THE INVENTION

Problem to be Solved by the Invention

However, a conventional organic EL device using a polymer compound does not always have a sufficient luminance half-lifetime, and there is a room for improvement for practical use of the device.

Accordingly, it is an object of the present invention to provide an organic material which can be employed for manufacturing an organic EL device using a polymer compound and having a long luminance half-lifetime.

Means for Solving Problem

The present inventors made intensive investigations on organic materials in order to achieve the foregoing object, and as a result, have found that the object can be achieved, resulting in the completion of the present invention.

Specifically, the present invention provides the following [1] to [16].

[1] A composition comprising:
a borane compound represented by Formula (B1) (hereinafter may be referred to as a "borane compound (B1)"):

[Chem. 1]

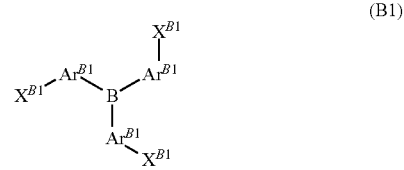

(B1)

wherein three $Ar^{B1}$ each independently represent an arylene group optionally having a substituent or a divalent aromatic heterocyclic group optionally having a substituent; and three $X^{B1}$ each independently represent an aromatic amino group optionally having a substituent, a monovalent aromatic heterocyclic group optionally having a substituent, an alkyl group optionally having a substituent, or a hydrogen atom; and a conjugated polymer compound represented by Formula (P1) (hereinafter may be referred to as a "conjugated polymer compound (P1)"):

[Chem. 2]

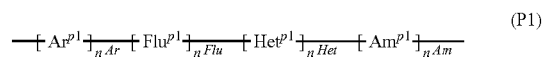

(P1)

wherein a structural unit $Ar^{p1}$ represents an arylene group optionally having a substituent, with the proviso that the structural unit $Ar^{p1}$ is different from a structural unit $Flu^{p1}$; a structural unit $Flu^{p1}$ represents a fluorenediyl group optionally having a substituent; a structural unit $Het^{p1}$ represents a divalent aromatic heterocyclic group optionally having a substituent; a structural unit $Am^{p1}$ represents a divalent aromatic amine residue optionally having a substituent; $n^{Ar}$, $n^{Flu}$, $n^{Het}$ and $n^{Am}$ are numbers representing molar ratios in the conjugated polymer compound for the structural unit $Ar^{p1}$, the structural unit $Flu^{p1}$, the structural unit $Het^{p1}$ and the structural unit $Am^{p1}$, respectively, and $n^{Ar}$, $n^{Flu}$, $n^{Het}$ and $n^{Am}$ are numbers satisfying $0.4 \leq n^{Flu} \leq 1$, $0 \leq n^{Ar} \leq 0.6$, $0 \leq n^{Het} \leq 0.6$ and $0 \leq n^{Am} \leq 0.6$ when defining $n^{Ar}+n^{Flu}+n^{Het}+n^{Am}=1$; polymerization type of the structural unit $Ar^{p1}$, the structural unit $Flu^{p1}$, the structural unit $Het^{p1}$ and the structural unit $Am^{p1}$ in the conjugated polymer compound may be any of alternating polymerization, random polymerization, block polymerization and graft polymerization; when the structural unit $Ar^{p1}$ is plurally present, they may be the same as or different from each other; when the structural unit $Flu^{p1}$ is plurally present, they may be the same as or different from each other; when the structural unit $Het^{p1}$ is plurally present, they may be the same as or different from each other; and when the structural unit $Am^{p1}$ is plurally present, they may be the same as or different from each other.

[2] The composition according to [1], wherein at least one of the three $Ar^{B1}$ is an arylene group optionally having a substituent.

[3] The composition according to [1] or [2], wherein the three $Ar^{B1}$ are each independently a group represented by Formula (Ar-001):

[Chem. 3]

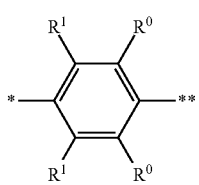

(Ar-001)

wherein two $R^0$ and two $R^1$ each independently represent a hydrogen atom, an alkyl group, an aryl group, or an aralkyl group; and a symbol "*" represents a binding position to a boron atom and a symbol "**" represents a binding position to $X^{B1}$.

[4] The composition according to [3], wherein the two $R^1$ are an alkyl group.

[5] The composition according to [1] or [2], wherein the three $Ar^{B1}$ are each independently a group represented by Formula (Ar-007):

[Chem. 4]

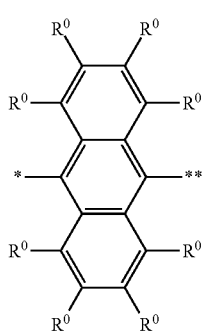

(Ar-007)

wherein a plurality of $R^0$ each independently represent a hydrogen atom, an alkyl group, an aryl group, or an aralkyl group; and a symbol "*" represents a binding position to a boron atom and a symbol "**" represents a binding position to $X^{B1}$.

[6] The composition according to any one of [1] to [5], wherein at least one of the three $X^{B1}$ is an aromatic amino group optionally having a substituent.

[7] The composition according to any one of [1] to [6], wherein the three $X^{B1}$ are each independently a group represented by Formula (X-001):

[Chem. 5]

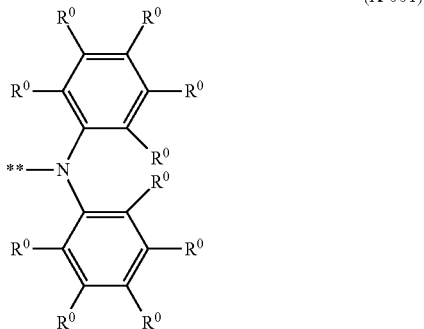

(X-001)

wherein a plurality of $R^0$ each independently represent a hydrogen atom, an alkyl group, an aryl group, or an aralkyl group; and a symbol "**" represents a binding position to $Ar^{B1}$.

[8] The composition according to any one of [1] to [7], wherein at least one of the three $X^{B1}$ is a monovalent aromatic heterocyclic group optionally having a substituent.

[9] The composition according to any one of [1] to [6] and [8], wherein the three $X^{B1}$ are each independently a group represented by Formula (X-101):

[Chem. 6]

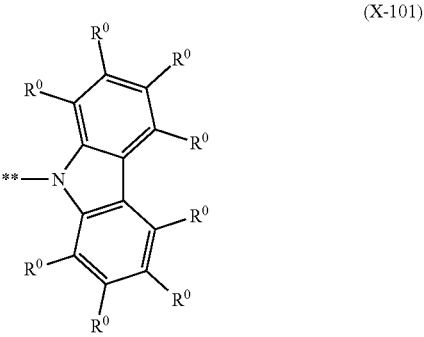

(X-101)

wherein a plurality of $R^0$ each independently represent a hydrogen atom, an alkyl group, an aryl group, or an aralkyl group; and a symbol "**" represents a binding position to $Ar^{B1}$.

[10] The composition according to any one of [3] to [9], wherein the plurality of $R^0$ are each independently a hydrogen atom or an alkyl group.

[11] The composition according to any one of [1] to [10], wherein the $n^{Het}$ and the $n^{Am}$ are 0.

[12] The composition according to any one of [1] to [11], wherein the $n^{Ar}$ and the $n^{Het}$ are 0.

[13] The composition according to any one of [1] to [12], further comprising a phosphorescent light-emitting metal complex.

[14] The composition according to any one of [1] to [13], further comprising a solvent or a dispersion medium.

[15] A film manufactured using the composition of any one of [1] to [14].

[16] A device comprising the film of [15].

[17] The device according to [16], wherein the device is an organic electroluminescent device.

Effect of Invention

The present invention can provide an organic material which can be employed for manufacturing an organic EL device using a polymer compound and having a long luminance half-lifetime.

EMBODIMENTS FOR CARRYING OUT THE INVENTION

The present invention will be described in detail below.
<Explanation of Terms>

In the present specification, the term "n-valent aromatic heterocyclic group" (n is 1 or 2) means an atomic group remaining after removing n hydrogen atoms from an aromatic heterocyclic compound and may also include an atomic group having a fused ring. The term "heterocyclic compound" means an organic compound containing not only a carbon atom but also a hetero atom such as an oxygen atom, a sulfur atom, a nitrogen atom, a phosphorus atom, a boron atom and a silicon atom as an atom constituting the ring, among organic compounds having a cyclic structure. The term "aromatic heterocyclic compound" means a heterocyclic compound exhibiting aromaticity and examples thereof include: a heterocyclic compound in which a heterocyclic ring itself exhibits aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzosilole and dibenzophosphole; and a heterocyclic compound in which a heterocyclic ring itself does not exhibit aromaticity but an aromatic ring is fused to the heterocyclic ring such as phenoxazine, phenothiazine, dibenzoborole, dibenzosilole and benzopyran.

In the present specification, Me represents a methyl group, Et represents an ethyl group, and tBu represents a tert-butyl group.

In the present specification, the term "structural unit" means a unit present in number of one or more in a polymer compound. In the present invention, it is preferable that the structural unit is present in a polymer compound as a "repeating unit" (that is, a unit present in number of two or more in a polymer compound).

In the present specification, the term "$C_m$ to $C_n$" (m and n are a positive integer and satisfy m<n) represents that the organic group described immediately after this term has m to n carbon atoms. For example, "$C_1$ to $C_{12}$ alkoxyphenoxy group" indicates that the alkoxy part in the group has 1 to 12 carbon atoms and "$C_1$ to $C_{12}$ alkylphenoxy group" indicates that the alkyl part in the group has 1 to 12 carbon atoms.

In the present specification, the wording "optionally having a substituent" noted immediately after a group name means both cases of a case where no hydrogen atom of the group is substituted with a substituent and a case where a part or all of hydrogen atoms of the group is (are) substituted with a substituent.

In the present specification, the term "substituent" means, unless defined otherwise, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a halogen atom, or a cyano group.

The alkyl group used as a substituent may be any of linear, branched, or cyclic and the alkyl group has usually 1 to 20 carbon atoms. Examples of the alkyl group used as a substituent include a methyl group, an ethyl group, a propyl group, an isopropyl group, a butyl group, a sec-butyl group, an isobutyl group, a tert-butyl group, a pentyl group, an isoamyl group, a hexyl group, a cyclohexyl group, a heptyl group, an octyl group, a 2-ethylhexyl group, a nonyl group, a decyl group, a 3,7-dimethyloctyl group, a dodecyl group, a trifluoromethyl group, a pentafluoroethyl group, a perfluorobutyl group, a perfluorohexyl group and a perfluorooctyl group.

The aryl group used as a substituent is an atomic group remaining after removing one hydrogen atom from an aromatic hydrocarbon and may also include a group having a fused ring; and a group in which two or more selected from among an independent benzene ring and a fused ring are bonded with each other either directly or through a group such as vinylene. The aryl group has usually 6 to 60, preferably 6 to 48, more preferably 6 to 20, further preferably 6 to 14 carbon atoms.

The monovalent aromatic heterocyclic group used as a substituent has usually 2 to 60, preferably 2 to 20 carbon atoms. Examples of the monovalent aromatic heterocyclic group used as a substituent include a 2-oxadiazolyl group, a 2-thiadiazolyl group, a 2-thiazolyl group, a 2-oxazolyl group, a 2-thienyl group, a 2-pyrrolyl group, a 2-furyl group, a 2-pyridyl group, a 3-pyridyl group, a 4-pyridyl group, a 2-pyrazyl group, a 2-pirimidyl group, a 2-triazyl group, a 3-piridazyl group, a 3-carbazolyl group, a 2-phenoxazinyl group, a 3-phenoxazinyl group, a 2-phenothiazinyl group and a 3-phenothiazinyl group.

The alkoxy group used as a substituent may be any one of linear, branched, or cyclic and the alkoxy group has usually 1 to 20 carbon atoms. Examples of the alkoxy group used as a substituent include a methoxy group, an ethoxy group, a propyloxy group, an isopropyloxy group, a butoxy group, a sec-butoxy group, an isobutoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a dodecyloxy group, a trifluoromethoxy group, a pentafluoroethoxy group, a perfluorobutoxy group, a perfluorohexyloxy group, a perfluorooctyloxy group, a methoxymethyloxy group, a 2-methoxyethyloxy group and a 2-ethoxyethyloxy group.

The aryloxy group used as a substituent has usually 6 to 60 carbon atoms. Examples of the aryloxy group used as a substituent include a phenoxy group, a $C_1$ to $C_{12}$ alkoxyphenoxy group, a $C_1$ to $C_{12}$ alkylphenoxy group, a 1-naphthyloxy group, a 2-naphthyloxy group and a pentafluorophenyloxy group.

The aralkyl group used as a substituent has usually 7 to 60 carbon atoms. Examples of the aralkyl group used as a substituent include a phenyl-$C_1$ to $C_{12}$ alkyl group, a $C_1$ to $C_{12}$ alkoxyphenyl-$C_1$ to $C_{12}$ alkyl group, and a $C_1$ to $C_{12}$ alkylphenyl-$C_1$ to $C_{12}$ alkyl group.

The arylalkoxy group used as a substituent has usually 7 to 60 carbon atoms. Examples of the arylalkoxy group used as a substituent include a phenyl-$C_1$ to $C_{12}$ alkoxy group, a $C_1$ to $C_{12}$ alkoxyphenyl-$C_1$ to $C_{12}$ alkoxy group, and a $C_1$ to $C_{12}$ alkylphenyl-$C_1$ to $C_{12}$ alkoxy group.

The substituted amino group used as a substituent is an amino group in which one or two hydrogen atom(s) is (are) substituted with a substituent such as an alkyl group, an aryl group, an aralkyl group and a monovalent aromatic heterocyclic group. The substituted amino group has usually 2 to 60 carbon atoms. The substituted amino group may be an amino group in which substituents are bonded to each other either directly or through a carbon atom, an oxygen atom or a sulfur atom to form a fused ring. The substituted amino group is preferably a dialkylamino group or a diarylamino group. Examples of the substituted amino group include a dimethylamino group, a diethylamino group, a diphenylamino group, a di-4-tolylamino group, a di-4-tert-butylphenylamino group, a bis(3,5-di-tert-butylphenyl)amino group, an N-carbazolyl group, an N-phenoxazinyl group, an N-acrydinyl group and an N-phenothiazinyl group.

The substituted carbonyl group used as a substituent is a monovalent group obtained by bonding an alkyl group, an aryl group, an aralkyl group or a monovalent aromatic heterocyclic group to a carbonyl group. The substituted carbonyl group has usually 2 to 60 carbon atoms. Examples of the substituted carbonyl group include an acetyl group, a butyryl group and a benzoyl group.

The substituted carboxyl group used as a substituent is a carboxyl group in which a hydrogen atom is substituted with a substituent such as an alkyl group, an aryl group and a monovalent aromatic heterocyclic group. The substituted carboxyl group has usually 2 to 60 carbon atoms. Examples of the substituted carboxyl group include a methoxycarbonyl group, an ethoxycarbonyl group, a butoxycarbonyl group, a phenoxycarbonyl group and a benzyloxycarbonyl group.

Examples of the halogen atom used as a substituent include a fluorine atom, a chlorine atom, a bromine atom and an iodine atom, and a fluorine atom is preferable.

The substituent noted above may further have a substituent (hereinafter may be referred to as an "additional substituent"). As the additional substituent, the same substituent as noted above may be used unless specified otherwise.

In the present specification, the term "aromatic amino group" means an amino group in which at least one of hydrogen atoms is substituted with an aryl group or a monovalent aromatic heterocyclic group. The aromatic amino group has usually 10 to 60 carbon atoms. The carbon atoms of a substituent that the aromatic amino group has are not included in the carbon atom number.

In the present specification, the term "aromatic amino group optionally having a substituent" means an aromatic amino group optionally having a substituent selected from the group consisting of an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a halogen atom and a cyano group and examples thereof include groups represented by Formulae 201 to 214 below.

[Chem. 7]

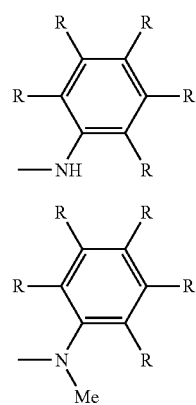

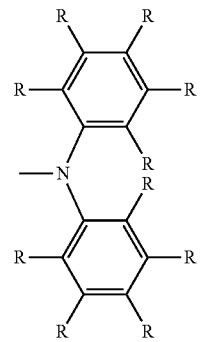

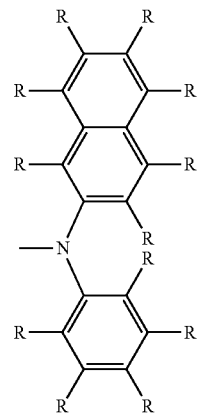

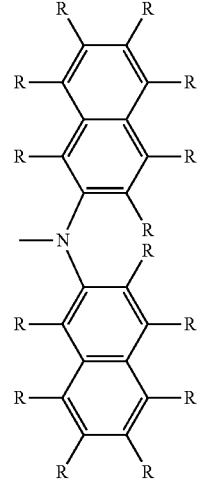

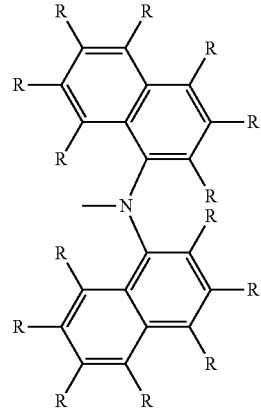

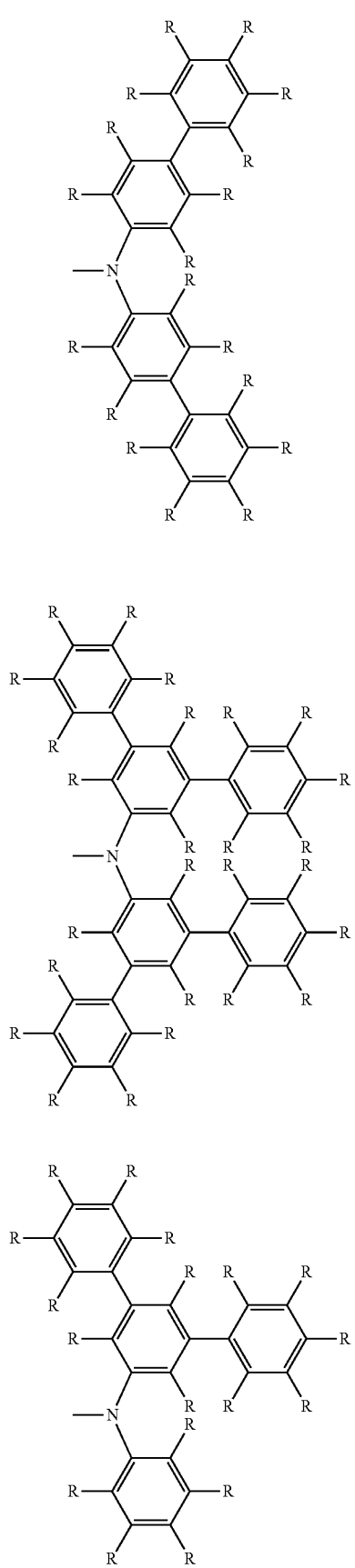
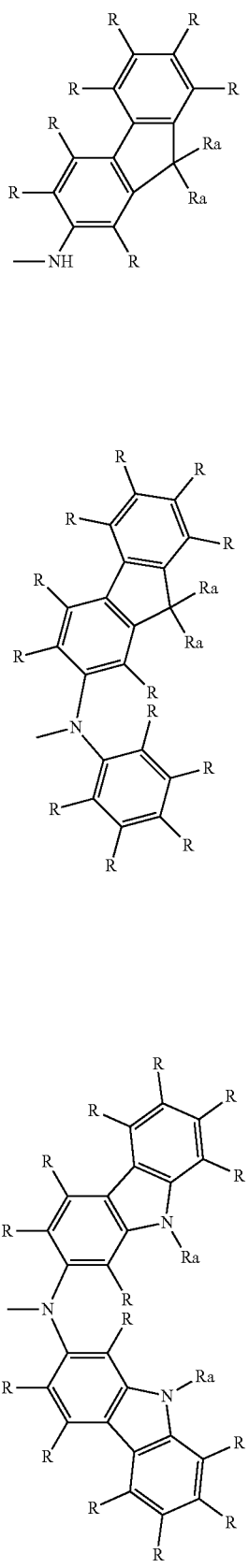

-continued

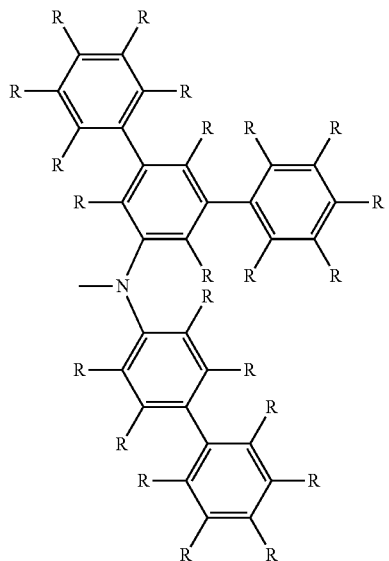

213

214

In Formulae, a plurality of R are each independently a hydrogen atom or a substituent and a plurality of Ra are each independently a substituent selected from the group consisting of an alkyl group, an aryl group, a monovalent aromatic heterocyclic group and an aralkyl group. The plurality of R may be combined with each other to form a ring structure. The plurality of Ra may be combined with each other to form a ring structure.

In Formula 201 to Formula 214, a plurality of R are each independently a hydrogen atom or a substituent and are preferably a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom or a cyano group, more preferably a hydrogen atom, an alkyl group, an aryl group, a monovalent aromatic heterocyclic group, an alkoxy group, an aryloxy group, an aralkyl group or a substituted amino group, further preferably a hydrogen atom, an alkyl group or an aryl group, particularly preferably a hydrogen atom or an alkyl group.

The substituent represented by R may further have an additional substituent.

In Formula 201 to Formula 214, a plurality of Ra each independently represent a substituent selected from the group consisting of an alkyl group, an aryl group, a monovalent aromatic heterocyclic group and an aralkyl group.

The substituent represented by Ra may further have an additional substituent.

In Formula 201 to Formula 214, the additional substituent that Ra has is preferably an alkyl group, an alkoxy group or an aryl group, and more preferably an aryl group or an alkyl group.

In Formula 201 to Formula 214, the ring structure formed by combining a plurality of R with each other is preferably a cyclopentyl ring, a cyclohexyl ring or a cycloheptyl ring and these rings may have an additional substituent. The additional substituent is preferably an alkyl group, an alkoxy group or an aryl group, and more preferably an aryl group or an alkyl group.

In Formula 201 to Formula 214, the ring structure formed by combining a plurality of Ra with each other is preferably a cyclopentyl group, a cyclohexyl group or a cycloheptyl group and these rings may have an additional substituent. The additional substituent is preferably an alkyl group, an alkoxy group or an aryl group, and more preferably an aryl group or an alkyl group.

In the present specification, the term "arylene group" means an atomic group remaining after removing two hydrogen atoms from an aromatic hydrocarbon and may also include a group having a fused ring; and a group in which two or more selected from an independent benzene ring and a fused ring are bonded with each other either directly or through a group such as vinylene. The arylene group has usually 6 to 60 carbon atoms. The carbon atoms of a substituent that the arylene group has are not included in the carbon atom number.

In the present specification, the term "arylene group optionally having a substituent" means an arylene group optionally having a substituent selected from the group consisting of an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a halogen atom and a cyano group.

Examples of the arylene group optionally having a substituent include: phenylene groups such as a 1,4-phenylene group represented by Formula 001 below, a 1,3-phenylene group represented by Formula 002 below and a 1,2-phenylene group represented by Formula 003 below; naphthalenediyl groups such as a naphthalene-1,4-diyl group represented by Formula 004 below, a naphthalene-1,5-diyl group represented by Formula 005 below and a naphthalene-2,6-diyl group represented by Formula 006 below; anthracenediyl groups such as an anthracene-1,4-diyl group represented by Formula 007 below, an anthracene-1,10-diyl group represented by Formula 008 below, an anthracene-1,5-diyl group represented by Formula 009 below, an anthracene-9,10-diyl group represented by Formula 010 below and an anthracene-2,6-diyl group represented by Formula 011 below; dihydrophenanthrenediyl groups such as a 9,10-dihydrophenanthrene-2,7-diyl group represented by Formula 012 below; and fluorenediyl groups such as a fluorene-2,7-diyl group represented by Formula 013 below and a fluorene-3,6-diyl group represented by Formula 014 below.
[Chem. 8]
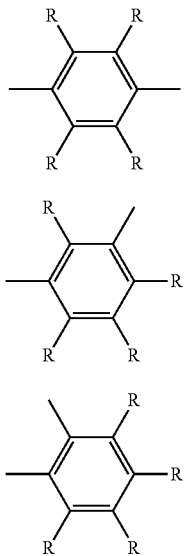
[Chem. 9]
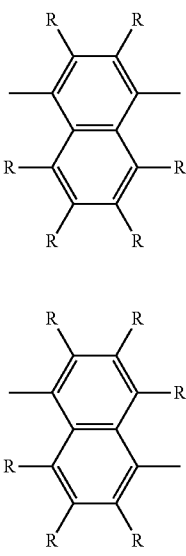
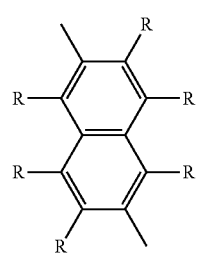
[Chem. 10]
001
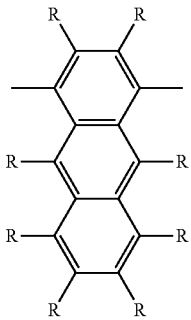
002
003
004
005
006
007
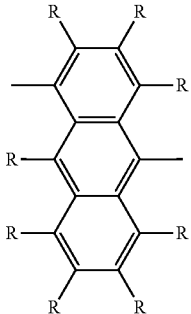
008
009
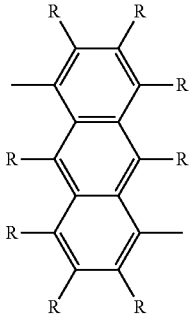
010
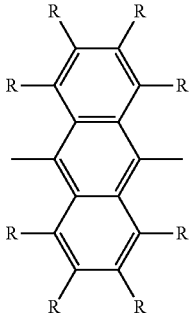
011
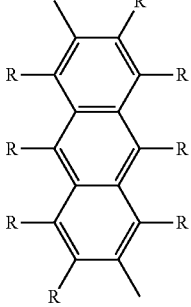

[Chem. 11]

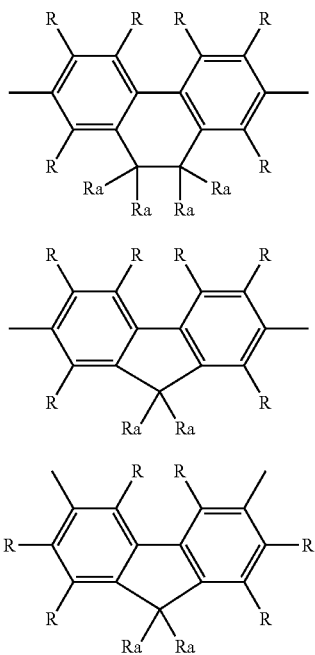

In Formulae, R and Ra are the same as defined above.

In Formula 001 to Formula 014, examples and preferable examples of R and Ra are the same as those of R and Ra described with respect to Formula 201 to Formula 214.

In the present specification, the term "divalent aromatic heterocyclic group" means an atomic group remaining after removing two hydrogen atoms from an aromatic heterocyclic compound and may also include a group having a fused ring. The divalent aromatic heterocyclic group has usually 2 to 60 carbon atoms. The carbon atoms of a substituent that the divalent aromatic heterocyclic group has are not included in the carbon atom number.

In the present specification, a term "divalent aromatic heterocyclic group optionally having a substituent" means a divalent aromatic heterocyclic group optionally having a substituent selected from the group consisting of an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a halogen atom and a cyano group.

Examples of the divalent aromatic heterocyclic group optionally having a substituent include: pyridinediyl groups such as a pyridine-2,5-diyl group represented by Formula 101 below and a pyridine-2,6-diyl group represented by Formula 102 below; pyrimidinediyl groups such as a pyrimidine-4,6-diyl group represented by Formula 103 below; a triazine-2,4-diyl group represented by Formula 104 below; pyrazinediyl groups such as a pyrazine-2,5-diyl group represented by Formula 105 below; pyridazinediyl groups such as a pyridazine-3,6-diyl group represented by Formula 106 below; quinolinediyl groups such as a quinoline-2,6-diyl group represented by Formula 107 below; isoquinolinediyl groups such as an isoquinoline-1,4-diyl group represented by Formula 108 below; quinoxalinediyl groups such as a quinoxaline-5,8-diyl group represented by Formula 109 below; carbazolediyl groups such as a group represented by Formula 110 below and a group represented by Formula III below; dibenzofurandiyl groups such as a group represented by Formula 112 below and a group represented by Formula 113 below; dibenzothiophenediyl groups such as a group represented by Formula 114 below and a group represented by Formula 115 below; dibenzosiloldiyl groups such as a group represented by Formula 116 below and a group represented by Formula 117 below; phenoxazinediyl groups such as a group represented by Formula 118 below and a group represented by Formula 119 below; phenothiazinediyl groups such as a group represented by Formula 120 below and a group represented by Formula 121 below; dihydroacridinediyl groups such as a group represented by Formula 122 below; divalent groups represented by Formula 123 below; pyrrolediyl groups such as a pyrrole-2,5-diyl group represented by Formula 124 below; furandiyl groups such as a furan-2,5-diyl group represented by Formula 125 below; thiophenediyl groups such as a thiophene-2,5-diyl group represented by Formula 126 below; diazolediyl groups such as a diazole-2,5-diyl group represented by Formula 127 below; triazolediyl groups such as a triazole-2,5-diyl group represented by Formula 128 below; oxazolediyl groups such as an oxazole-2,5-diyl group represented by Formula 129 below; an oxadiazole-2,5-diyl group represented by Formula 130 below; thiazolediyl groups such as a thiazole-2,5-diyl group represented by Formula 131 below; and a thiadiazole-2,5-diyl group represented by Formula 132 below.

[Chem. 12]

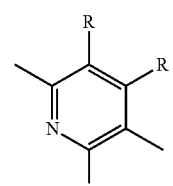

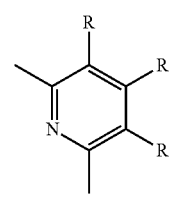

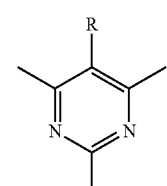

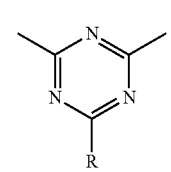

-continued
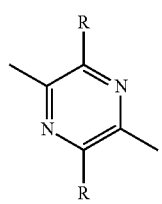
105
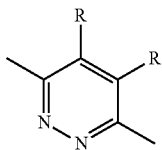
106
[Chem. 13]
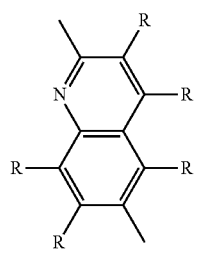
107
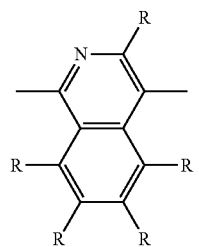
108
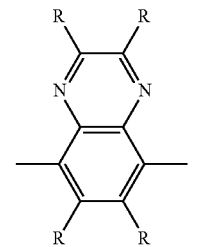
109
[Chem. 14]
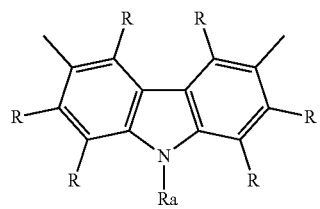
110
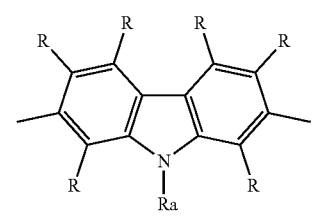
111
-continued
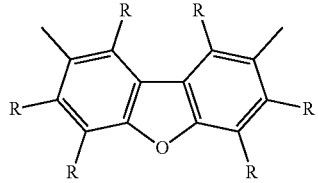
112
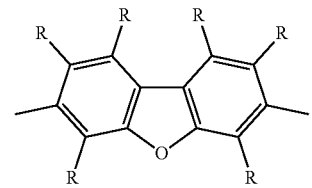
113
[Chem. 15]
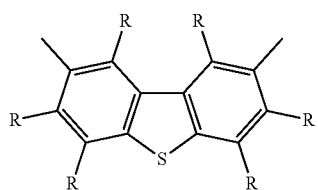
114
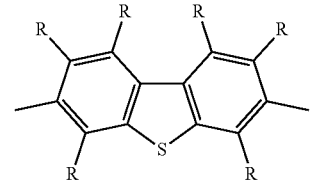
115
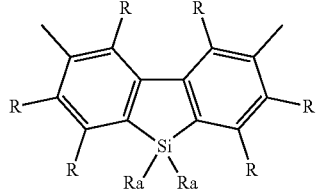
116
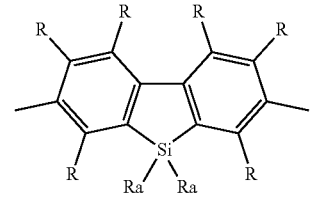
117
[Chem. 16]
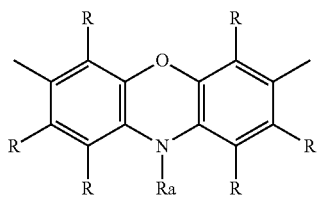
118

-continued

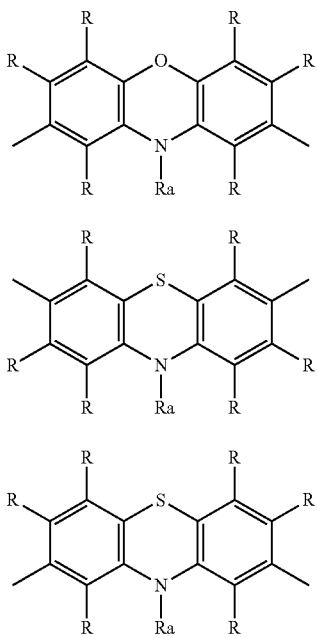

[Chem. 17]

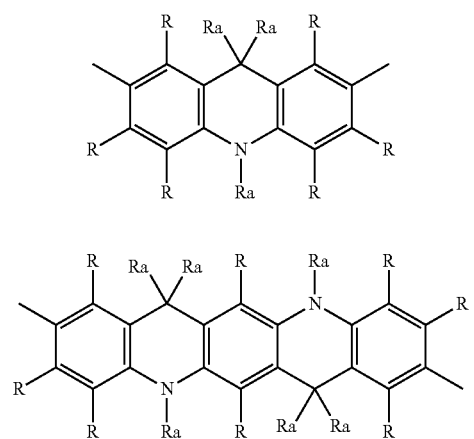

[Chem. 18]

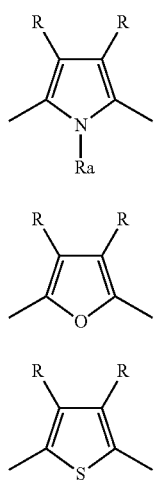

-continued

[Chem. 19]

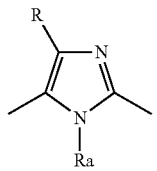
119

120

121

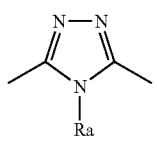
122

123

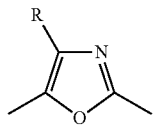
124

125

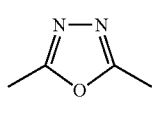
126

127

128

129

130

131

132

In Formulae, R and Ra are the same as defined above.

In Formula 101 to Formula 132, examples and preferable examples of R and Ra are the same as those of R and $R_a$ described with respect to Formula 201 to Formula 214.

In the present specification, the term "monovalent aromatic heterocyclic group optionally having a substituent" means a monovalent aromatic heterocyclic group optionally having a substituent selected from the group consisting of an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a halogen atom and a cyano group. The monovalent aromatic heterocyclic group in the "monovalent aromatic heterocyclic group optionally having a substituent" has usually 2 to 60, preferably 2 to 20 carbon atoms. Examples of the monovalent aromatic heterocyclic group include a 2-oxadiazolyl group, a 2-thiadiazolyl group, a 2-thiazolyl group, a 2-oxazolyl group, a 2-thienyl group, a 2-pyrrolyl group, a 2-furyl group, a 2-pyridyl group, a 3-pyridyl group, a 4-pyridyl group, a 2-pyrazyl group, a 2-pirimidyl group, a 2-triazyl group, a 3-piridazyl group, a 3-carbazolyl group, a 2-phenoxazinyl group, a 3-phenoxazinyl group, a 2-phenothiazinyl group and a 3-phenothiazinyl group.

In the present specification, the term "alkyl group optionally having a substituent" means an alkyl group optionally having a substituent selected from the group consisting of an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a halogen atom and a cyano group. The alkyl group in the "alkyl group optionally having a substituent" may be any of linear, branched, and cyclic and has usually 1 to 20 carbon atoms. Examples of the alkyl group in the "alkyl group optionally having a substituent" include a methyl group, an ethyl group, a propyl group, an isopropyl group, a butyl group, a sec-butyl group, an isobutyl group, a tert-butyl group, a pentyl group, an isoamyl group, a hexyl group, a cyclohexyl group, a heptyl group, an octyl group, a 2-ethylhexyl group, a nonyl group, a decyl group, a 3,7-dimethyloctyl group and a dodecyl group.

<Borane Compound (B1)>

The borane compound (B1) contained in the composition of the present invention has a structure represented by Formula (B1):

[Chem. 20]

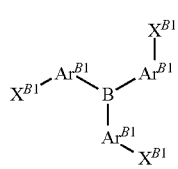

(B1)

wherein three $Ar^{B1}$ each independently represent an arylene group optionally having a substituent or a divalent aromatic heterocyclic group optionally having a substituent; and three $X^{B1}$ each independently represent an aromatic amino group optionally having a substituent, a monovalent aromatic heterocyclic group optionally having a substituent, an alkyl group optionally having a substituent or a hydrogen atom.

In Formula (B1), from the viewpoints of simplicity of synthesis of the borane compound (B1) and light-emitting characteristics such as a luminance half-lifetime of an organic EL device obtained using the composition of the present invention, it is preferable that at least one of the three $Ar^{B1}$ is an arylene group optionally having a substituent and it is more preferable that all of the three $Ar^{B1}$ are an arylene group optionally having a substituent.

As an arylene group optionally having a substituent which may be used as $Ar^{B1}$, groups represented by Formulae (Ar-001) to (Ar-015) below are preferable.

[Chem. 21]

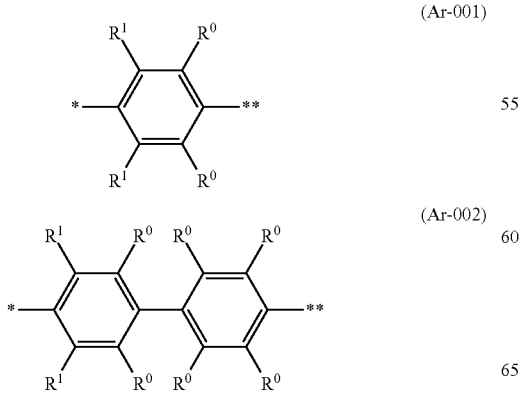

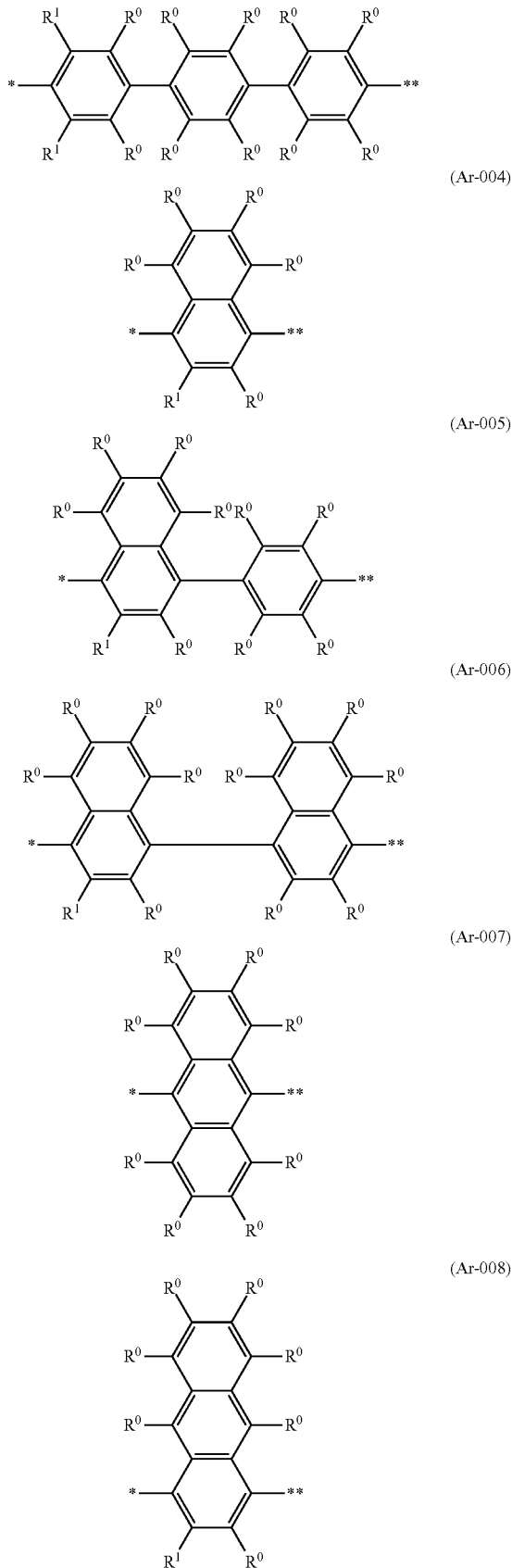

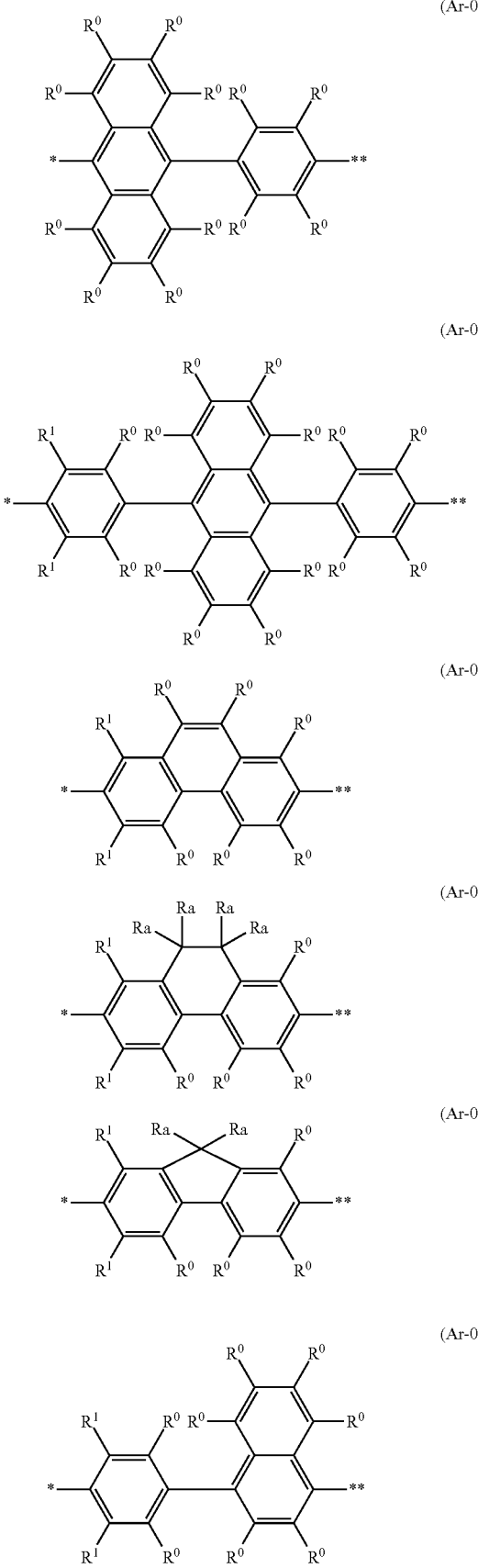

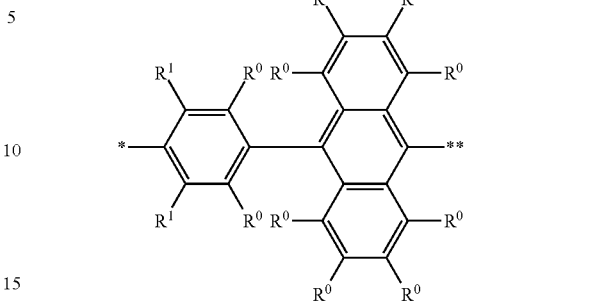

In Formulae, R⁰ represents a hydrogen atom, an alkyl group, an aryl group or an aralkyl group; R¹ represents a hydrogen atom, an alkyl group, an aryl group or an aralkyl group; Ra is the same as defined above; and a symbol "*" represents a binding position to a boron atom and a symbol "**" represents a binding position to $X^{B1}$.

In Formula (Ar-001) to Formula (Ar-015), a plurality of $R^0$ each independently represent a hydrogen atom, an alkyl group, an aryl group or an aralkyl group and are preferably a hydrogen atom or an alkyl group.

The substituent represented by $R^0$ may have an additional substituent.

In Formula (Ar-001) to Formula (Ar-015), $R^1$ each independently represents a hydrogen atom, an alkyl group, an aryl group or an aralkyl group and is preferably an alkyl group. When $R^1$ is plurally present, they may be the same as or different from each other but it is preferable that all of them are an alkyl group.

The substituent represented by $R^1$ may have an additional substituent.

In Formula (Ar-012) and Formula (Ar-013), examples and preferable examples of Ra are the same as those of Ra described with respect to Formula 201 to Formula 214.

Among them, from the viewpoint of light-emitting characteristics of an organic EL device obtained using the composition of the present invention, groups represented by Formula (Ar-001) to Formula (Ar-010) are preferable and groups represented by Formula (Ar-001) and Formula (Ar-007) are more preferable.

Particularly, from the viewpoint of light-emitting characteristics of the organic EL device when the organic EL device is a phosphorescent organic EL device, groups represented by Formula (Ar-001) to Formula (Ar-006) are preferable, groups represented by Formula (Ar-001) to Formula (Ar-003) are more preferable, and a group represented by Formula (Ar-001) is further preferable.

As a divalent aromatic heterocyclic group optionally having a substituent which may be used as $Ar^{B1}$, groups represented by Formulae (Ar-101) to (Ar-119) below are preferable.

[Chem. 22]
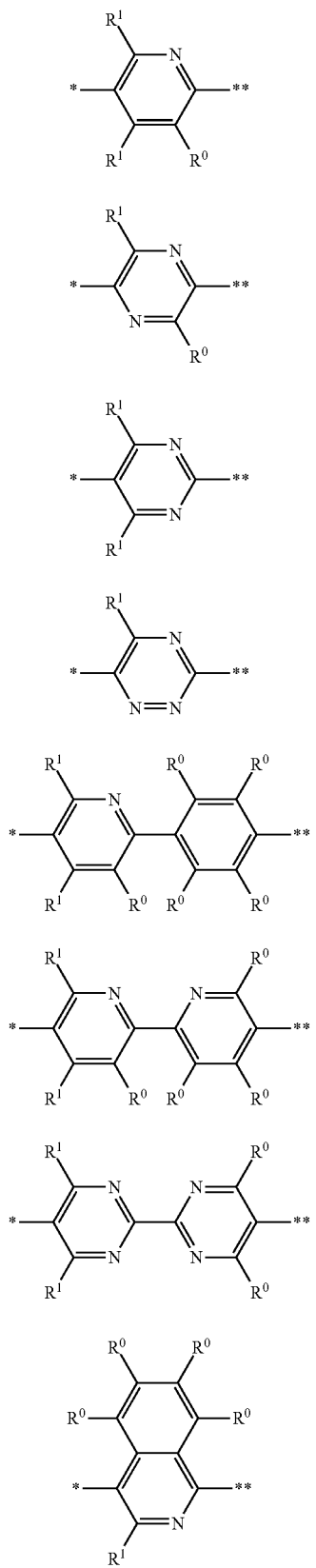
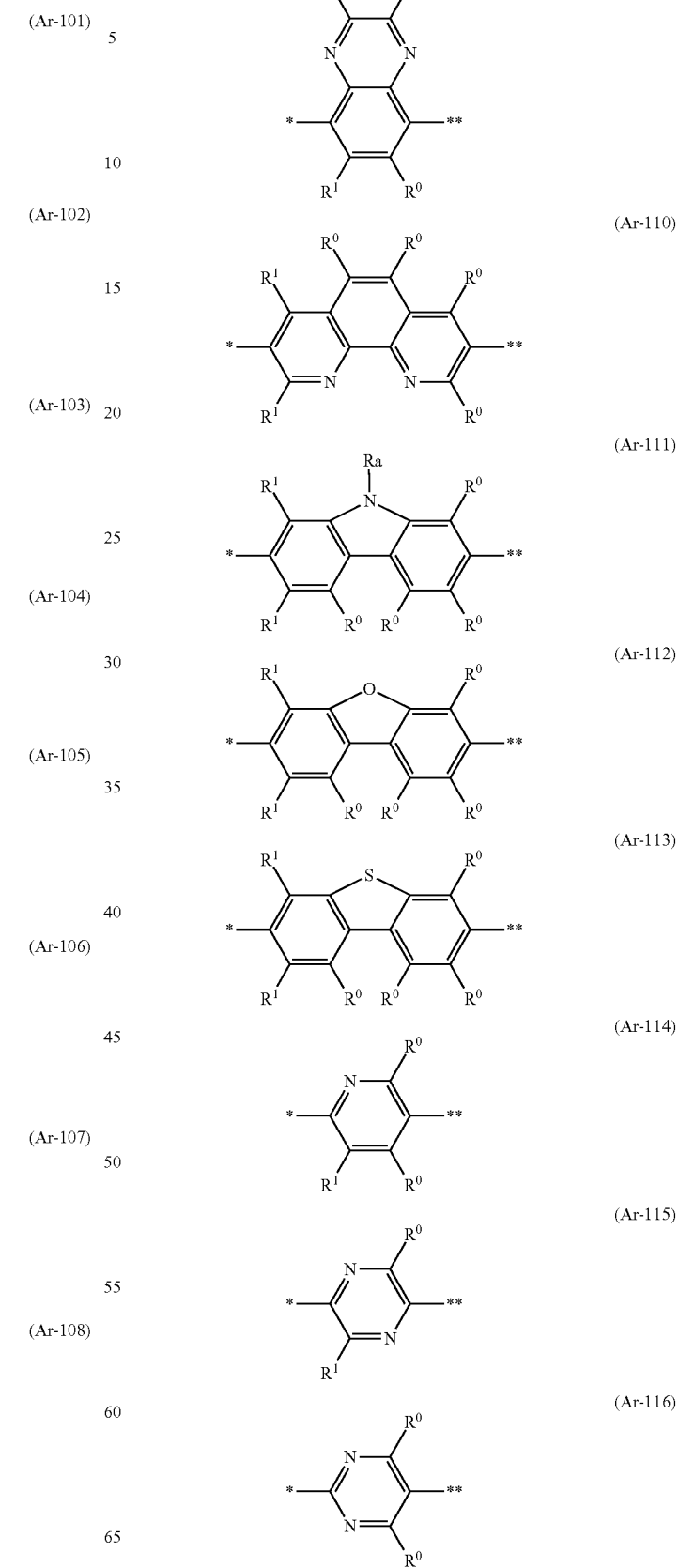

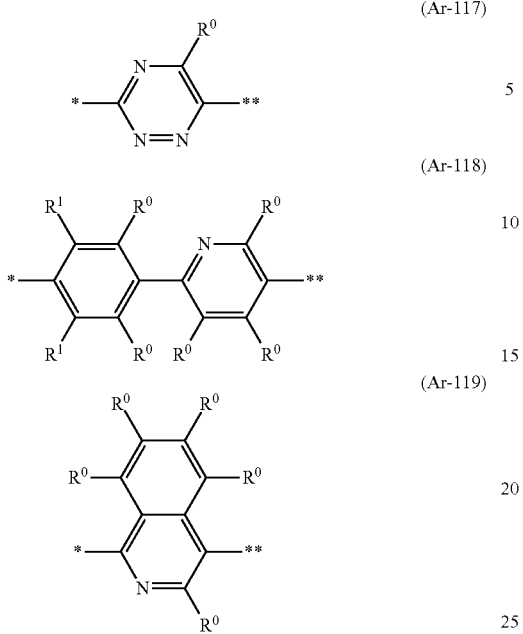

(Ar-117)
(Ar-118)
(Ar-119)

In Formulae, $R^0$, $R^1$, Ra, a symbol "*" and a symbol "**" are the same as defined above).

In Formula (Ar-101) to Formula (Ar-119), a plurality of $R^0$ each independently represent a hydrogen atom, an alkyl group, an aryl group or an aralkyl group and are preferably a hydrogen atom or an alkyl group.

The substituent represented by $R^0$ may have an additional substituent.

In Formula (Ar-101) to Formula (Ar-119), $R^1$ each independently represents a hydrogen atom, an alkyl group, an aryl group or an aralkyl group and is preferably an alkyl group. When $R^1$ is plurally present, they may be the same as or different from each other but it is preferable that all of them are an alkyl group.

The substituent represented by $R^1$ may have an additional substituent.

In Formula (Ar-111), examples and preferable examples of Ra are the same as those of Ra described with respect to Formula 201 to Formula 214.

Among them, from the viewpoint of light-emitting characteristics of an organic EL device obtained using the composition of the present invention, groups represented by Formula (Ar-101) to Formula (Ar-110) are preferable and groups represented by Formula (Ar-101) to Formula (Ar-103) and Formula (Ar-105) to Formula (Ar-109) are more preferable.

In Formula (B1), from the viewpoints of simplicity of synthesis of the borane compound (B1) and light-emitting characteristics of a device obtained using the composition of the present invention, it is preferable that at least two of the three $Ar^{B1}$ are the same group as each other and it is more preferable that all of the three $Ar^{B1}$ are the same group.

In one preferable embodiment, the three $Ar^{B1}$ in Formula (B1) are each independently a group represented by Formula (Ar-001). In such an embodiment, particularly preferable is an aspect in which the two $R^1$ in Formula (Ar-001) are an alkyl group.

In another preferable embodiment, the three $Ar^{B1}$ in Formula (B1) are each independently a group represented by Formula (Ar-007).

From the viewpoint of charge transport property of the composition of the present invention, $X^{B1}$ is preferably an aromatic amino group optionally having a substituent or a monovalent aromatic heterocyclic group optionally having a substituent.

As an aromatic amino group optionally having a substituent which may be used as $X^{B1}$, groups represented by Formulae (X-001) to (X-011) below are preferable.

[Chem. 23]

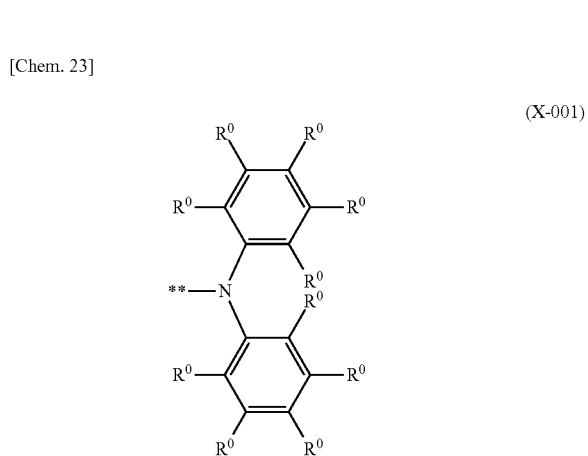

(X-001)

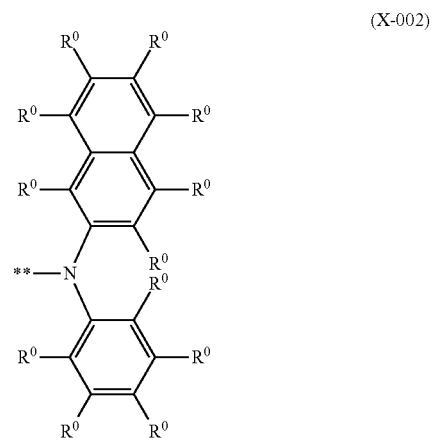

(X-002)

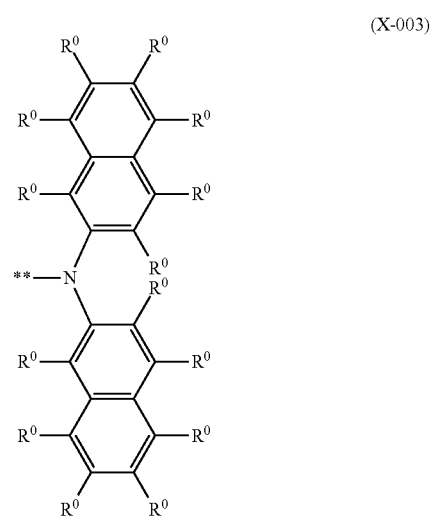

(X-003)

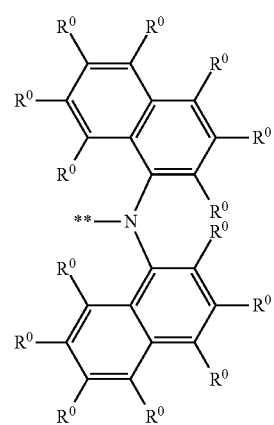
(X-004)
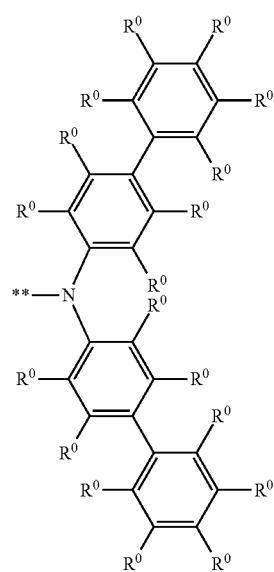
(X-005)
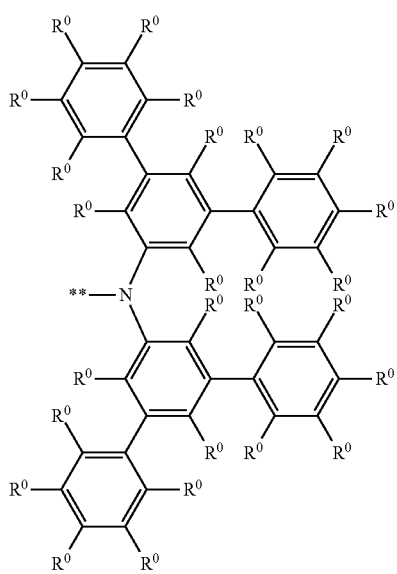
(X-006)
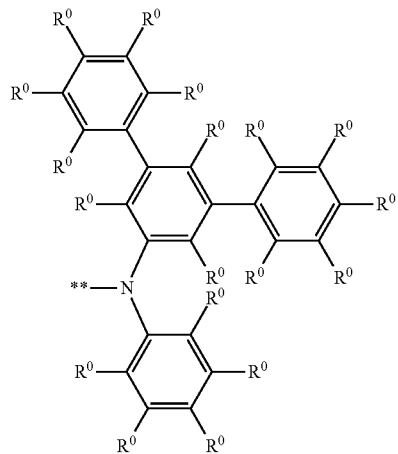
(X-007)
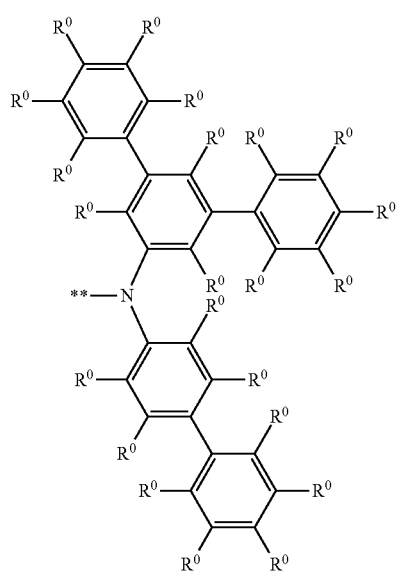
(X-008)
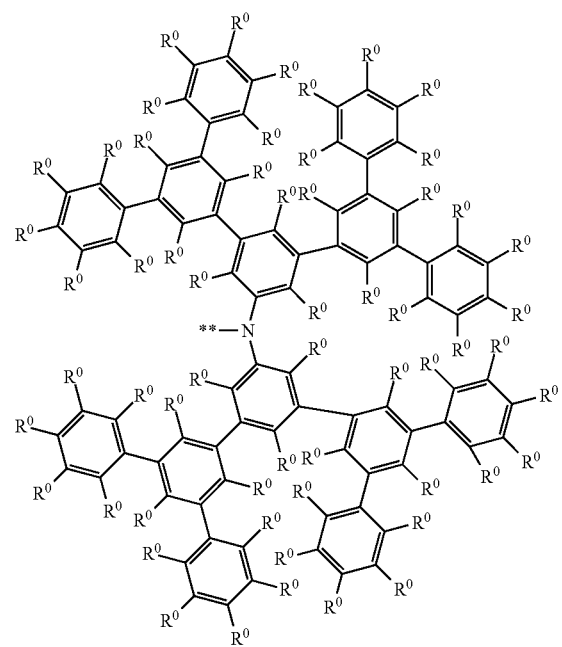
(X-009)

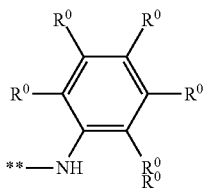
(X-010)

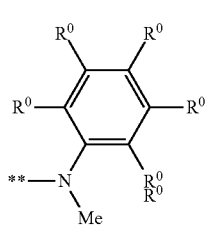
(X-011)

In Formulae, $R^0$ is the same as defined above; and a symbol "**" indicates a binding position to $Ar^{B1}$.

In Formula (X-001) to Formula (X-011), a plurality of $R^0$ each independently represent a hydrogen atom, an alkyl group, an aryl group or an aralkyl group and are preferably a hydrogen atom or an alkyl group.

The substituent represented by $R^0$ may have an additional substituent.

Among them, from the viewpoint of charge transport property of the composition of the present invention, groups represented by Formula (X-001) to Formula (X-009) are preferable, groups represented by Formula (X-001) and Formula (X-005) to Formula (X-009) are more preferable, and a group represented by Formula (X-001) is further preferable.

As a monovalent aromatic heterocyclic group optionally having a substituent which may be used as XB1, groups represented by Formula (X-101) to Formula (X-110) and Formula (X-201) to Formula (X-225) below are preferable.

[Chem. 24]

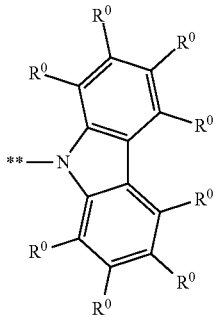
(X-101)

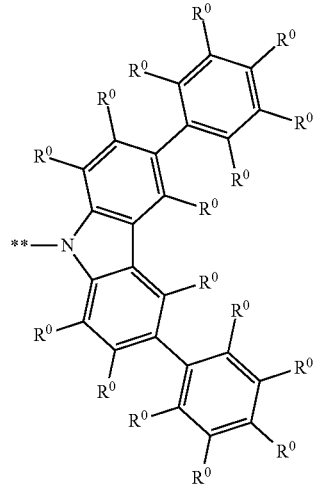
(X-102)

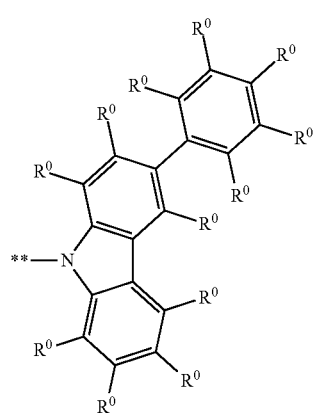
(X-103)

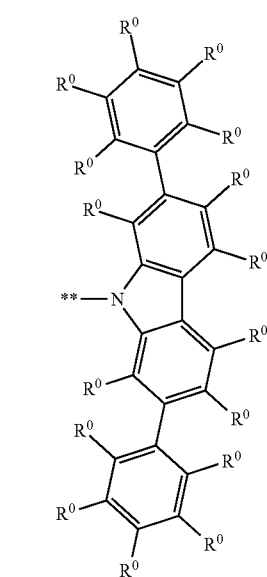
(X-104)

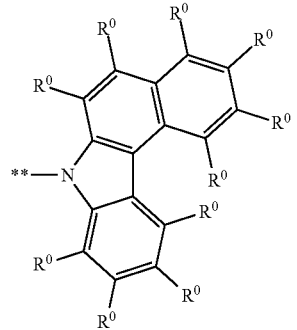
(X-105)
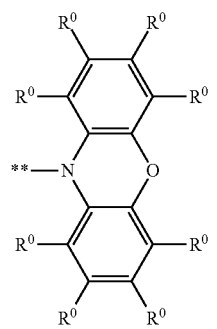
(X-106)
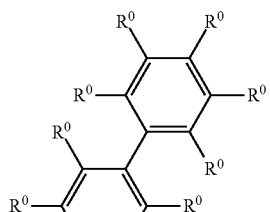
(X-107)
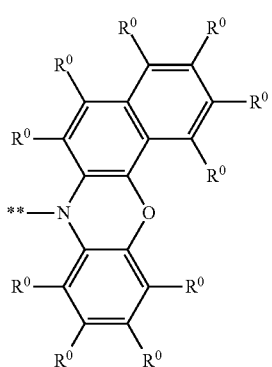
(X-108)
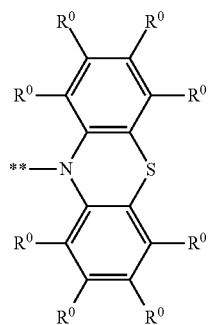
(X-109)
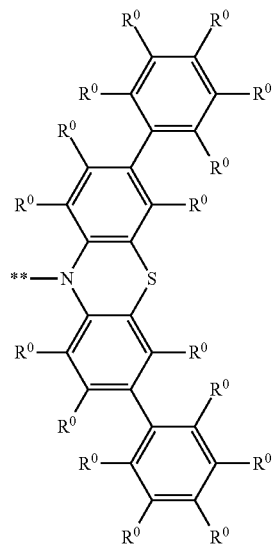
(X-110)
[Chem. 25]
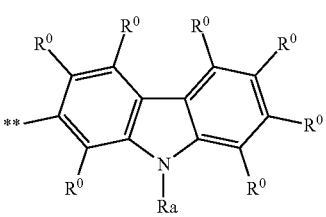
(X-201)
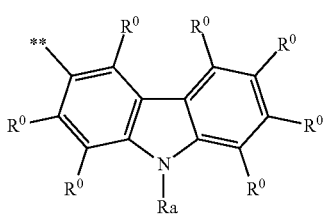
(X-202)
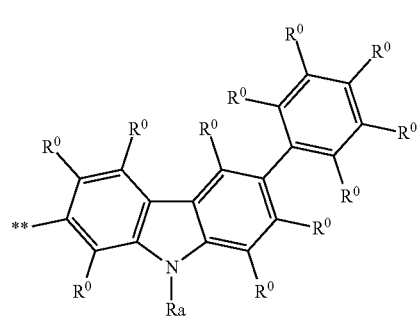
(X-203)

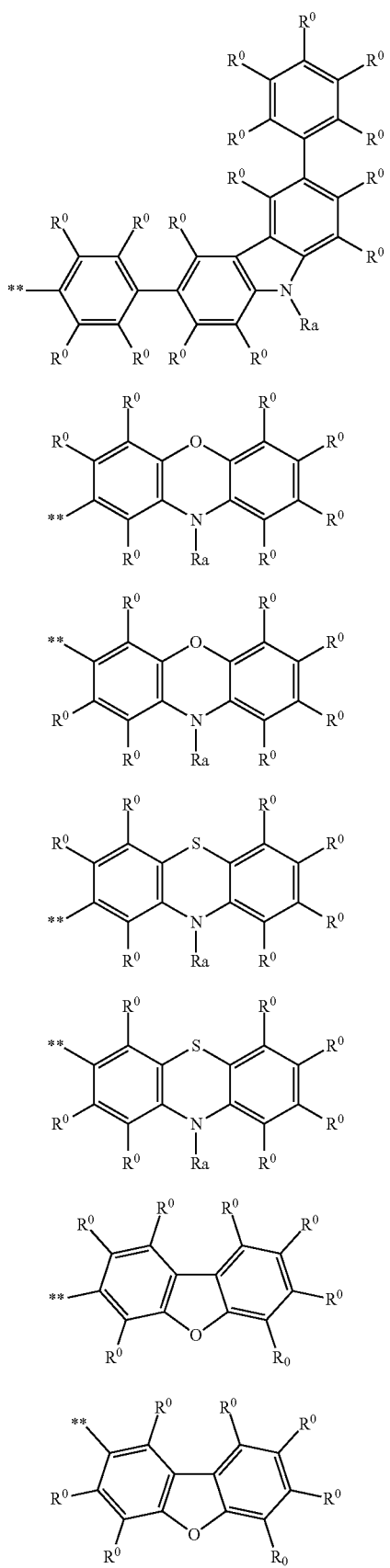
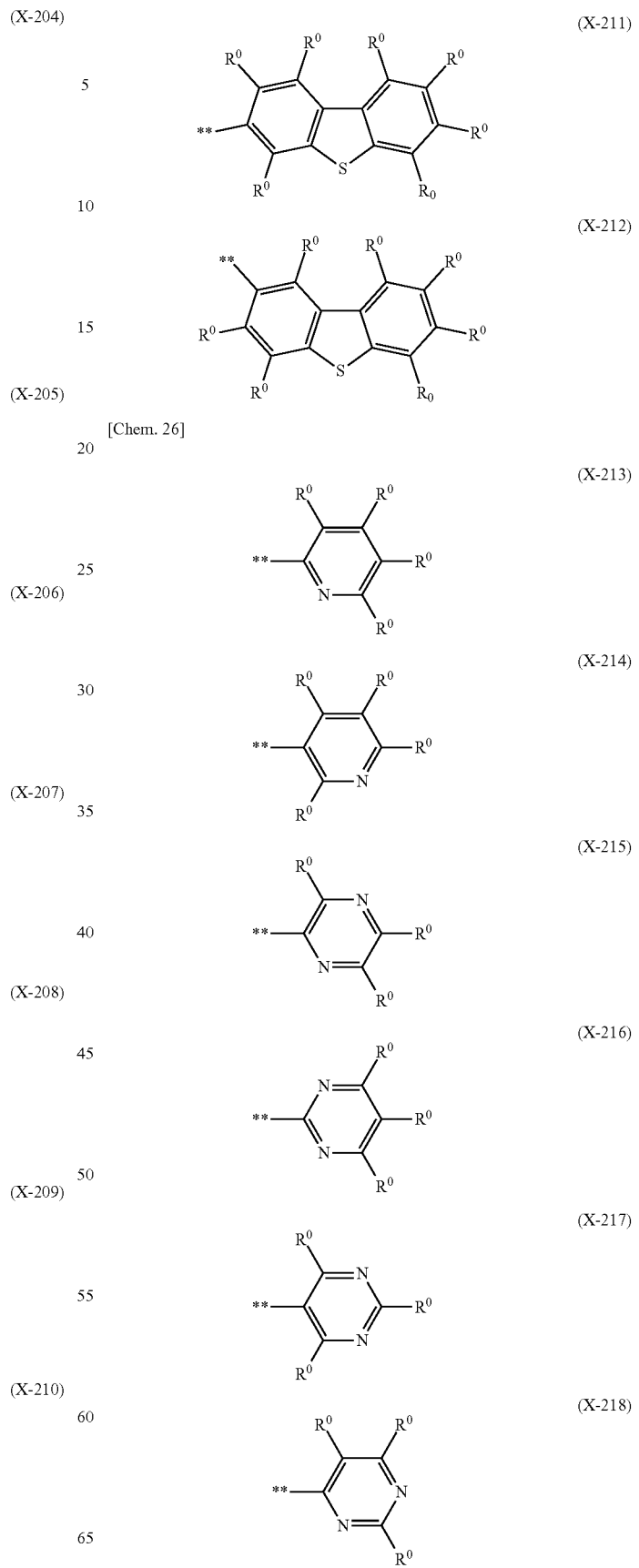

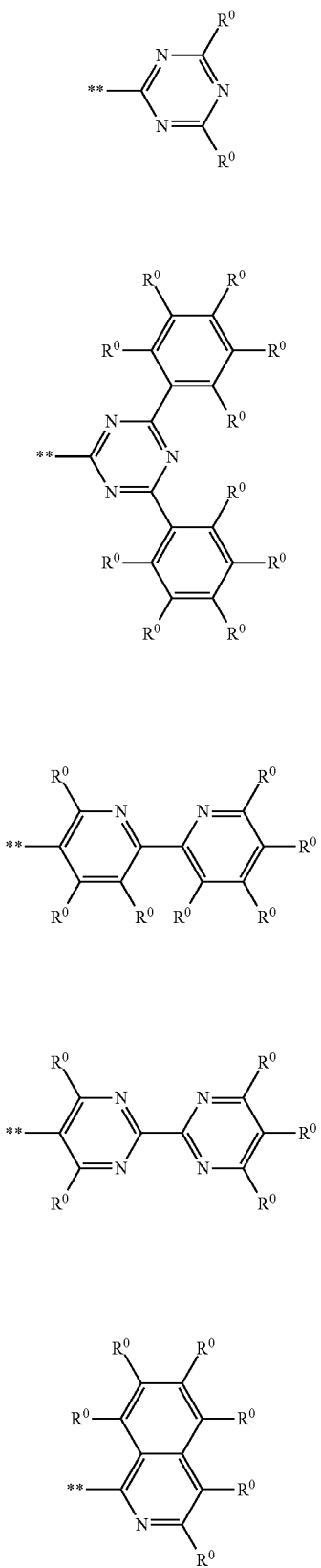

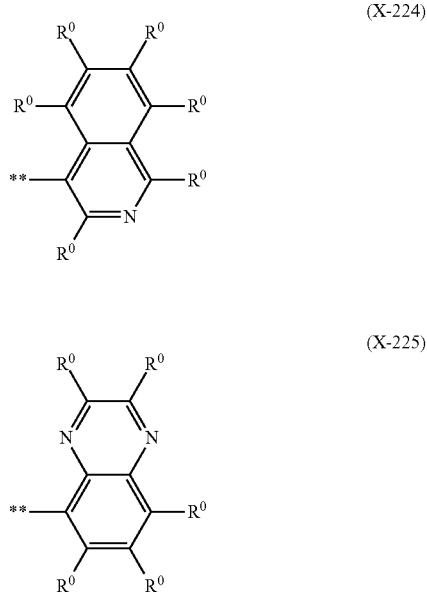

In Formulae, $R^0$ and Ra are the same as defined above; and a symbol "**" indicates a binding position to $Ar^{B1}$.

In Formula (X-101) to Formula (X-110) and Formula (X-201) to Formula (X-225), a plurality of $R^0$ each independently represent a hydrogen atom, an alkyl group, an aryl group or an aralkyl group and are preferably a hydrogen atom or an alkyl group.

The substituent represented by $R^0$ may have an additional substituent.

In Formula (X-201) to Formula (X-208), examples and preferable examples of Ra are the same as those of Ra described with respect to Formula 201 to Formula 214.

Among them, from the viewpoint of charge transport property of the composition of the present invention, groups represented by Formula (X-101) to Formula (X-110) and Formula (X-201) to Formula (X-225) are preferable, groups represented by Formula (X-101) to Formula (X-105), Formula (X-201) to Formula (X-204), Formula (X-215) to Formula (X-222), and Formula (X-225) are more preferable, and a group represented by Formula (X-101) is further preferable.

In Formula (B1), from the viewpoints of simplicity of synthesis of the compound and electron transport property of the device, it is preferable that at least two of the three $X^{B1}$ are the same group as each other and it is more preferable that all of the three $X^{B1}$ are the same group.

In one preferable embodiment, three $X^{B1}$ in Formula (B1) are each independently a group represented by Formula (X-001).

In another preferable embodiment, three $X^{B1}$ in Formula (B1) are each independently a group represented by Formula (X-101).

The molecular weight of the borane compound (B1) is usually 200 to 6,000, preferably 400 to 4,000, more preferably 800 to 3,000, because the luminance half-lifetime of the device could be remarkably improved in a combination with the conjugated polymer compound (P1).

Examples of the borane compound (B1) used in the present invention include compounds represented by Formula (B-001) to Formula (B-021) below.

[Chem. 27]
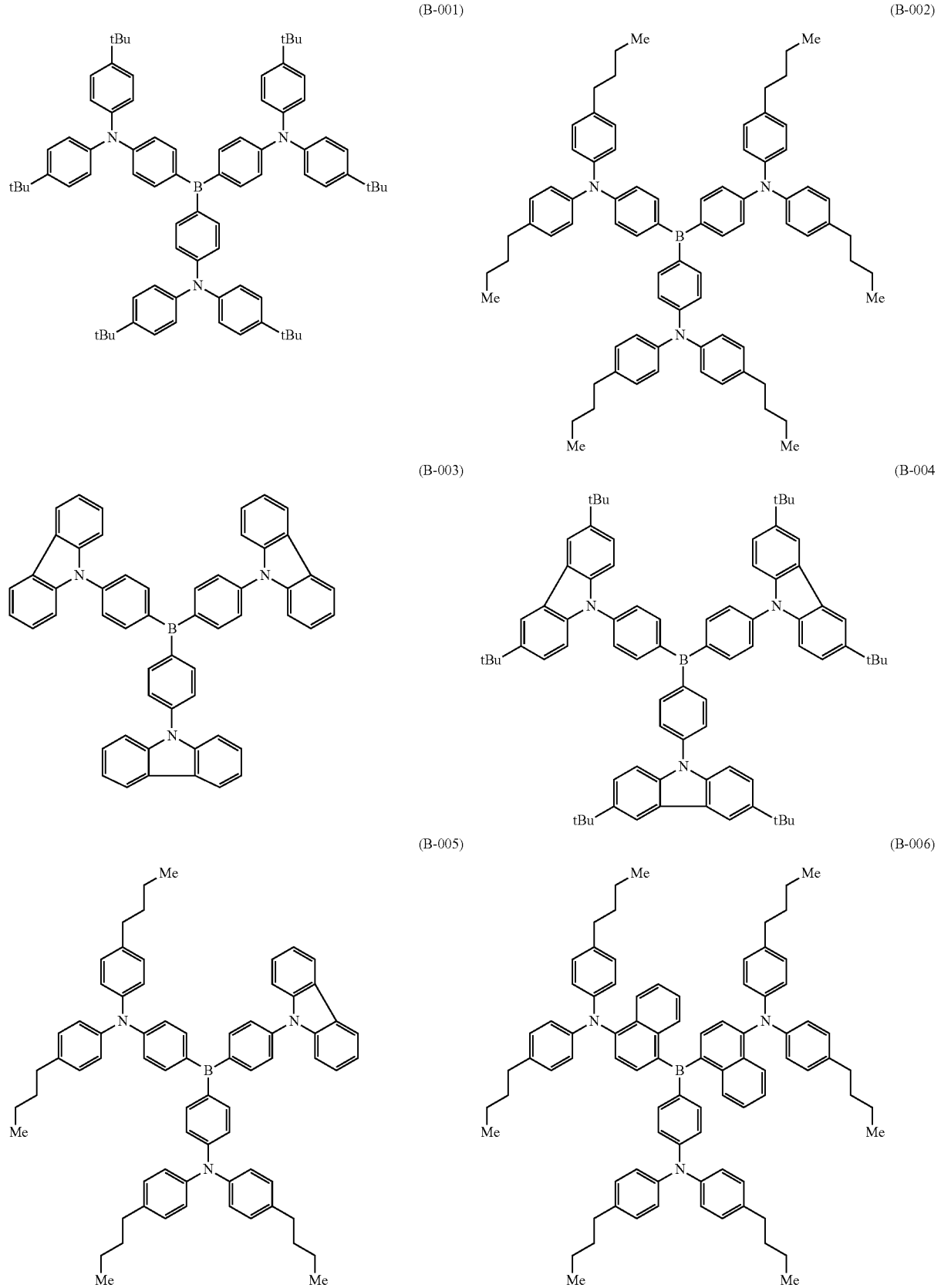

-continued
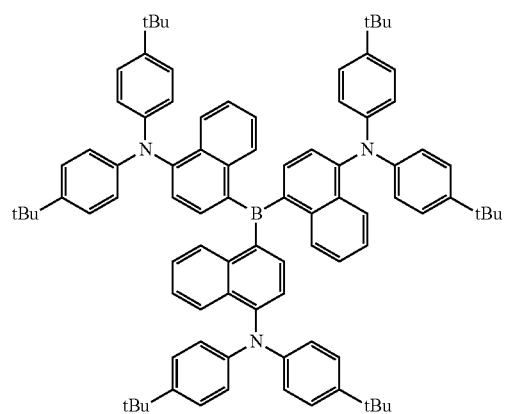
(B-007)
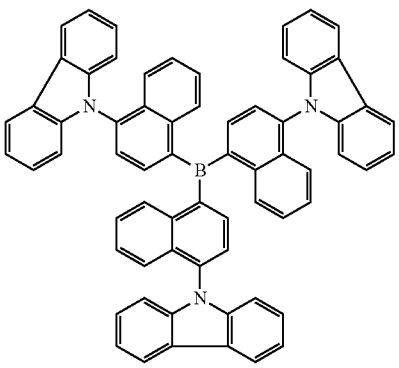
(B-008)
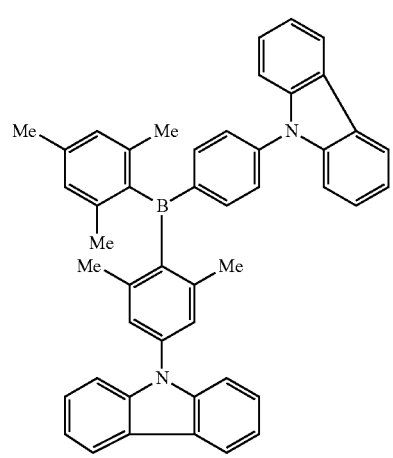
(B-009)
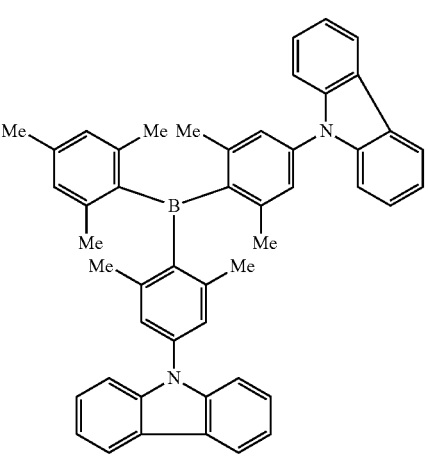
(B-010)
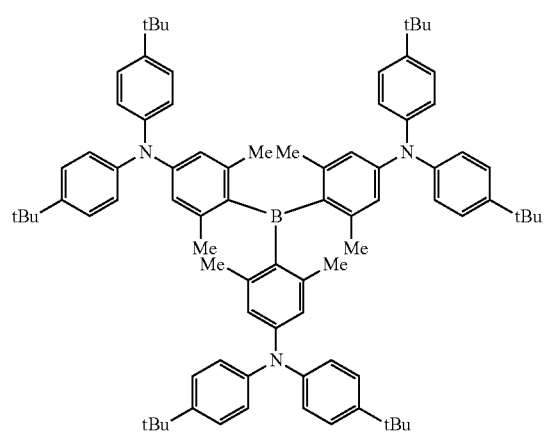
(B-011)
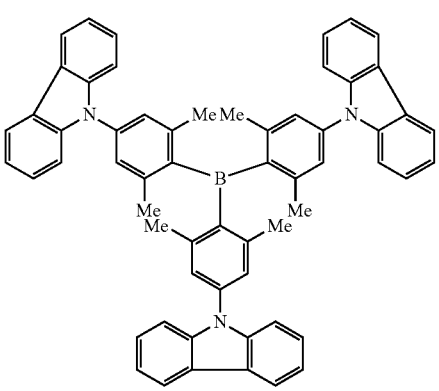
(B-012)

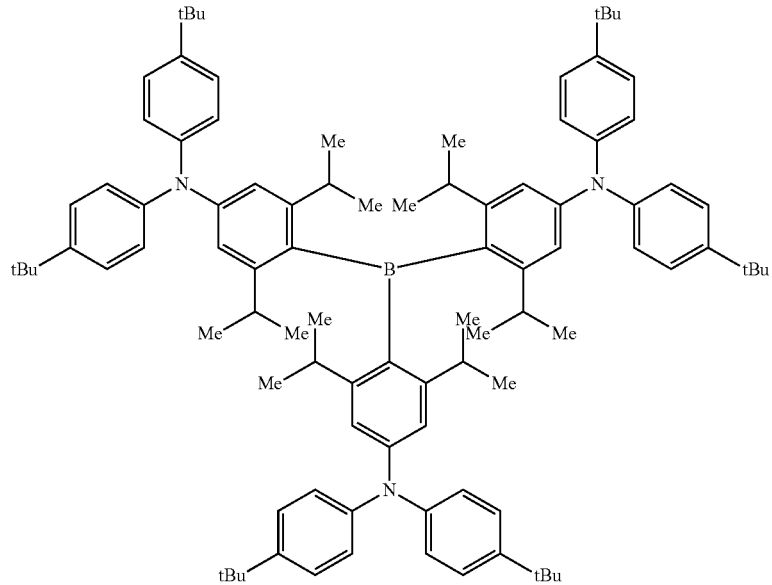
(B-013)
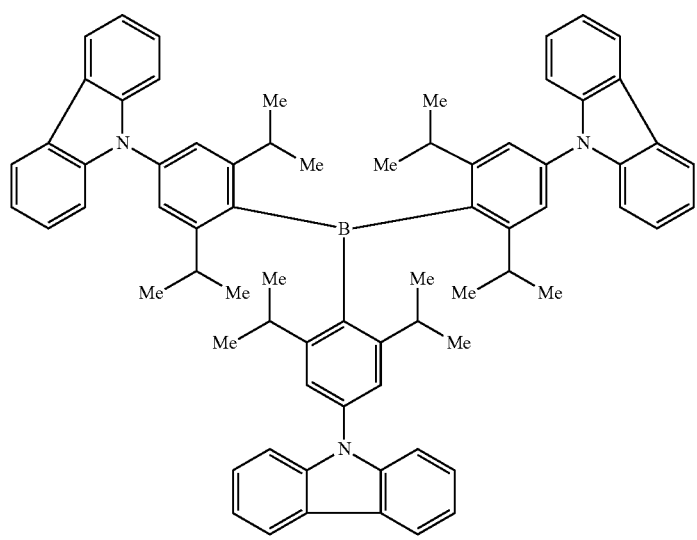
(B-014)

[Chem. 28]
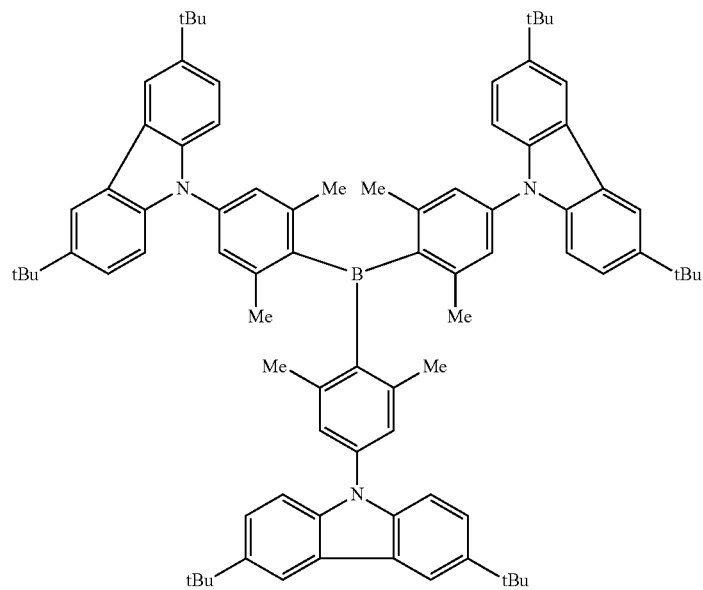
(B-015)
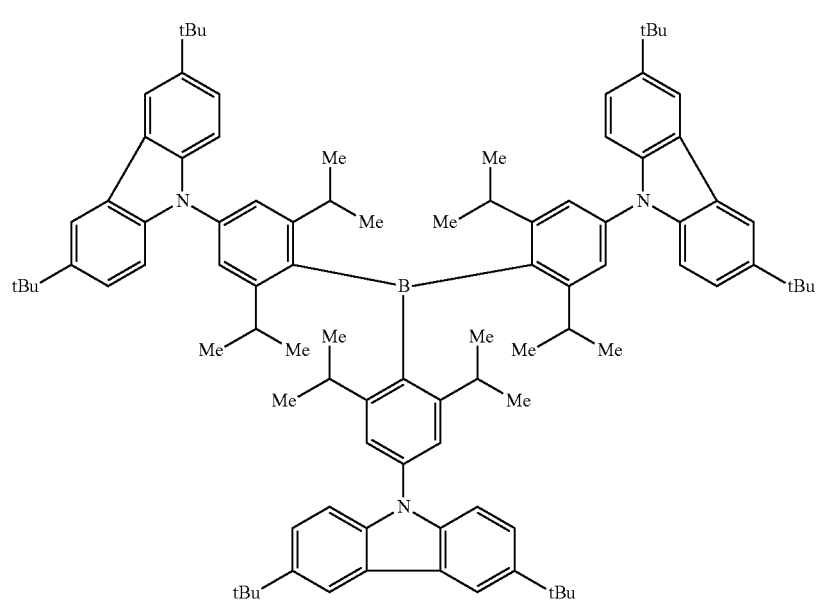
(B-016)

-continued
(B-017)
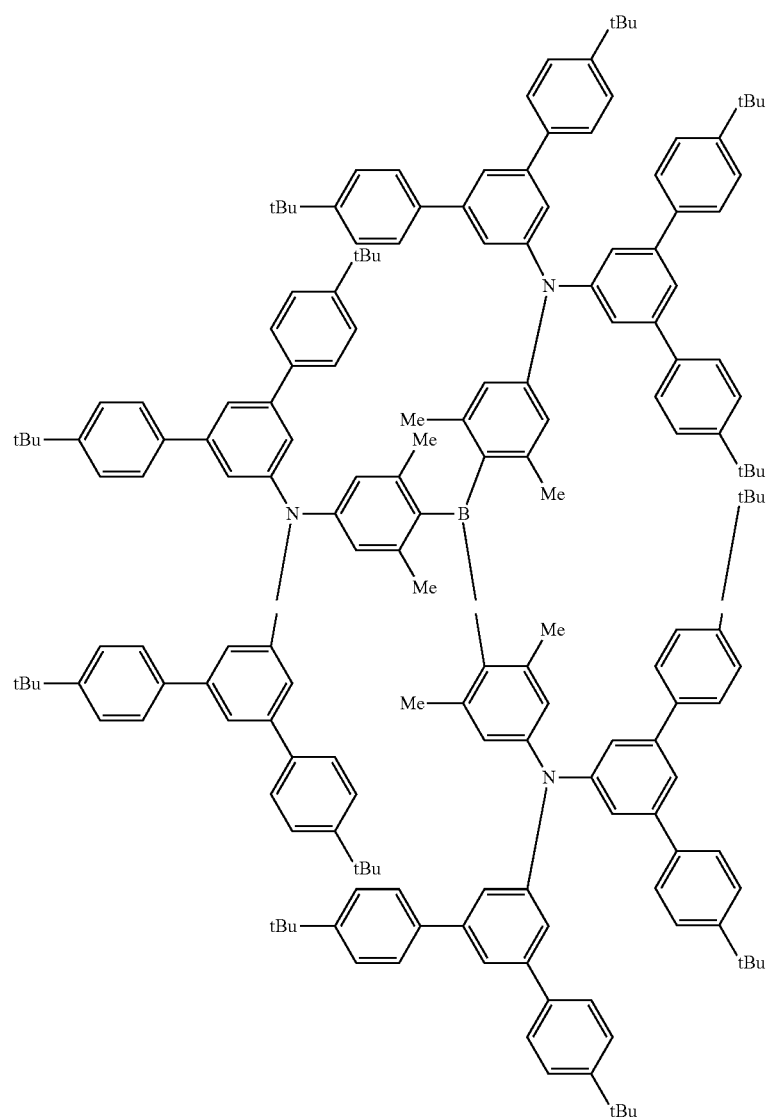
(B-018)
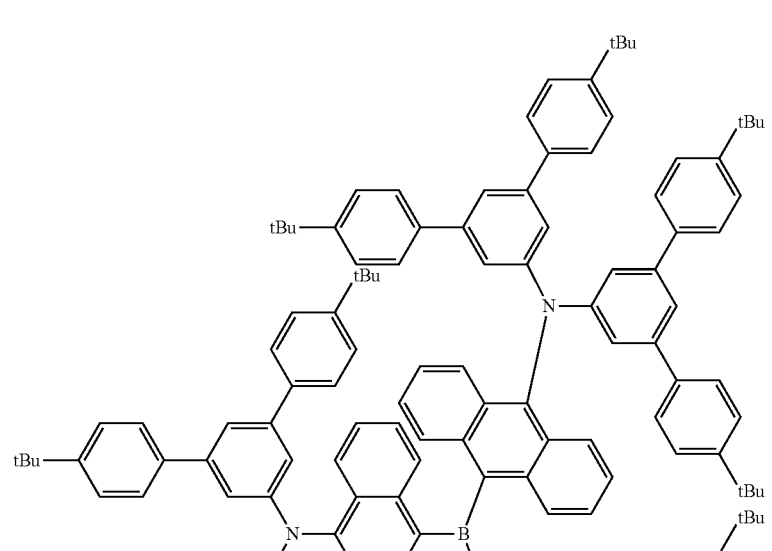

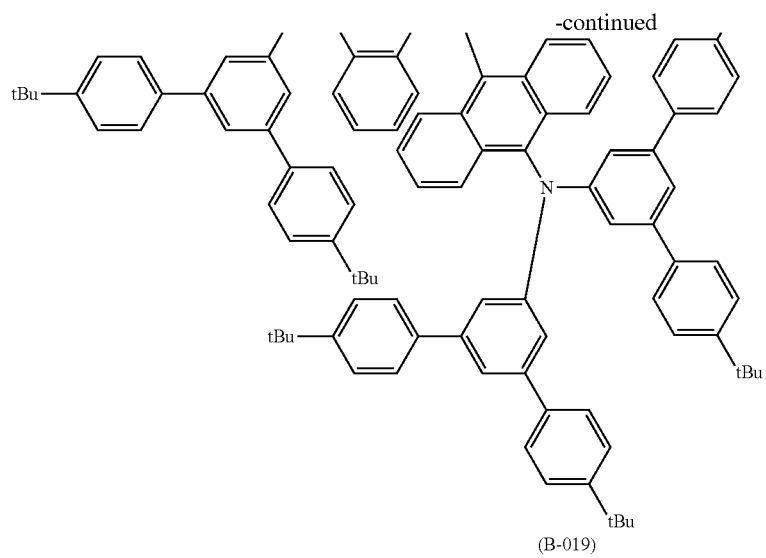

(B-019)

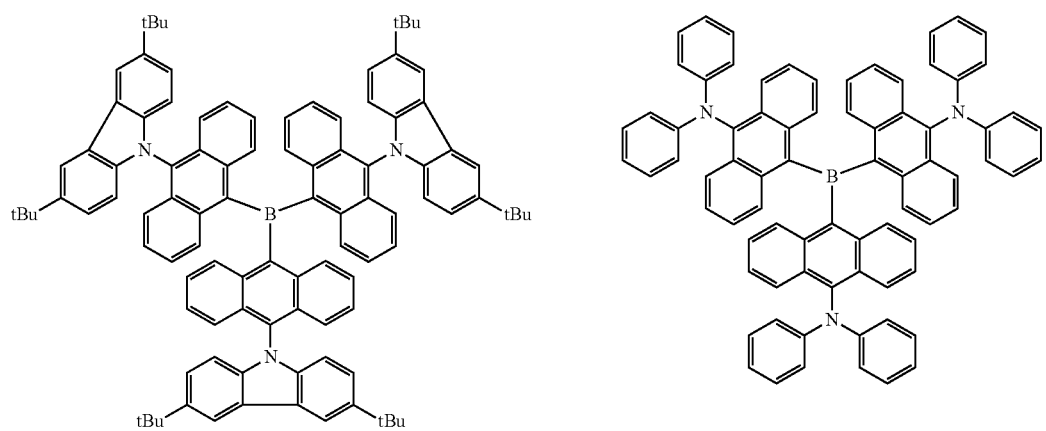

(B-020)

(B-021)

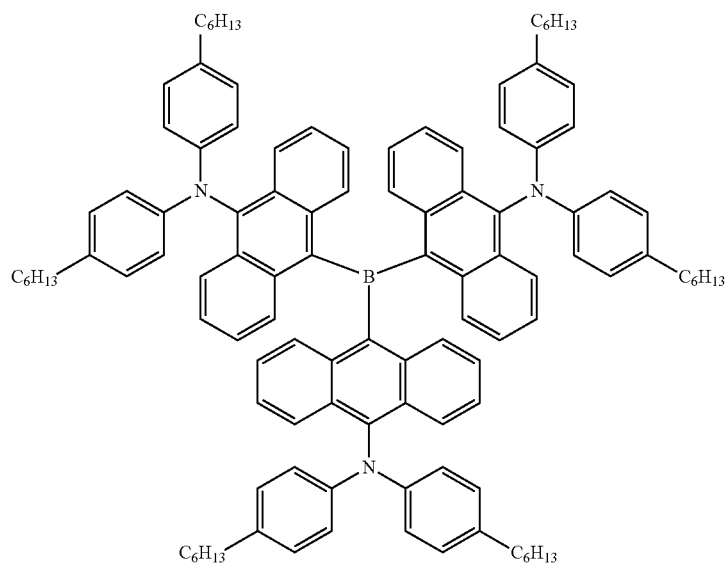

Among them, from the viewpoint of the luminance half-lifetime of an organic EL device obtained using the composition of the present invention, preferred are compounds represented by Formula (B-010) to Formula (B-017) wherein a carbon atom (for convenience, referred to as $C^B$; such $C^B$ is present in the number of six in each of all compounds shown as examples) bonded to a carbon atom (for convenience, referred to as $C^A$; such $C^A$ is present in the number of three in each of all compounds shown as examples) bonded to a boron atom at the center of the compound has an alkyl group such as a methyl group and an isopropyl group as a substituent (that is, $R^1$); and compounds represented by Formula (B-018) to Formula (B-021) wherein the carbon atom $C^B$ becomes a condensation site to form a fused ring such as anthracene. More preferred are borane compounds represented by Formula (B-010) to Formula (B-017) wherein the carbon atom $C^B$ has an alkyl group as a substituent (that is, $R^1$).

<Conjugated Polymer Compound (P1)>

The conjugated polymer compound (P1) contained in the composition of the present invention has a structure represented by Formula (P1) below. Formula (P1) below indicates a type of each structural unit constituting the conjugated polymer compound (P1) and a molar ratio of each structural unit and does not indicate in a limited way, an aspect in which each structural unit is block-polymerized in an order shown in Formula (P1). As described below, the polymerization type of each structural unit constituting the conjugated polymer compound (P1) may be any of alternating polymerization, random polymerization, block polymerization and graft polymerization.

[Chem. 29]

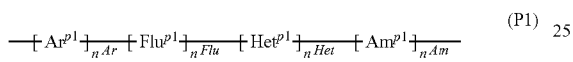
(P1)

In Formula (P1), a structural unit $Ar^{P1}$ represents an arylene group optionally having a substituent, with the proviso that the structural unit $Ar^{P1}$ is different from a structural unit $Flu^{P1}$; a structural unit $Flu^{P1}$ represents a fluorenediyl group optionally having a substituent; a structural unit $Het^{P1}$ represents a divalent aromatic heterocyclic group optionally having a substituent; a structural unit $Am^{P1}$ represents a divalent aromatic amine residue optionally having a substituent; $n^{Ar}$, $n^{Flu}$, $n^{Het}$ and $n^{Am}$ are numbers representing molar ratios in the conjugated polymer compound for the structural unit $Ar^{P1}$, the structural unit $Flu^{P1}$, the structural unit $Het^{P1}$ and the structural unit $Am^{P1}$, respectively, and $n^{Ar}$, $n^{Flu}$, $n^{Het}$ and $n^{Am}$ are numbers satisfying $0.4 \leq n^{Flu} \leq 1$, $0 \leq n^{Ar} \leq 0.6$, $0 \leq n^{Het} \leq 0.6$ and $0 \leq n^{Am} \leq 0.6$ when defining $n^{Ar}+n^{Flu}+n^{Het}+n^{Am}=1$; polymerization type of the structural unit $Ar^{P1}$, the structural unit $Flu^{P1}$, the structural unit $Het^{P1}$ and the structural unit $Am^{P1}$ in the conjugated polymer compound may be any of alternating polymerization, random polymerization, block polymerization and graft polymerization; when the structural unit $Ar^{P1}$ is plurally present, they may be the same as or different from each other; when the structural unit $Flu^{P1}$ is plurally present, they may be the same as or different from each other; when the structural unit $Het^{P1}$ is plurally present, they may be the same as or different from each other; and when the structural unit $Am^{P1}$ is plurally present, they may be the same as or different from each other.

In Formula (P1), with respect to the structural unit $Ar^{P1}$, from the viewpoint of simplicity of synthesis of the conjugated polymer compound (P1), it is preferable that all structural units $Ar^{P1}$ are the same unit as each other. From the viewpoint of the solubility of the conjugated polymer compound (P1) in a solvent, it is preferable that structural units $Ar^{P1}$ of a plurality of types different from each other are present.

As an arylene group optionally having a substituent that is used for the structural unit $Ar^{P1}$, groups represented by Formulae (PAr-001) to (PAr-017) below are preferable.

[Chem. 30]

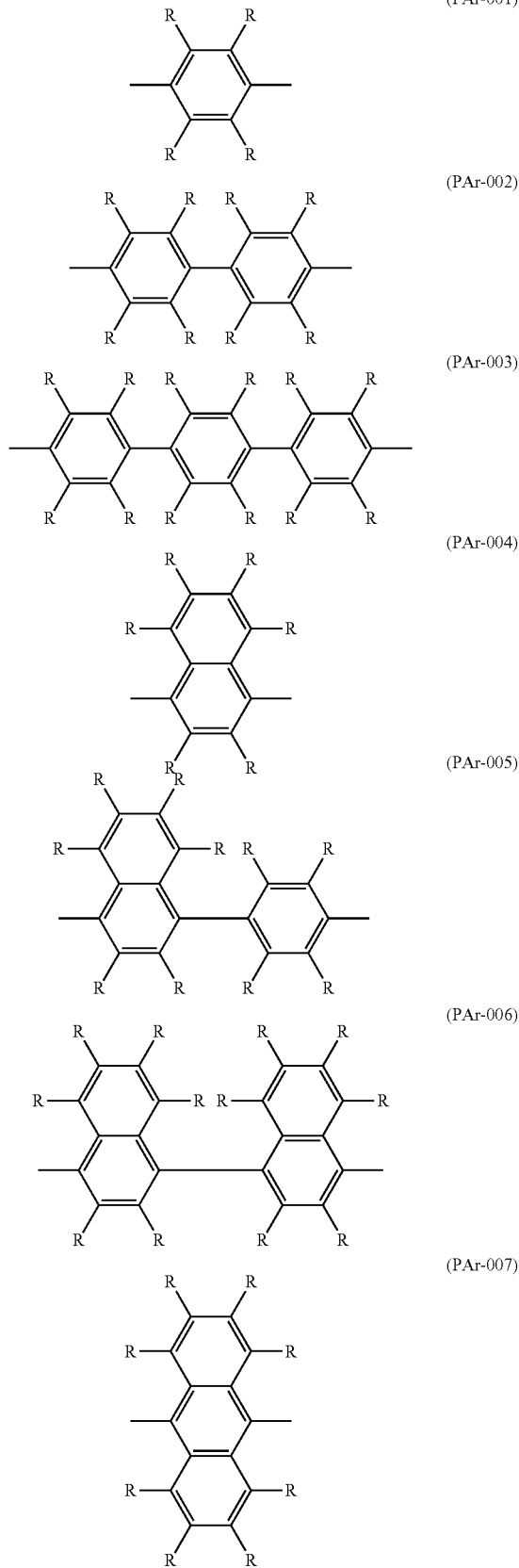

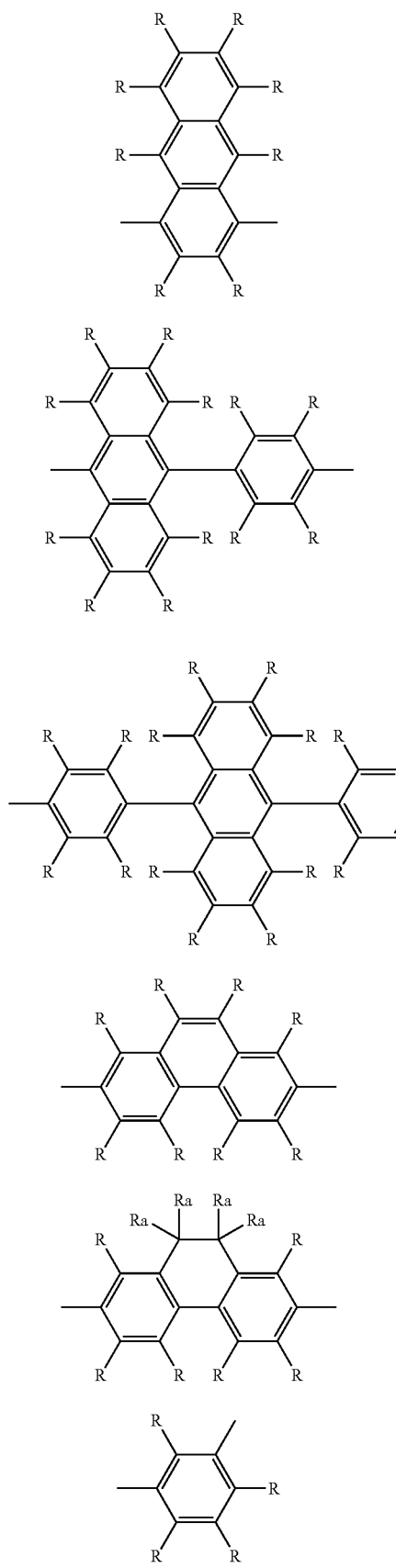

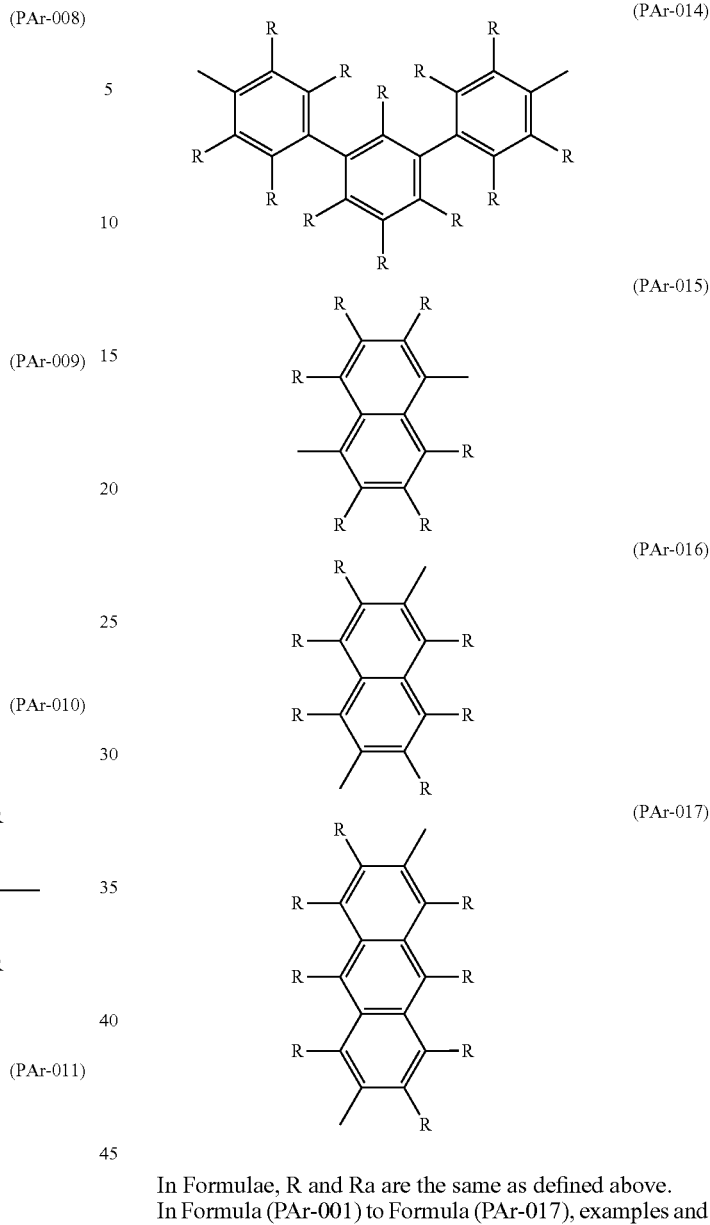

In Formulae, R and Ra are the same as defined above.

In Formula (PAr-001) to Formula (PAr-017), examples and preferable examples of R and Ra are the same as those of R and Ra described with respect to Formula 201 to Formula 214.

In Formula (P1), the structural unit $Flu^{P1}$ represents a fluorenediyl group optionally having a substituent. Here, the fluorenediyl group is an atomic group remaining after removing two hydrogen atoms from a compound having a fluorene skeleton and may also include an atomic group having a fused ring and an atomic group having a heterocyclic ring structure. In Formula (P1), with respect to the structural unit $Flu^{P1}$, from the viewpoint of simplicity of synthesis of the conjugated polymer compound (P1), it is preferable that all structural units $Flu^{P1}$ are the same unit as each other. From the viewpoint of the solubility of the conjugated polymer compound (P1) in a solvent, it is preferable that structural units $Flu^{P1}$ of a plurality of types different from each other are present.

As a fluorenediyl group optionally having a substituent that is used for the structural unit $Flu^{P1}$, groups represented by Formulae (PFlu-001) to (PFlu-010) below are preferable.

[Chem. 13]

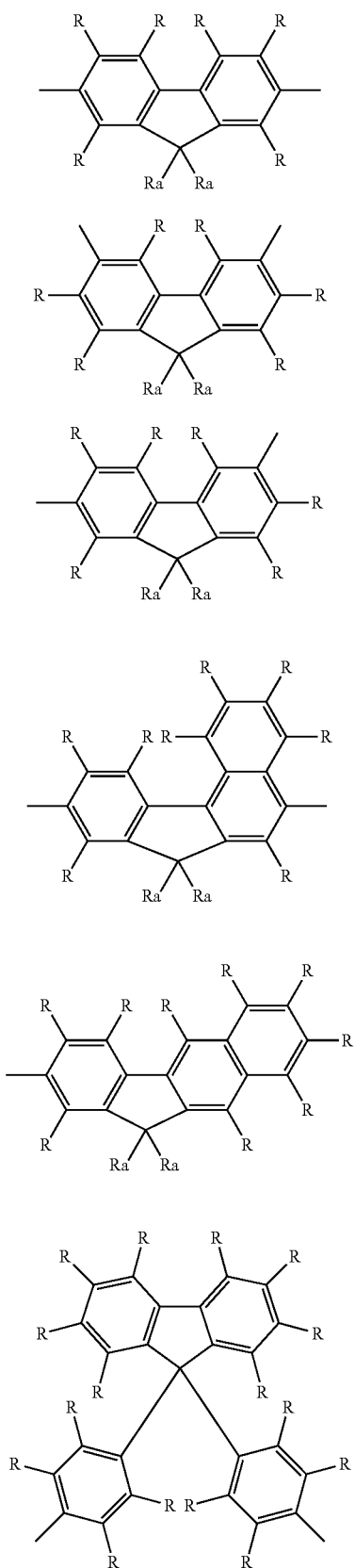

(PFlu-001)
(PFlu-002)
(PFlu-003)
(PFlu-004)
(PFlu-005)
(PFlu-006)

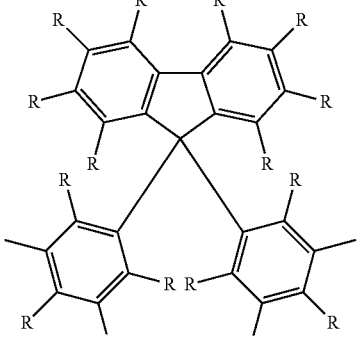

(PFlu-007)

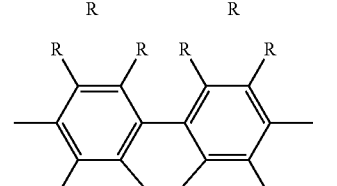

(PFlu-008)

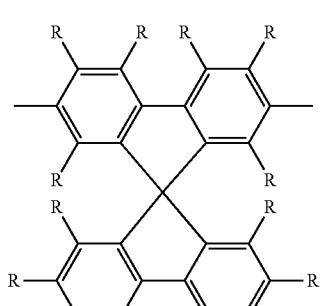

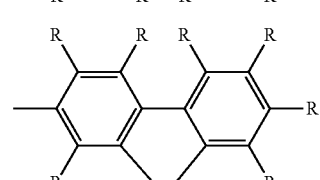

(PFlu-009)

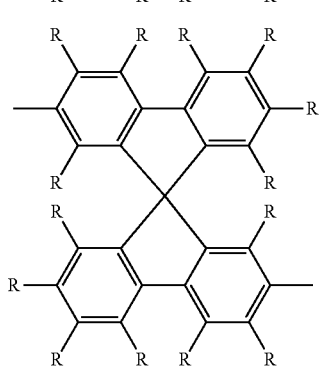

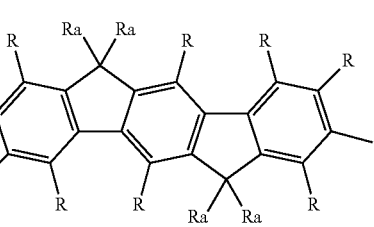

(PFlu-010)

In Formulae, R and Ra are the same as defined above.

In Formula (PFlu-001) to Formula (PFlu-010), examples and preferable examples of R and Ra are the same as those of R and Ra described with respect to Formula 201 to Formula 214.

When a phosphorescent organic EL device is manufactured using the composition of the present invention, a fluorenediyl group optionally having a substituent that is used for the structural unit $Flu^{P1}$ is preferably a group represented by Formulae (PFlu-001) to (PFlu-003), and more preferably a group represented by Formula (PFlu-001).

In Formula (P1), with respect to the structural unit $Het^{P1}$, from the viewpoint of simplicity of synthesis of the conjugated polymer compound (P1), it is preferable that all structural units Het^{P1} are the same unit as each other. From the viewpoint of the solubility of the conjugated polymer compound (P1) in a solvent, it is preferable that structural units Het^{P1} of a plurality of types different from each other are present.

Examples of a divalent aromatic heterocyclic group optionally having a substituent that is used for the structural unit Het^{P1} include groups represented by Formulae (PHet-001) to (PHet-025) below.

[Chem. 32]

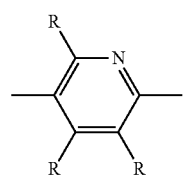 (PHet-001)

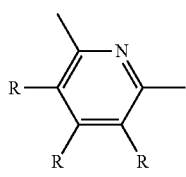 (PHet-002)

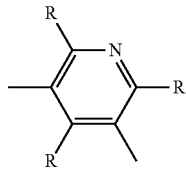 (PHet-003)

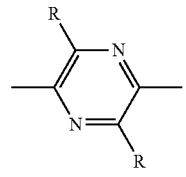 (PHet-004)

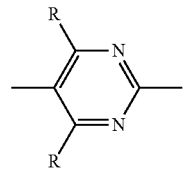 (PHet-005)

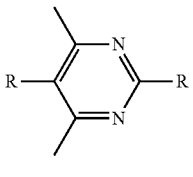 (PHet-006)

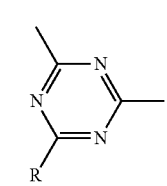 (PHet-007)

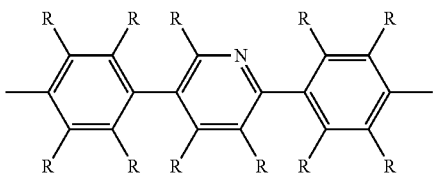 (PHet-008)

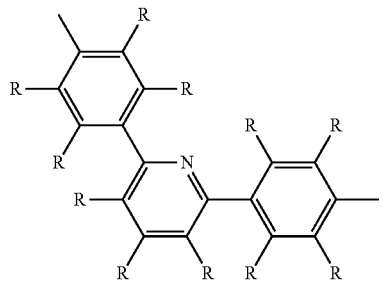 (PHet-009)

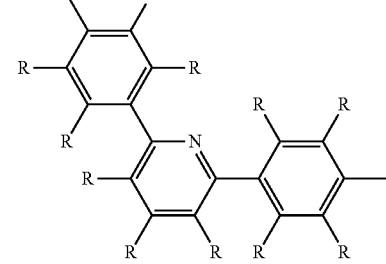 (PHet-010)

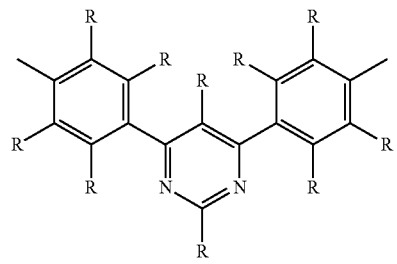 (PHet-011)

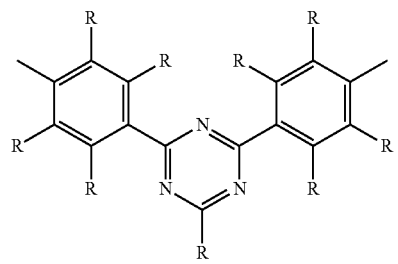 (PHet-012)

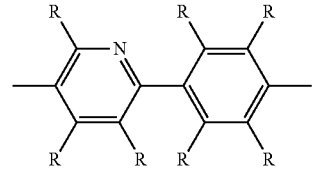 (PHet-013)

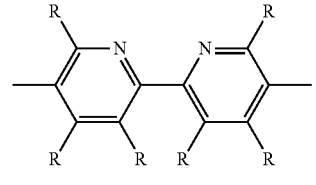 (PHet-014)

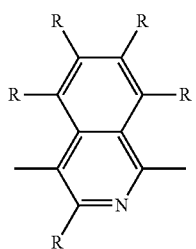
(PHet-015)

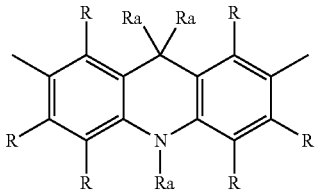
(PHet-022)

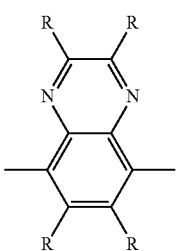
(PHet-016)

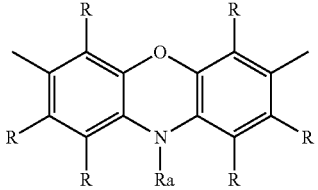
(PHet-023)

[Chem. 33]

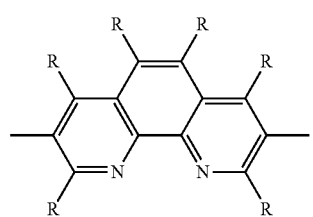
(PHet-017)

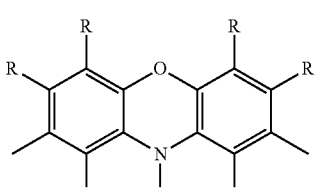
(PHet-024)

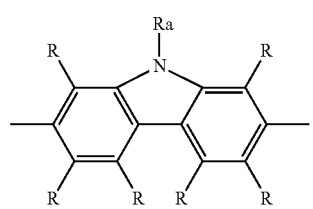
(PHet-018)

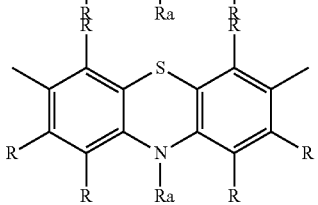
(PHet-025)

In Formulae, R and Ra are the same as defined above.

In Formula (PHet-001) to Formula (PHet-025), examples and preferable examples of R and Ra are the same as those of R and Ra described with respect to Formula 201 to Formula 214.

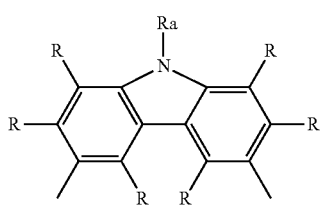
(PHet-019)

In Formula (P1), with respect to the structural unit $Am^{P1}$, from the viewpoint of simplicity of synthesis of the conjugated polymer compound (P1), it is preferable that all structural units $Am^{P1}$ are the same unit as each other. From the viewpoint of the solubility of the conjugated polymer compound (P1) in a solvent, it is preferable that structural units $Am^{P1}$ of a plurality of types different from each other exist.

As a divalent aromatic amine residue optionally having a substituent that is used for the structural unit $Am^{P1}$, groups represented by Formulae (PAm-001) to (PAm-009) below are preferable.

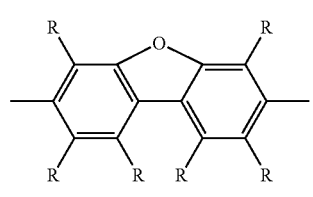
(PHet-020)

[Chem. 34]

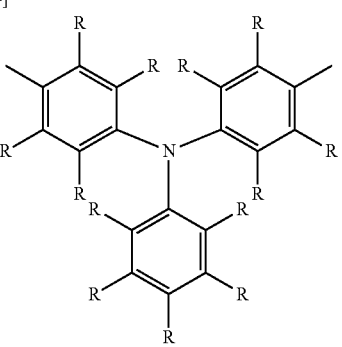
(PAm-001)

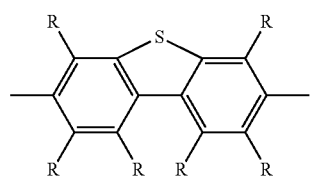
(PHet-021)

-continued
(PAm-002)
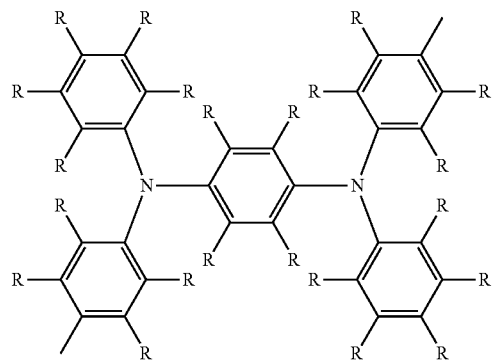
(PAm-003)
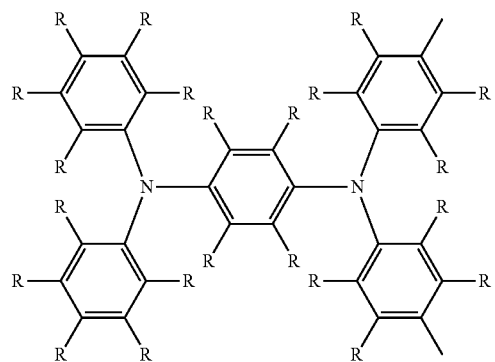
(PAm-004)
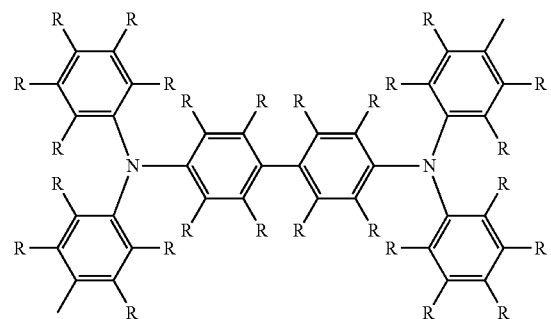
(PAm-005)
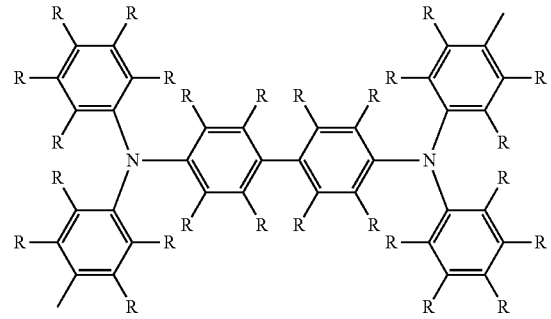
-continued
(PAm-006)
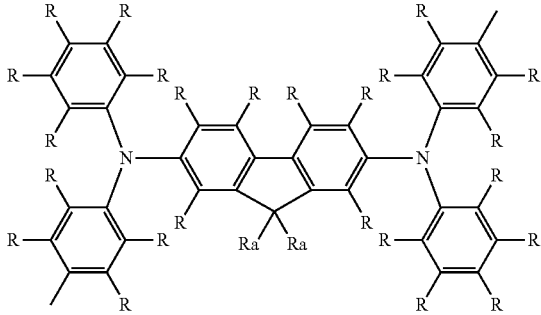
(PAm-007)
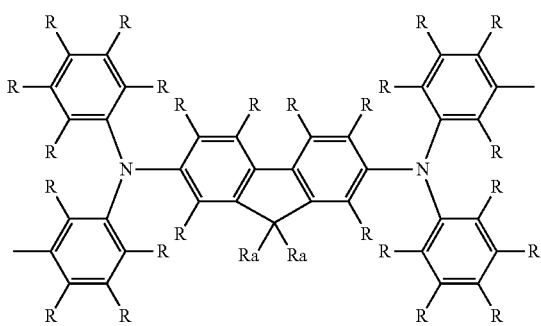
(PAm-008)
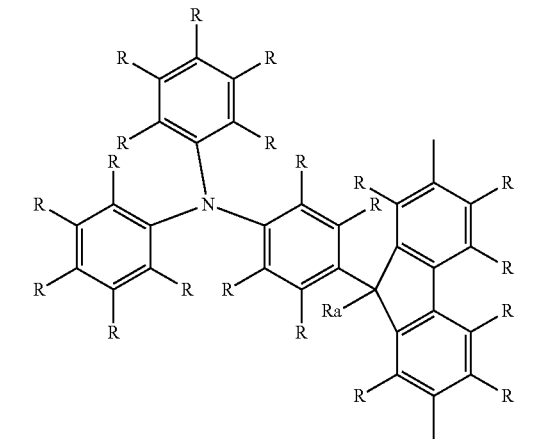
(PAm-009)
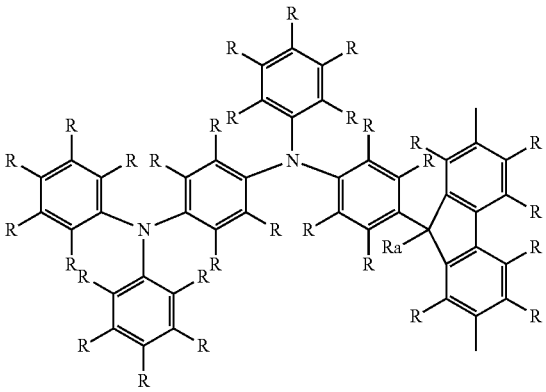

In Formulae, R and Ra are the same as defined above.

In Formula (PAm-001) to Formula (PAm-009), examples and preferable examples of R and Ra are the same as those of R and Ra described with respect to Formula 201 to Formula 214.

From the viewpoint of simplicity of the synthesis of the conjugated polymer compound (P1), it is preferable that any one of $n^{Het}$ and $n^{Am}$ is 0 and it is more preferable that both of $n^{Het}$ and $n^{Am}$ are 0.

From the viewpoint of hole transport property of the conjugated polymer compound (P1), it is preferable that any one of $n^{Ar}$ and $n^{Het}$ is 0 and it is more preferable that both of $n^{Ar}$ and $n^{Het}$ is 0.

From the viewpoint of electron transport property of the conjugated polymer compound (P1), it is preferable that any one of $n^{Ar}$ and $n^{Het}$ is not 0 and it is more preferable that $n^{Het}$ is not 0.

From the viewpoint of the luminance half-lifetime of the organic EL device, the conjugated polymer compound (P1) has a polystyrene-equivalent number average molecular weight of preferably $5 \times 10^3$ to $1 \times 10^8$, more preferably $1 \times 10^4$ to $1 \times 10^7$ and a polystyrene-equivalent weight average molecular weight of preferably $5 \times 10^3$ to $1 \times 10^8$, more preferably $1 \times 10^4$ to $1 \times 10^7$. The number average molecular weight and the weight average molecular weight can be measured, for example, using size exclusion chromatography (SEC).

The conjugated polymer compound (P1) may be any one of an alternating copolymer, a random copolymer, a block copolymer and a graft copolymer, or may be a polymer compound having an intermediate structure among these structures, for example, a random copolymer containing a block-copolymerized segment.

The conjugated polymer compound (P1) is preferably a conjugated polymer compound represented by Formula (Pex-001) to Formula (Pex-004), because the luminance half-lifetime of the organic EL device could be remarkably improved in a combination with the borane compound (B1). In Formula (Pex-001) to Formula (Pex-004) below, polymerization type of each structural unit in the conjugated polymer compound may be any of alternating polymerization, random polymerization, block polymerization and graft polymerization. In Formula (Pex-001) to Formula (Pex-004), a terminal group is a phenyl group.

senting a molar ratio of each structural unit in the conjugated polymer compound and are numbers satisfying $0.4 \leq m^{01} \leq 0.6$, $0.2 \leq m^{02} \leq 0.4$, $0 \leq m^{03} \leq 0.3$ and $0 \leq m^{04} \leq 0.3$ when defining $m^{01}+m^{02}+m^{03}+m^{04}=1$.

[Chem. 36]

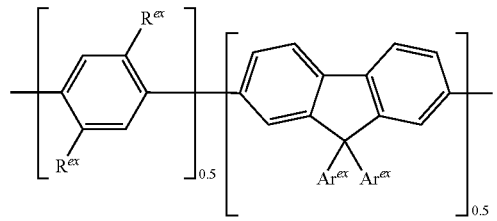

(Pex-002)

In Formula (Pex-002), a plurality of $R^{ex}$ each independently represent a hydrogen atom or an alkyl group and a plurality of $Ar^{ex}$ each independently represent an alkyl group or an aryl group; and a numerical value "0.5" affixed to each structural unit represents a molar ratio of each structural unit in the conjugated polymer compound.

[Chem. 37]

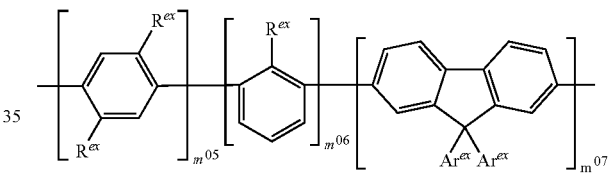

(Pex-003)

In Formula (Pex-003), a plurality of $R^{ex}$ each independently represent a hydrogen atom or an alkyl group and a plurality of $Ar^{ex}$ each independently represent an alkyl group or an aryl group; and $m^{05}$, $m^{06}$ and $m^{07}$ are numbers representing a molar ratio of each structural unit in the conjugated polymer compound and are numbers satisfying $0.2 \leq m^{05} \leq 0.4$, $0.2 \leq m^{06} \leq 0.4$ and $0.4 \leq m^{07} \leq 0.6$ when defining $m^{05}+m^{06}+m^{07}=1$.

[Chem. 35]

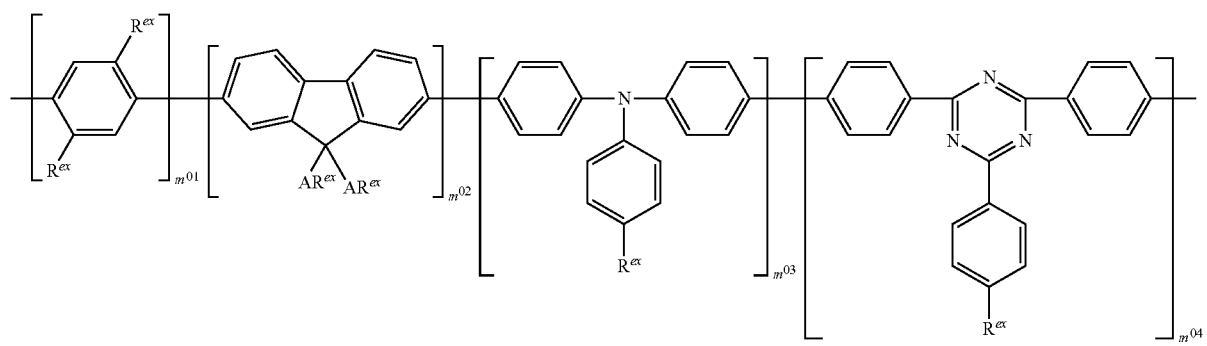

(Pex-001)

In Formula (Pex-001), a plurality of $R^{ex}$ each independently represent a hydrogen atom or an alkyl group and a plurality of $Ar^{ex}$ each independently represent an alkyl group or an aryl group; $m^{01}$, $m^{02}$, $m^{03}$ and $m^{04}$ are numbers repre-

[Chem. 38]

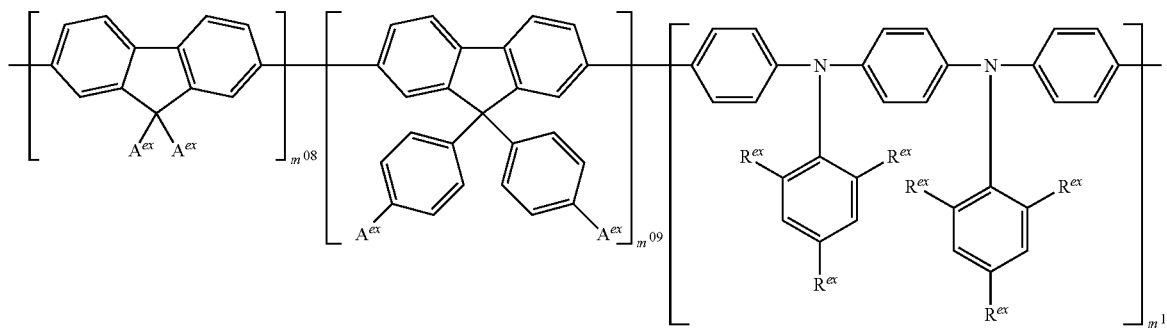

(Pex-004)

In Formula (Pex-004), a plurality of $R^{ex}$ each independently represent a hydrogen atom or an alkyl group and a plurality of $A^{ex}$ each independently represent an alkyl group; and $m^{08}$, $m^{09}$ and $m^{10}$ are numbers representing a molar ratio of each structural unit in the conjugated polymer compound and are numbers satisfying $0.2 \le m^{08} < 0.5$, $0.2 \le m^{09} \le 0.5$ and $0 < m^{10} \le 0.3$ when defining $m^{08}+m^{09}+m^{10}=1$.

<Composition>

The composition of the present invention contains the borane compound (B1) and the conjugated polymer compound (P1).

The content of the borane compound (B1) in the composition of the present invention is usually 1 to 99 part(s) by weight when the total weight of the borane compound (B1) and the conjugated polymer compound (P1) is defined as 100 parts by weight, and from the viewpoint of the luminance half-lifetime of an organic EL device obtained using the composition of the present invention, the content is preferably 1 to 50 part(s) by weight, more preferably 3 to 40 parts by weight, further preferably 10 to 40 parts by weight, particularly preferably 15 to 35 parts by weight.

In the composition of the present invention, each of the borane compound (B1) and the conjugated polymer compound (P1) may be used alone or in combination of two or more types thereof.

The composition of the present invention may further contain other components besides the borane compound (B1) and the conjugated polymer compound (P1). The other components may be used alone or in combination of two or more types thereof.

From the viewpoint of reducing the driving voltage of an organic EL device obtained using the composition of the present invention, the other component that may be contained in the composition of the present invention is preferably a charge transport material.

The charge transport material refers to a material having a role of transporting charges in the organic EL device. Examples of the charge transport material include low molecular compounds and polymer compounds that exhibit charge transport property. Among them, as the charge transport material, polymer compounds exhibiting charge transport property are preferable.

It is preferable that the polymer compound exhibiting charge transport property has one or more group(s) selected from the group consisting of an arylene group, a divalent aromatic heterocyclic group and a divalent aromatic amine residue as a structural unit. It is more preferable that the polymer compound has such group(s) as a repeating unit.

From the viewpoint of the luminance half-lifetime of an organic EL device obtained using the composition of the present invention, the polymer compound exhibiting charge transport property has a polystyrene-equivalent number average molecular weight of preferably $5 \times 10^3$ to $1 \times 10^8$, more preferably $8 \times 10^3$ to $1 \times 10^7$, and further preferably $1 \times 10^4$ to $1 \times 10^6$.

When the charge transport material is used, the content of the charge transport material in the composition of the present invention is usually 1 to 300 part(s) by weight, preferably 3 to 200 parts by weight, more preferably 5 to 100 parts by weight when the total weight of the borane compound (B1) and the conjugated polymer compound (P1) is defined as 100 parts by weight.

From the viewpoint of the luminous efficiency of an organic EL device obtained using the composition of the present invention, the other component that may be contained in the composition of the present invention besides the borane compound (B1) and the conjugated polymer compound (P1) is preferably a light-emitting material.

Examples of the light-emitting material include a fluorescent material and a triplet light-emitting material (phosphorescent material). The fluorescent material and the triplet light-emitting material (phosphorescent material) individually can be classified into a low molecular light-emitting material and a high molecular light-emitting material. In the case of the fluorescent material, a high molecular (that is, a polystyrene-equivalent number average molecular weight of $5 \times 10^3$ to $1 \times 10^8$) light-emitting material is preferable. In the case of the triplet light-emitting material, a low molecular (that is, a molecular weight of less than $5 \times 10^3$) light-emitting material is preferable.

The light-emitting material is preferably a triplet light-emitting material because the luminous efficiency of a device obtained using the composition of the present invention would be excellent.

When the light-emitting material is used, the content of the light-emitting material in the composition of the present invention may be determined depending on the type of the light-emitting material. In one embodiment, the content of the fluorescent light-emitting material in the composition of the present invention is usually 1 to 300 part(s) by weight when the total weight of the borane compound (B1) and the conjugated polymer compound (P1) is defined as 100 parts by weight and from the viewpoint of the luminance half-lifetime of a device obtained using the composition of the present invention, the content is preferably 3 to 200 parts by weight, and more preferably 5 to 100 parts by weight. In one embodiment, the content of the triplet light-emitting material in the composition of the present invention is usually 1 to 100 part(s) by weight when the total weight of the borane compound (B1) and the conjugated polymer compound (P1) is defined as 100 parts by weight and from the viewpoint of the luminance half-lifetime of a device obtained using the composition of the present invention, the content is preferably 3 to 80 parts by weight, and more preferably 5 to 50 parts by weight.

When the triplet light-emitting material is a low molecular light-emitting material, the content of the triplet light-emitting material in the composition of the present invention is preferably 1 to 50 part(s) by weight, more preferably 2 to 45 parts by weight, and further preferably 5 to 40 parts by weight when the total weight of the borane compound (B1) and the conjugated polymer compound (P1) is defined as 100 parts by weight, from the viewpoint of the luminance half-lifetime of an organic EL device obtained using the composition of the present invention.

When the triplet light-emitting material is a high molecular light-emitting material, the content of a central metal atom of the triplet light-emitting material in the composition of the present invention is preferably 0.02 to 10 parts by weight, more preferably 0.05 to 9 parts by weight, and further preferably 0.1 to 8 parts by weight when the total weight of the borane compound (B1) and the conjugated polymer compound (P1) is defined as 100 parts by weight, from the viewpoint of the luminance half-lifetime of an organic EL device obtained using the composition of the present invention.

Examples of the low molecular fluorescent material include: naphthalene derivatives; anthracene and derivatives thereof; perylene and derivatives thereof; dyes such as polymethine-based, xanthene-based, coumarin-based and cyanine-based dyes; metal complexes of 8-hydroxyquinoline and derivatives thereof; aromatic amines; tetraphenylcyclopentadiene and derivatives thereof; tetraphenylbutadiene and derivatives thereof; compounds disclosed in JP-A-57-51781 and JP-A-59-194393; and low molecular triplet light-emitting complexes.

Examples of the low molecular triplet light-emitting material include: compounds containing iridium as a central metal such as Ir(ppy)$_3$ (for example, described in Appl. Phys. Lett., (1999), 75(1), 4 and Jpn. J. Appl. Phys., 34, 1883 (1995)), ADS066GE (commercially available from American Dye Source Inc.), Btp$_2$Ir(acac) (for example, described in Appl. Phys. Lett., (2001), 78(11), 1622), FIrpic (for example, described in Inorg. Chem., 2007, 46, 11082), a light-emitting material A, a light-emitting material B, a light-emitting material C, a light-emitting material D and a light-emitting material E; compounds containing platinum as a central metal such as PtOEP (for example, described in Nature, (1998), 395, 151); compounds containing europium as a central metal such as Eu(TTA)$_3$-phen; and complexes and derivatives thereof described in: Proc. SPIE-Int. Soc. Opt. Eng. (2001), 4105 (Organic Light-Emitting Materials and Devices IV), 119; J. Am. Chem. Soc., (2001), 123, 4304; Appl. Phys. Lett., (1997), 71(18), 2596; Syn. Met., (1998), 97(2), 113; Syn. Met., (1999), 99(2), 127; Adv. Mater., (1999), 11(10), 852; and the like.

[Chem. 39]

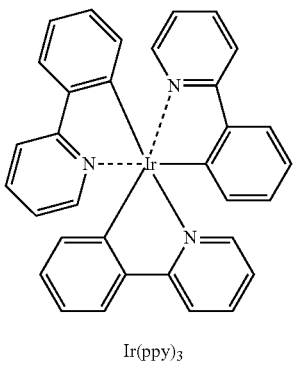

Ir(ppy)$_3$

[Chem. 40]

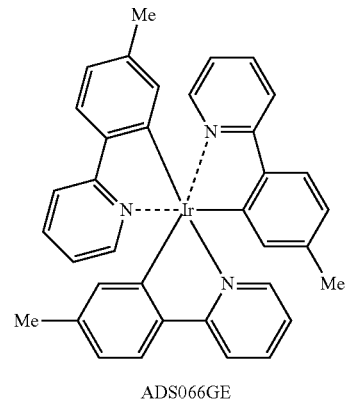

ADS066GE

[Chem. 41]

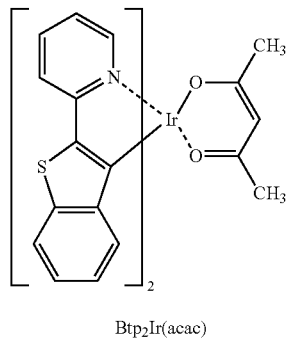

Btp$_2$Ir(acac)

[Chem. 42]

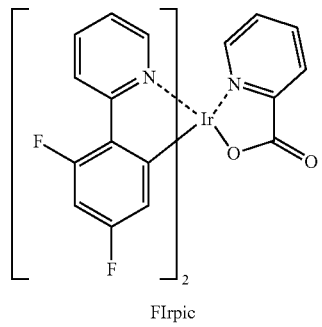

FIrpic

-continued
[Chem. 43]
Light-emitting material A
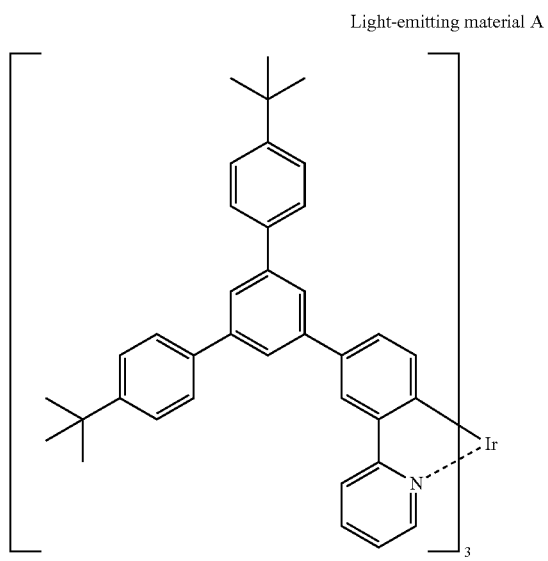
[Chem. 44]
Light-emitting material B
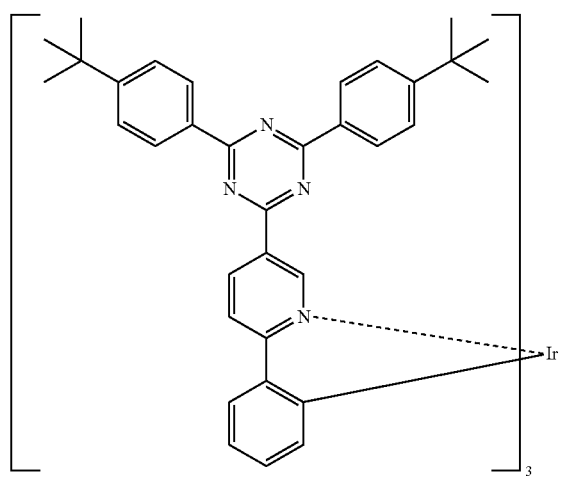
[Chem. 45]
Light-emitting material C
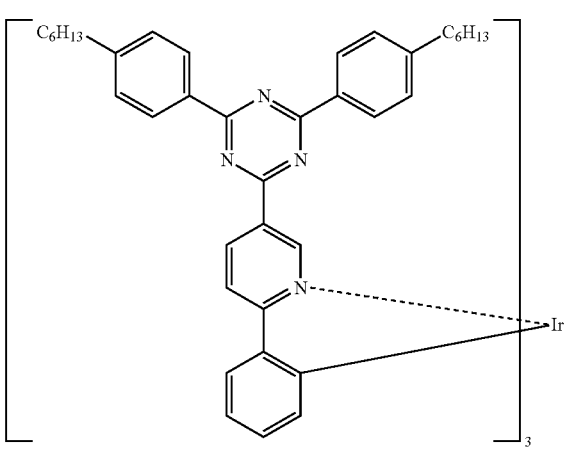
-continued
[Chem. 46]
Light-emitting material D
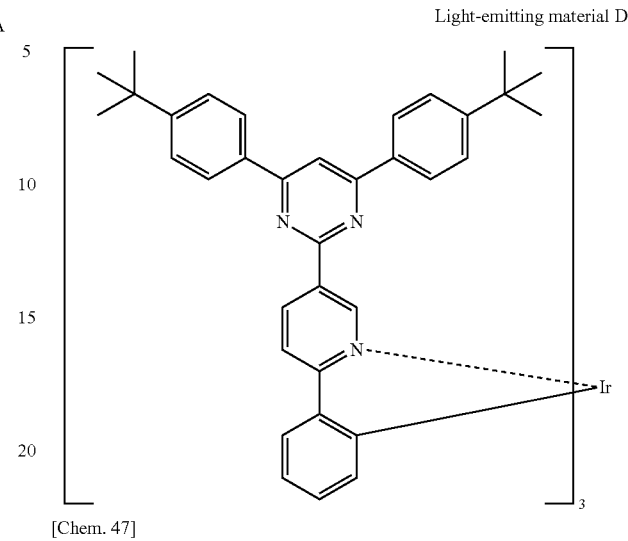
[Chem. 47]
Light-emitting material E
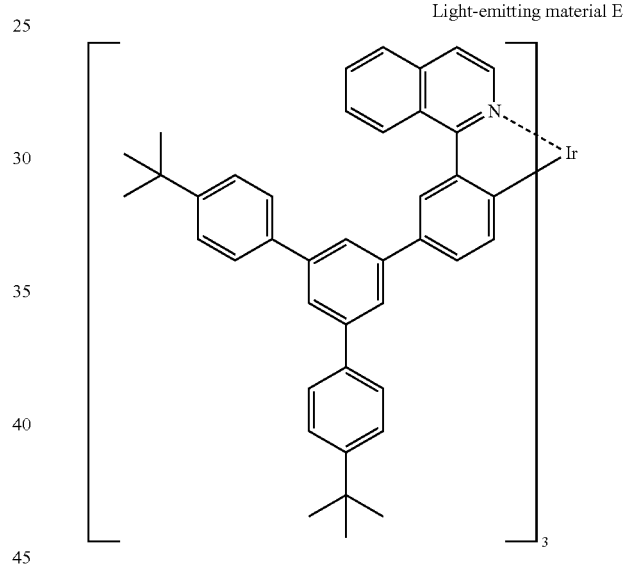
[Chem. 48]
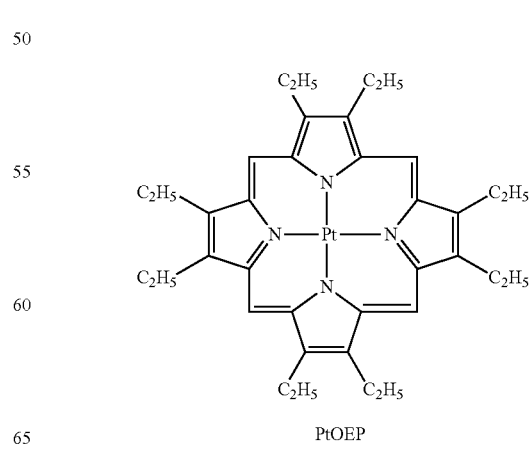
PtOEP

[Chem. 49]

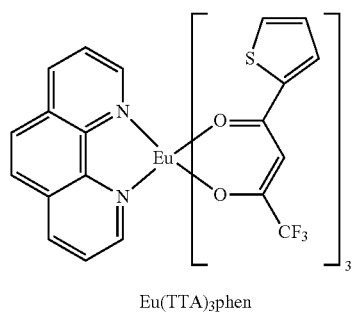

Eu(TTA)₃phen

Examples of the polymer fluorescent light-emitting material include: polyfluorene, derivatives thereof, and fluorene copolymers; polyarylene, derivatives thereof, and arylene copolymers; polyarylenevinylene, derivatives thereof, and arylenevinylene copolymers; and (co)polymers of aromatic amines and derivatives thereof, which are disclosed in WO99/13692, WO99/48160, GB2340304A, WO00/53656, WO01/19834, WO00/55927, GB2348316, WO00/46321, WO00/06665, WO99/54943, WO99/54385, US5777070, WO98/06773, WO97/05184, WO00/35987, WO00/53655, WO01/34722, WO99/24526, WO00/22027, WO00/22026, WO98/27136, US573636, WO98/21262, US5741921, WO97/09394, WO96/29356, WO96/10617, EP0707020, WO95/07955, Japanese Patent Application Laid-open No. 2001-181618, JP-A-2001-123156, JP-A-2001-3045, JP-A-2000-351967, JP-A-2000-303066, JP-A-2000-299189, JP-A-2000-252065, JP-A-2000-136379, JP-A-2000-104057, JP-A-2000-80167, JP-A-10-324870, JP-A-10-114891, JP-A-9-111233 and JP-A-9-45478.

From the viewpoints of film formation property and/or simplicity of manufacture of the device, the other component that may be contained in the composition of the present invention besides the borane compound (B1) and the conjugated polymer compound (P1) is preferably a solvent or a dispersion medium.

The solvent or the dispersion medium may be used alone or in combination of two or more types thereof.

The solvent or the dispersion medium may be any solvent or dispersion medium that can uniformly dissolve or disperse a solid content used in the composition of the present invention. Examples of the solvent (or dispersion medium) include chlorine-based solvents (chloroform, methylene chloride, 1,2-dichloroethane, 1,1,2-trichloroethane, chlorobenzene, o-dichlorobenzene, and the like), ether solvents (dispersion mediums) (tetrahydrofuran, dioxane, and the like), aromatic hydrocarbon solvents (dispersion mediums) (benzene, toluene, xylene, and the like), aliphatic hydrocarbon solvents (dispersion mediums) (cyclohexane, methylcyclohexane, n-pentane, n-hexane, n-heptane, n-octane, n-nonane, n-decane, and the like), ketone solvents (dispersion mediums) (acetone, methyl ethyl ketone, cyclohexanone, and the like), ester solvents (dispersion mediums) (ethyl acetate, butyl acetate, ethylcellosolve acetate, and the like), polyhydric alcohols and derivatives thereof (ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol, and the like), alcohol solvents (dispersion mediums) (methanol, ethanol, propanol, 2-propanol, cyclohexanol, and the like), sulfoxide solvents (dispersion mediums) (dimethyl sulfoxide and the like), and amide solvents (dispersion mediums) (N-methyl-2-pyrrolidone, N,N-dimethylformamide, and the like).

When the solvent or the dispersion medium is used, the content of the solvent or the dispersion medium in the composition of the present invention is not particularly limited and may be determined depending on the type of the solvent or the dispersion medium, the film formation method, the number average molecular weight of the conjugated polymer compound (P1), and the like. For example, when the film formation is performed by an application method such as a spin coating method and an inkjet method, the content of the solvent in the composition of the present invention is preferably 500 to 200,000 parts by weight, and more preferably 1,000 to 100,000 parts by weight when the total weight of the borane compound (B1) and the conjugated polymer compound (P1) is defined as 100 parts by weight, from the viewpoint of film formation property.

<Film>

The film of the present invention is a film manufactured using the composition of the present invention. The film of the present invention can be manufactured using the composition of the present invention by a known film formation method. Examples of the film formation method include a vacuum deposition method (such as a resistance heating deposition method and an electron beam deposition method), a sputtering method, an LB method, a molecular layering method, and an application method (for example, a casting method, a spin coating method, a bar coating method, a blade coating method, a roll coating method, a gravure printing method, a screen printing method and an inkjet method). Among them, an application method is preferable because the film of the present invention could be manufactured simply.

In the application method, the film of the present invention can be manufactured by applying the composition of the present invention containing a solvent or a dispersion medium and then distilling away the solvent or the dispersion medium.

The film of the present invention can be preferably used as a functional layer such as a light-emitting layer, a charge transport layer and a charge injection layer in the organic EL device.

The film of the present invention may contain other components than the composition of the present invention within a range where the effect of the present invention is not impaired. The component other than the composition of the present invention may be selected depending on use application of the film of the present invention.

The content of the composition of the present invention in the film of the present invention is usually 0.1 to 100% by weight, preferably 30 to 100% by weight, and more preferably 50 to 100% by weight, based on the total solid content used during the preparation of the composition.

In the present specification, the wording "based on the total solid content used during the preparation of the composition" noted with respect to the content of the composition in the film means that the weight of the total solid content used during the preparation of the composition is approximated as the weight of the composition by excluding the weight of the solvent or the dispersion medium used during the preparation of the composition for calculating the content of the composition in the film (the solvent or the dispersion medium is substantially distilled away in a step of forming a film).

The thickness of the film of the present invention is preferably 1 nm to 1 μm, more preferably 5 nm to 500 nm, and further preferably 5 nm to 200 nm.

<Device>

The device of the present invention is a device including the film of the present invention, for example, a device including the film of the present invention between a pair of electrodes composed of an anode and a cathode.

There will be described below, as a typical device, the case where the device of the present invention is an organic EL device.

The organic EL device of the present invention is a device including: a pair of electrodes composed of an anode and a cathode; and a film layer composed of a single layer or multi layers between the pair of electrodes, wherein the film layer includes a light-emitting layer. In the organic EL device of the present invention, at least one layer of the film layer is the film of the present invention (hereinafter may be simply referred to as "the film").

When the organic EL device of the present invention is a single layer type device that includes a film layer composed of a single layer between the electrodes, the single layer of film is the light-emitting layer and the light-emitting layer is composed of the film. In this case, the content of the composition of the present invention in the light-emitting layer is usually 0.1 to 100% by weight, preferably 30 to 100% by weight, and more preferably 50 to 100% by weight, based on the total solid content used during the preparation of the composition.

When the organic EL device of the present invention is a multilayer type device that includes a film layer composed of multi layers between the electrodes, any one or more layers of a hole injection layer, a hole transport layer, a light-emitting layer, an electron transport layer and an electron injection layer is (are) composed of the film. Preferably, any one or more layers of a hole transport layer, a light-emitting layer and an electron transport layer is (are) composed of the film. Further preferably, a light-emitting layer is composed of the film.

When the organic EL device of the present invention is a multilayer type device, the film sandwiched between the anode and the cathode can take, for example, the following layer configurations:

(a) Anode/Hole transport layer/Light-emitting layer/Cathode
(b) Anode/Hole injection layer/Hole transport layer/Light-emitting layer/Cathode
(c) Anode/Light-emitting layer/Electron transport layer/Cathode
(d) Anode/Light-emitting layer/Electron transport layer/Electron injection layer/Cathode
(e) Anode/Hole transport layer/Light-emitting layer/Electron transport layer/Cathode
(f) Anode/Hole injection layer/Hole transport layer/Light-emitting layer/Electron transport layer/Cathode
(g) Anode/Hole injection layer/Hole transport layer/Light-emitting layer/Electron transport layer/Electron injection layer/Cathode The symbol "/" indicates that the layers sandwiching the symbol "/" are stacked adjacent to each other. The light-emitting layer, the hole transport layer and the electron transport layer each independently may exist in two or more layers.

The anode of the organic EL device of the present invention has a function of supplying holes to the hole injection layer, the hole transport layer, the light-emitting layer, and the like and has preferably a work function of 4.5 eV or more.

As a material for the anode, a metal, an alloy, a metal oxide, an electroconductive compound, a mixture thereof, and the like can be used. Examples of the material for the anode include: conductive metal oxides such as tin oxide, zinc oxide, indium oxide and indium-tin-oxide (ITO); metals such as gold, silver, chromium and nickel; a mixture or a layered product of the conductive metal oxide and the metal; inorganic conductive substances such as copper iodide and copper sulfide; organic conductive materials such as polyanilines, polythiophenes (such as PEDOT) and polypyrrole; and a layered product of these substances with ITO.

The cathode of the organic EL device of the present invention has a function of supplying electrons to the electron injection layer, the electron transport layer, the light-emitting layer, and the like.

As a material for the cathode, a metal, an alloy, a metal halide, a metal oxide, an electroconductive compound and a mixture thereof can be used, and examples thereof include: alkali metals (such as lithium, sodium, potassium and cesium) and fluorides and oxides thereof; alkali-earth metals (such as magnesium, calcium and barium) and fluorides and oxides thereof; gold, silver, lead, aluminum, and alloys and mixed metals (such as a sodium-potassium alloy, a sodium-potassium mixed metal, a lithium-aluminum alloy, a lithium-aluminum mixed metal, a magnesium-silver alloy and a magnesium-silver mixed metal); and rare-earth metals (such as ytterbium).

The hole injection layer and the hole transport layer of the organic EL device of the present invention have a function of injecting holes from the anode, a function of transporting holes, or a function of blocking electrons injected from the cathode.

As a material for the hole injection layer and the hole transport layer, a known material can be used, and examples thereof include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidine-based compounds, porphyrin-based compounds, polysilane-based compounds, poly(N-vinylcarbazole) derivatives, organic silane derivatives, and polymers containing these compounds. Other examples of the material for the hole injection layer and the hole transport layer include conductive polymers such as aniline-based copolymers, thiophene oligomers and polythiophene. These materials may be used alone or in combination of two or more types thereof. The hole injection layer and the hole transport layer may have either a single layer structure composed of one type or two or more types of the above materials or a multilayer structure composed of multi layers having the same composition or different compositions.

The electron injection layer and the electron transport layer of the organic EL device of the present invention have a function of injecting electrons from the cathode, a function of transporting electrons, or a function of blocking holes injected from the anode.

Examples of the material for the electron injection layer and the electron transport layer include: triazole derivatives, oxazole derivatives, oxadiazole derivatives, imidazole derivatives, fluorenone derivatives, anthraquinodimethane derivatives, anthrone derivatives, diphenylquinone derivatives, thiopyran dioxide derivatives, carbodiimide derivatives, fluorenylidene methane derivatives, distyrylpyrazine derivatives, tetracarboxylic anhydrides of aromatic ring such as naphthalene and perylene, phthalocyanine derivatives, various metal complexes typified by metal complexes of 8-quinolinol derivatives, metal phthalocyanines and a metal complex having benzoxazole or benzothiazole as a ligand, and organic silane derivatives. These materials may be used alone or in combination of two or more types thereof. The electron injection layer and the electron transport layer may have either a single layer structure composed of one type or two or more types of these materials or a multilayer structure composed of multi layers having the same composition or different compositions.

In the organic EL device of the present invention, an inorganic compound that is an insulator or a semiconductor may also be used as the material for the electron injection layer and the electron transport layer. When the electron injection layer and the electron transport layer are formed of an insulator or a semiconductor, a leak of current can be effectively prevented to enhance electron injection property.

Examples of the insulator include alkali metal chalcogenides, alkaline earth metal chalcogenides, alkali metal halides and alkaline earth metal halides.

The alkaline earth metal chalcogenide is preferably CaO, BaO, SrO, BeO, Bas or CaSe.

Examples of the semiconductor include oxides, nitrides and oxide-nitrides containing at least one type of device selected from the group consisting of Ba, Ca, Sr, Yb, Al, Ga, In, Li, Na, Cd, Mg, Si, Ta, Sb and Zn.

These materials may be used alone or in combination of two or more types thereof.

In the organic EL device of the present invention, a reductive dopant may be added in an interface region between the anode and a film contacted with the anode.

The reductive dopant is preferably at least one type of compound selected from the group consisting of alkali metals, alkaline earth metals, rare-earth metals, oxides of alkali metals, halides of alkali metals, oxides of alkaline earth metals, halides of alkaline earth metals, oxides of rare-earth metals, halides of rare-earth metals, complexes of alkali metals, complexes of alkaline earth metals and complexes of rare-earth metals.

The light-emitting layer of the organic EL device of the present invention has a function of capable of injecting holes from the anode or the hole injection layer and capable of injecting electrons from the cathode or the electron injection layer when a voltage is applied, a function of moving the injected charges (electrons and holes) by the force of the electric field, and a function of providing a site where electrons and holes are recombined and thereby leading to light emission.

The light-emitting layer is preferably composed of the film of the present invention and contains preferably the above composition.

The thickness of each layer constituting the film layer included in the organic EL device of the present invention is varied depending on the type of material and the layer configuration and is preferably few nm to 1 μm.

Examples of the film formation method of each layer include a vacuum deposition method (such as a resistance heating deposition method and an electron beam deposition method), a sputtering method, an LB method, a molecular layering method, and an application method (such as a casting method, a spin coating method, a bar coating method, a blade coating method, a roll coating method, a gravure printing method, a screen printing method and an inkjet method).

Among these film formation methods, the application method is preferable because the manufacturing step could be simplified.

When the film formation of the layer containing the composition of the present invention is performed by the application method, the film of the present invention containing the borane compound (B1) and the conjugated polymer compound (P1) can be manufactured by preparing the composition of the present invention containing a solvent or a dispersion medium, applying the composition onto a given layer (or electrode) to form a film, and drying the resultant film.

When the application method is used, the film formation can be performed in the atmosphere without using a large-scale equipment such as a vacuum system. Therefore, the manufacturing step can be simplified and the manufacturing cost can be reduced.

When other layers are formed by the application method, the manufacturing step can be performed in the same manner with using an appropriate material, solvent, and the like.

The composition of the present invention containing the solvent or the dispersion medium may contain an antioxidant, a viscosity controlling agent, and a resin as a binder.

The resin may be present either in a solution state or in a dispersion state in a solvent. As the resin, there may be used a polymer compound such as polyvinylcarbazole and polyolefin. Specific examples of the resin include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resins, ketone resins, phenoxy resins, polyamide, ethylcellulose, vinyl acetate, ABS resins, polyurethane, melamine resins, unsaturated polyester resins, alkyd resins, epoxy resins and silicon resins.

<Use Application of Device>

The device of the present invention can be used for, for example, a planar light source, a light source for illumination, a light source for a signal, a light source for a backlight, a display device, and a printer head. In the display device, any configurations such as a segment-type and a dot matrix-type can be selected by using a known driving technology, a known driving circuit, and the like.

EXAMPLES

The present invention will be specifically described below with reference to Examples, but it should not be construed that the present invention is limited to these Examples.

The polystyrene-equivalent number average molecular weight (Mw) and the polystyrene-equivalent weight average molecular weight (Mn) of the conjugated polymer compound were measured using gel permeation chromatography (GPC) (manufactured by Shimadzu Corporation: LC-10Avp) according to the procedure below. The conjugated polymer compound was dissolved in tetrahydrofuran so as to have a concentration of about 0.05% by weight and 10 μL of the resultant solution was injected into GPC. Tetrahydrofuran was used as a mobile phase of GPC and the mobile phase was flowed at a flow rate of 2.0 mL/min. As the column, PLgel MIXED-B (manufactured by Polymer Laboratories Ltd.) was used. As the detector, UV-VIS detector (manufactured by Shimadzu Corporation: SPD-10Avp) was used.

The NMR measurement was performed by the following method. Five mg to 40 mg of the measurement sample was dissolved in about 0.5 mL of deuterated chloroform or deuterated dichloromethane. With regard to the resultant solution, the NMR measurement was performed using an NMR apparatus (an apparatus manufactured by JEOL Ltd. (trade name: JME-EX270 FT-NMR system) or an apparatus manufactured by Varian, Inc. (trade name: MERCURY 300)).

The infrared absorption spectrum (IR) was measured using an apparatus (manufactured by Shimadzu Corporation; trade name: FTIR-8300 spectrometer).

The GC-MS spectrum was measured using an apparatus (manufactured by Shimadzu Corporation; trade name: GCMS-QP5000 ver. 2).

The ESI-MS spectrum was measured using an apparatus (manufactured by Waters Corp.; apparatus name: micromass ZQ spectrometer).

The LC-MS measurement was performed by the following method. The measurement sample was dissolved in chloroform or tetrahydrofuran so as to have a concentration of about 2 mg/mL and 1 μL of the resultant solution was injected into LC-MS (manufactured by Agilent Technologies, Inc.; trade name: 1100LCMSD). As the mobile phase of LC-MS, ion-exchanged water, acetonitrile, tetrahydrofuran, or a mixed solution thereof was used and if necessary, acetic acid was added thereto. As the column, L-column 2 ODS (3 μm) (manufactured by Chemicals Evaluation and Research Institute, Japan; inner diameter: 2.1 mm, length: 100 mm, particle diameter: 3 μm) was used.

The TLC-MS measurement was performed by the following method. The measurement sample was dissolved in chloroform, toluene, or tetrahydrofuran and the resultant solution was applied in a small amount onto the surface of a TLC glass plate (manufactured by Merck & Co., Inc.; trade name: Silica gel 60 $F_{254}$) that had been cut previously. The resultant coating was measured by TLC-MS (manufactured by JEOL Ltd.; trade name: JMS-T100TD) using a helium gas heated to 240 to 350° C.

Synthesis Example 1

Synthesis of Low Molecular Compound B-01

According to the scheme below, a low molecular compound B-01 was synthesized.

Into a three-neck flask heated and dried beforehand, anhydrous tripotassium phosphate (12.1 g, 56.7 mmol), copper (I) iodide (0.18 g, 0.95 mmol), and carbazole (4.80 g, 28.4 mmol) were charged and an atmosphere inside the flask was purged with an argon gas. Then, into the flask, 1,2-cyclohexanediamine (456 μL, 3.79 mmol), 2,5-dibromo-m-xylene (5.00 g, 18.9 mmol) heated beforehand to be liquefied, and 1,4-dioxane (20 mL) were charged. The resultant mixture was heated and stirred at 110° C. for 16 hours and then was cooled down to room temperature. The resultant black suspension was dispersed in ethyl acetate (50 mL) and subjected to vacuum filtration. The filtrate was washed three times with each aliquot (50 mL) of saturated saline and was dehydrated with anhydrous sodium sulfate. Thereafter, from the dehydrated filtrate, inorganic salts were removed by vacuum filtration. The filtrate was dried under reduced pressure and the resultant residue was purified by silica gel column chromatography (eluent: hexane/chloroform=7/3 (volume ratio)), followed by distilling off the solvent under reduced pressure, thus obtaining 2.52 g of a low molecular compound B-01 as a colorless solid (yield: 39%).

Melting point: 110.2° C. to 114.1° C.

IR$\nu_{max}$/cm$^{-1}$ 3055 (CH$_3$), 1589 (Ar), 1451 (Ar), 1229 (Ar), 1025 (Ar), 748 (Ar).

GC-MS: m/z$^+$=349 (M$^+$).

$^1$H-NMR (CDCl$_3$, 270 MHz): δ [ppm] 2.52 (s, 6H, CH$_3$), 7.25-7.31 (mult, 2H, 3,6-Ar—H), 7.28 (s, 2H, 2′,6′-Ar—H), 7.36-7.44 (mult, 4H, 1,2,7,8-Ar—H), 8.13 (td, 2H, J=0.92 and 7.8 Hz, 4,5-Ar—H).

Synthesis Example 2

Synthesis of Borane Compound B-012

According to the scheme below, a borane compound B-012 was synthesized from the low molecular compound B-01.

[Chem. 50]

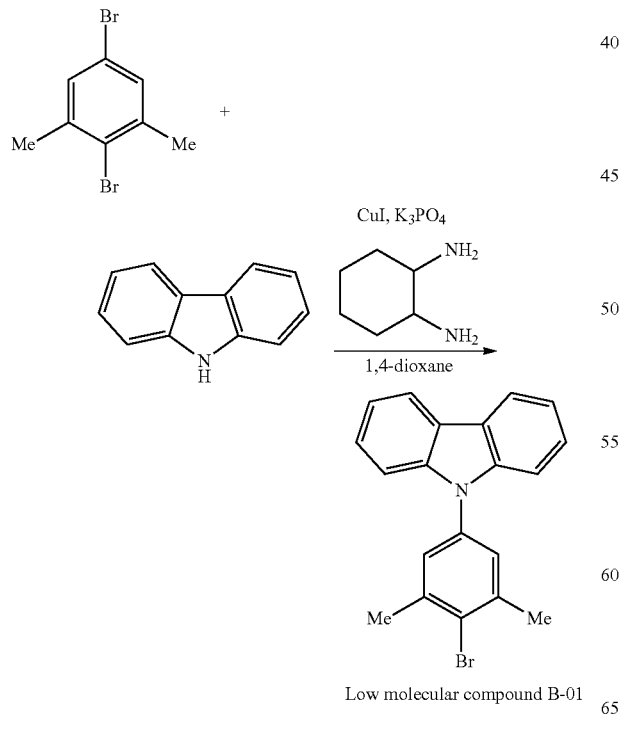

[Chem. 51]

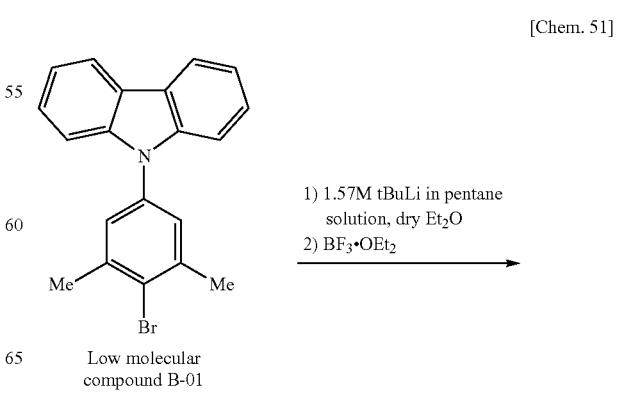

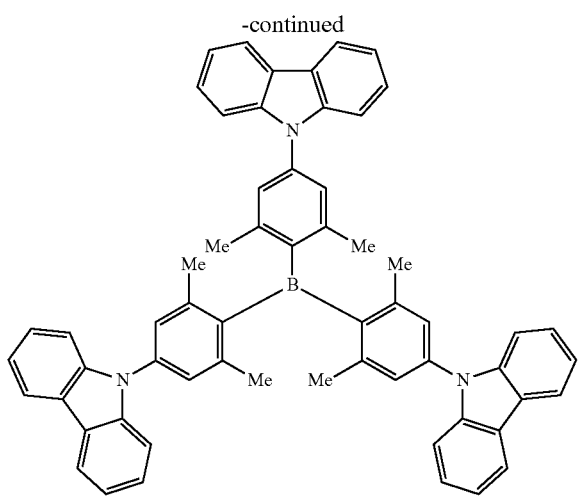

B-012

Into a Schlenk flask heated and dried beforehand, the low molecular compound B-01 (2.28 g, 6.50 mmol) was charged and an atmosphere inside the flask was purged with an argon gas. Then, into the flask, dehydrated diethyl ether (13 mL) was charged and while stirring the resultant reaction mixture, the reaction vessel was cooled down (about −78° C.) in an acetone/dry ice bath. Thereinto, an n-pentane solution of tert-butyllithium (8.90 mL, 14.0 mmol) adjusted to a concentration of 1.57 mol/L was slowly dropped. After the completion of the dropping, the resultant reaction mixture was stirred for 25 minutes while the reaction vessel was cooled down in an acetone/dry ice bath. Then, the acetone/dry ice bath was changed to an ice bath (about 0° C.) to stir the reaction mixture for 25 minutes. Into the resultant yellow solution, a boron trifluoride diethyl ether complex (0.27 mL, 2.17 mmol, and 0.33 equiv.) was dropped. After the completion of the dropping, the ice bath was removed. While stirring the resultant reaction mixture, the temperature of the reaction mixture was slowly elevated to room temperature, followed by further stirring the reaction mixture at room temperature for 18 hours. To the resultant light yellow suspension, distilled water (50 mL) was added to quench the reaction and the reaction product was extracted with dichloromethane (150 mL). The organic phase was washed three times with each aliquot (30 mL) of distilled water and was dehydrated with anhydrous sodium sulfate. Thereafter, from the dehydrated organic phase, inorganic salts were removed by vacuum filtration. The filtrate was dried under reduced pressure and the resultant residue was purified by silica gel column chromatography (eluent: hexane/chloroform=7/3 (volume ratio)), followed by distilling off the solvent under reduced pressure. The resultant light yellow solid was purified by recrystallization (hexane/chloroform=7/3 (volume ratio)) three times repeatedly, thus obtaining 450 mg of a borane compound B-012 (yield: 25%).

IR$\nu_{max}$/cm$^1$ 3051 (CH$_3$), 1591 (Ar), 1451 (Ar), 1346 (Ar), 1230 (Ar), 749 (Ar), 722 (Ar).

ESI-MS: m/z=841 [M+F]$^-$.

$^1$H-NMR (CD$_2$Cl$_2$, 270 MHz): δ [ppm] 2.35 (s, 18H, CH$_3$), 7.30 (s, 6H, 3',5'-Ar—H), 7.30 (dt, 6H, J=1.0 and 7.4 Hz, 3,6-Ar—H), 7.45 (dt, 6H, J=1.3 and 7.6 Hz, 2,7-Ar—H), 7.55 (d, 6H, J=8.2 Hz, 1,8-Ar—H), 8.17 (d, 6H, J=7.8 Hz, 4,5-Ar—H).

Synthesis Example 3

Synthesis of 2-(3'-bromophenyl)pyridine 2-(3'-bromophenyl)pyridine was synthesized according to a synthesis method described in WO02/066552. Specifically, in a nitrogen atmosphere, 2-(3'-bromophenyl)pyridine was obtained by a Suzuki coupling (catalyst: tetrakis(triphenylphosphine) palladium (0), base: 2 mol/L aqueous solution of sodium carbonate, solvent: ethanol, toluene) of 2-bromopyridine with 1.2 equivalent amount of 3-bromophenyl boric acid.

[Chem. 53]

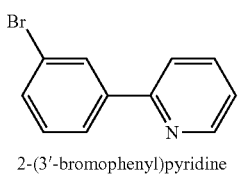

2-(3'-bromophenyl)pyridine

Synthesis Example 4

Synthesis of Ligand A

According to the scheme below, a ligand A was synthesized.

[Chem. 53]

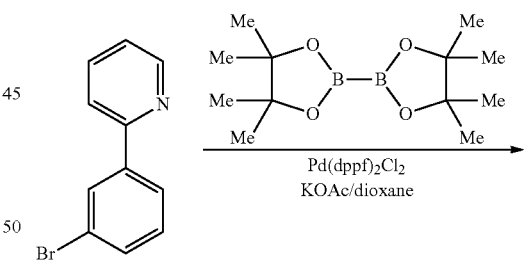

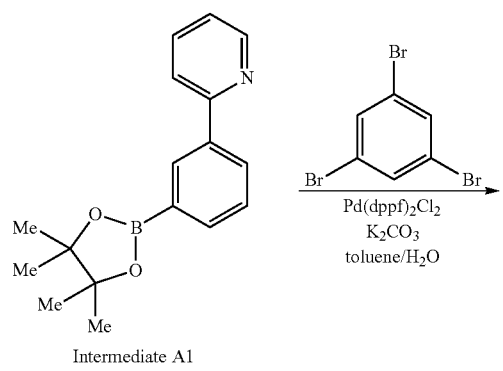

Intermediate A1

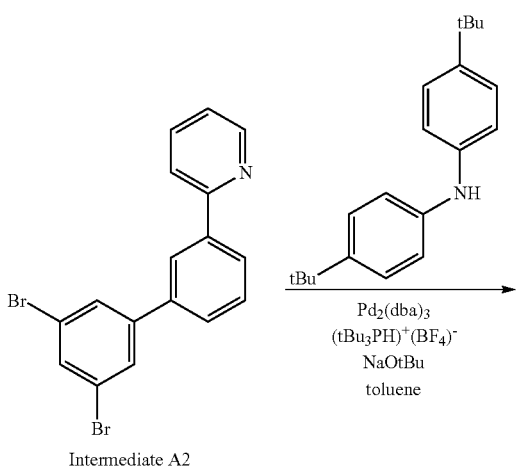

Intermediate A2

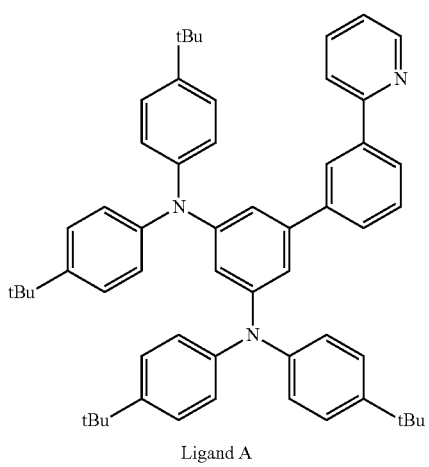

Ligand A

Into a reaction vessel, 2-(3'-bromophenyl)pyridine (95 g, 0.406 mol), bis(pinacolate)diboron (113.4 g, 0.447 mol), potassium acetate (119.5 g, 1.22 mol), and dehydrated 1,4-dioxane (2 L) were charged. An atmosphere of the reaction vessel was thoroughly purged with a nitrogen gas and into the reaction vessel, [1,1'-bis(diphenylphosphino)ferrocene]dichloropalladium (II) (Pd(dppf)$_2$Cl$_2$) (16.6 g, 0.020 mol) was charged, followed by heating and stirring the resultant reaction mixture at 90° C. for 3 hours. The temperature of the reaction mixture was cooled to room temperature and then the reaction mixture was filtered by a celite-precoated funnel, followed by washing the celite used for filtration with ethyl acetate (1.5 L). The filtrate was washed with water (1 L) and next, with saline (1 L). The resultant organic phase was dehydrated with sodium sulfate and the solvent was distilled off under reduced pressure, thus obtaining 160 g of an intermediate A1 as a brown residue.

Into a reaction vessel, the obtained intermediate A1 (100 g, 0.352 mol), 1,3,5-tribromobenzene (443.4 g, 1.408 mol), potassium carbonate (243.5 g, 1.76 mol), toluene (4 L), and water (1 L) were charged. An atmosphere of the reaction vessel was thoroughly purged with an argon gas and into the reaction vessel, [1,1'-bis(diphenylphosphino)ferrocene]dichloropalladium (II) (Pd(dppf)$_2$Cl$_2$) (2.88 g, 0.003 mol) was charged, followed by heating and stirring the resultant reaction mixture at 90° C. for 5 hours. The temperature of the reaction mixture was cooled to room temperature and the reaction mixture was filtered by a celite-precoated funnel, followed by washing the celite used for filtration with ethyl acetate (1.2 L). The organic phase and the aqueous phase were separated from each other and the aqueous phase was extracted with toluene (500 mL) twice. The toluene solution extracted from the aqueous phase was added to the separated organic phase and the resultant solution was washed with saline (1 L). The resultant organic phase was dehydrated with sodium sulfate and the solvent was distilled off under reduced pressure to obtain about 600 g of an ocher residue. The residue was purified by column chromatography (silica gel, eluent: n-hexane/ethyl acetate=90/10 (volume ratio)). The solvent was distilled off under reduced pressure to obtain 88 g of an intermediate A2 as a white solid. A series of reactions were repeated, thus synthesizing a required amount of the intermediate A2.

Into a reaction vessel, the obtained intermediate A2 (90 g, 0.231 mol), bis(4-tert-butylphenyl)amine (182.1 g, 0.647 mol), sodium-tert-butoxide (NaOtBu) (111 g, 1.156 mol), and toluene (2.5 L) were charged. An atmosphere of the reaction vessel was thoroughly purged with an argon gas and into the reaction vessel, tris(dibenzylideneacetone) dipalladium (0) (Pd$_2$(dba)$_3$) (10.59 g, 0.115 mol) and tri-tert-butylphosphonium tetrafluoroborate ((tBuPH)$^+$(BF$_4$)$^-$) (4.69 g, 0.116 mol) were charged, followed by heating and stirring the resultant reaction mixture at 125° C. for 18 hours. The temperature of the reaction mixture was cooled to room temperature and the reaction mixture was filtered by a celite-precoated funnel, followed by washing the celite used for filtration with ethyl acetate (1.2 L). The resultant filtrate was washed with water (1 L) and next, with saline (1 L). The resultant organic phase was dehydrated with sodium sulfate and the solvent was distilled off under reduced pressure to obtain a residue. To the obtained residue, methanol was added to wash the residue to obtain 180 g of a yellow brown solid. The solid was Soxhlet-extracted using toluene and the resultant solid was washed with petroleum ether to obtain 140 g of a crude ligand A as a white solid. The crude ligand A was purified by recrystallization using ethyl acetate, thus obtaining 53 g of a ligand A as a white solid.

$^1$H-NMR (CDCl$_3$, 300 MHz): δ [ppm] 1.30 (s, 36H), 6.91-6.97 (m, 3H), 7.03-7.06 (m, 8H), 7.18-7.28 (m, 9H), 7.43-7.45 (m, 2H), 7.68-7.70 (m, 2H), 7.87-7.97 (m, 2H), 8.65-8.7 (m, 1H).

$^{13}$C-NMR (CDCl$_3$, 100 MHz): δ [ppm] 31.44, 34.21, 117.12, 118.33, 120.61, 122.13, 123.38, 125.84, 127.72, 128.91, 136.67, 139.64, 141.78, 142.76, 144.9, 145.16, 148.95, 149.61, 157.34.

TLC-MS (DART, positive): m/z$^+$=791 [M+H]$^+$

Synthesis Example 5

Synthesis of Light-Emitting Material 01

According to the scheme below, a light-emitting material 01 was synthesized.

[Chem. 54]

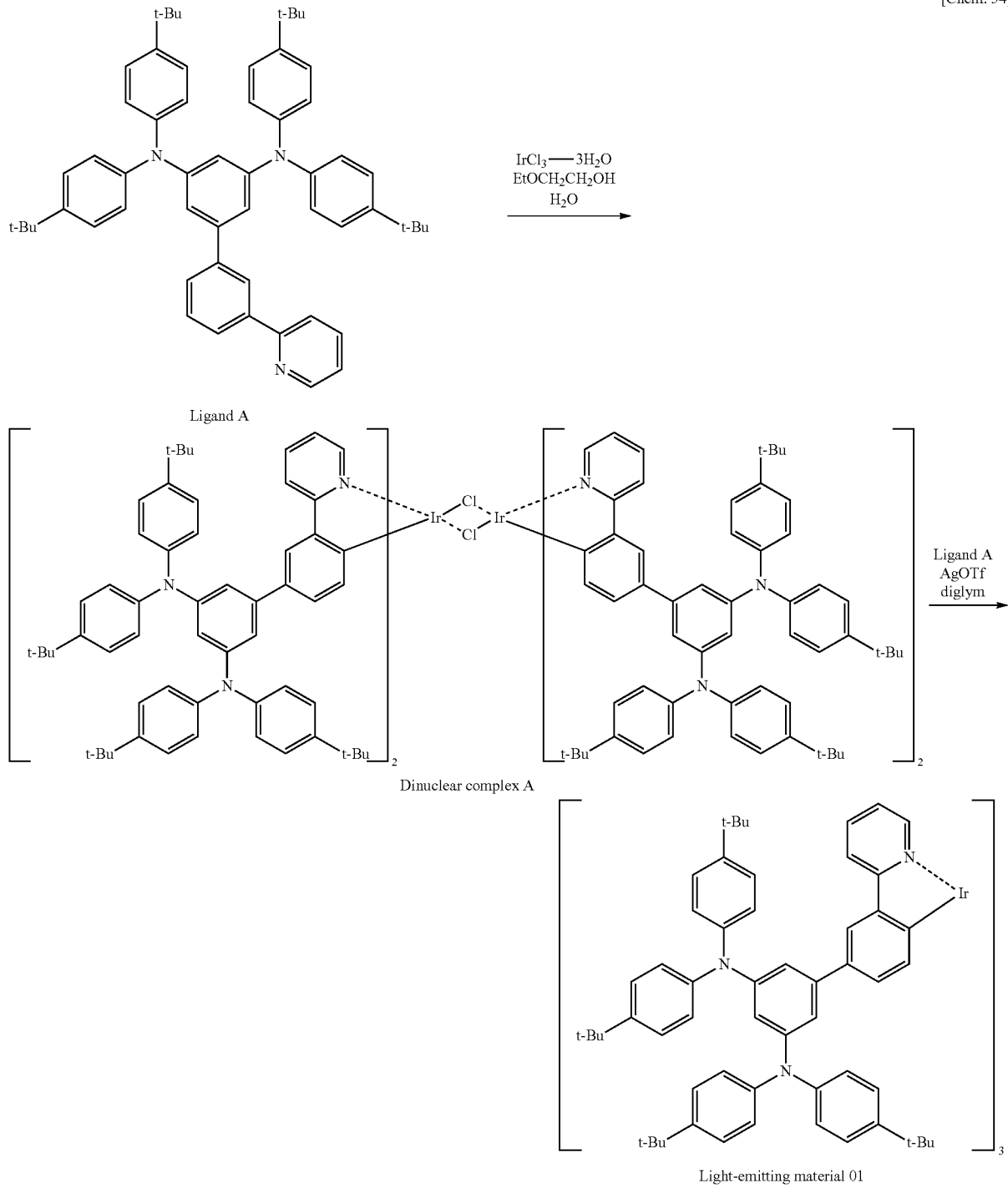

In an argon gas atmosphere, into a 200 mL two-neck eggplant flask, iridium (III) chloride trihydrate (IrCl$_3$.3H$_2$O: 3.00 mmol, 1.06 g), the ligand A (7.50 mmol, 5.93 g), 2-ethoxyethanol (36 mL), and ion-exchanged water (12 mL) were charged and the mixture solution was bubbled with an argon gas for 30 minutes while stirring. Then, using an oil bath set at 160° C., the reaction mixture was heated and stirred for 16 hours. The reaction solution was cooled down to room temperature and then methanol (100 mL) was added to the reaction mixture while stirring the reaction mixture. The generated precipitate was filtered. The precipitate was dispersed in ion-exchanged water (100 mL) and the resultant dispersion was stirred for 30 minutes to filter the dispersion. The resultant precipitate was washed with water (50 mL), methanol (50 mL), and hexane (about 50 mL) in this order and the precipitate was heated-dried to obtain 6.1 g of a solid containing a dinuclear complex A. The obtained solid containing a dinuclear complex A was used directly in the next reaction without further purifying the solid. The reaction procedure was repeated, thus synthesizing a sufficient amount of the solid containing the dinuclear complex A.

In an argon gas atmosphere, into a 200 mL two-neck eggplant flask, the solid containing the dinuclear complex A (2.50 mmol, 9.03 g), the ligand A (12.5 mmol, 9.88 g), and diethylene glycol dimethyl ether (diglym: 25 mL) were charged and the resultant reaction mixture was stirred. Then, to the reaction mixture, silver trifluoromethanesulfonate (AgOTf: 5.00 mmol, 1.31 g) was added and the reaction mixture was heated and stirred for 20 hours using an oil bath set at 150° C. The reaction solution was cooled down to room temperature and methanol (50 mL) was added to the reaction solution while stirring. The generated precipitate was filtered. The precipitate was dispersed in ion-exchanged water (50 mL) and the resultant dispersion was stirred for 30 minutes to filter the dispersion. The resultant precipitate was washed with water (50 mL), methanol (50 mL), and hexane (about 100 mL) in this order. The resultant solid was added to toluene (200 mL) to stir the resultant mixture and the resultant suspension was filtered using a glass filter on which silica gel was laid. From the filtrate, the solvent was distilled off under reduced pressure to obtain 10 g of a solid. The obtained solid was added to toluene in an amount of three times the amount of the solid and the solid was heated and dissolved therein. During the heating, acetonitrile in an amount of six times the amount of the solid was slowly added to the resultant solution to perform recrystallization of the solid. The recrystallization operation was repeated three times, thus obtaining 4.19 g of a light-emitting material 01 (yield: 32.6%).

$^1$H-NMR (300 MHz, CDCl$_3$): δ [ppm] 1.29 (s, 36H), 6.74 (d, 3.96 Hz, 3H), 6.77-6.84 (m, 3H), 6.83-6.90 (m, 4H), 7.00 (d, 8.73 Hz, 24H), 7.14-7.30 (m, 27H), 7.43 (d, 3 Hz, 3H), 7.45-7.52 (m, 3H), 7.57 (s, 3H), 7.72 (d, 4.16 Hz, 3H).

LC-MS (ESI, positive): m/z$^+$=2560 [M+H]$^+$

Synthesis Example 6

Synthesis of 2,5-bis(4,4,5,5-tetramethyl-1,3,2-dioxaborane-2-yl)-1,4-dihexylbenzene

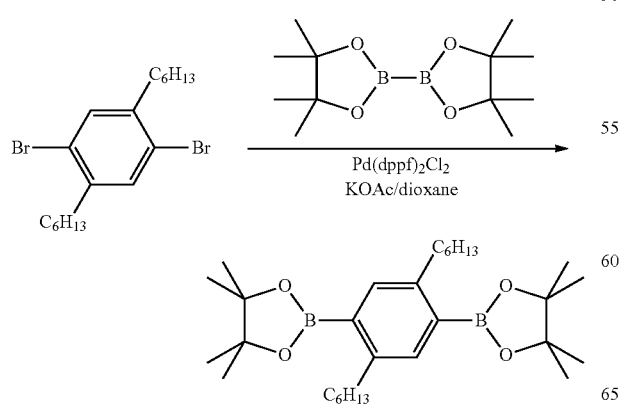

[Chem. 55]

Into a 300 mL four-neck flask, 8.08 g of 1,4-dihexyl-2,5-dibromobenzene, 12.19 g of bis(pinacolate)diboron, and 11.78 g of potassium acetate were charged and a gas phase in the flask was purged with an argon gas. Then, to the resultant reaction mixture, 100 mL of dehydrated 1,4-dioxane was added and the gas phase was purged with an argon gas. To the resultant reaction mixture, 0.98 g of [1,1'-bis(diphenylphosphino)ferrocene]dichloropalladium (II) (Pd(dppf)$_2$Cl$_2$) was added and further, the gas phase was purged with an argon gas, followed by heating and refluxing the resultant reaction mixture for 6 hours. Next, to the reaction mixture, toluene was added and the resultant reaction mixture was washed with ion-exchanged water. To the organic phase after the washing, anhydrous sodium sulfate and activated carbon were added and was filtered by a celite-precoated funnel. The resultant filtrate was concentrated to obtain 11.94 g of a dark brown crystal. The crystal was recrystallized in n-hexane and the resultant crystal was washed with methanol. The resultant crystal was dried under reduced pressure, thus obtaining 4.23 g of 2,5-bis(4,4,5,5-tetramethyl-1,3,2-dioxaborane-2-yl)-1,4-dihexylbenzene as a white needle crystal (yield: 42%).

$^1$H-NMR (CDCl$_3$, 300 MHz): δ [ppm] 0.88 (t, 6H), 1.23-1.40 (m, 36H), 1.47-1.56 (m, 4H), 2.81 (t, 4H), 7.52 (s, 2H).

LC-MS (ESI, positive): m/z$^+$=573 [M+K]$^+$

Synthesis Example 7

Synthesis of N,N-bis(4-bromophenyl)-N-(bicyclo[4.2.0]octa-1,3,5-triene-3-yl)-amine

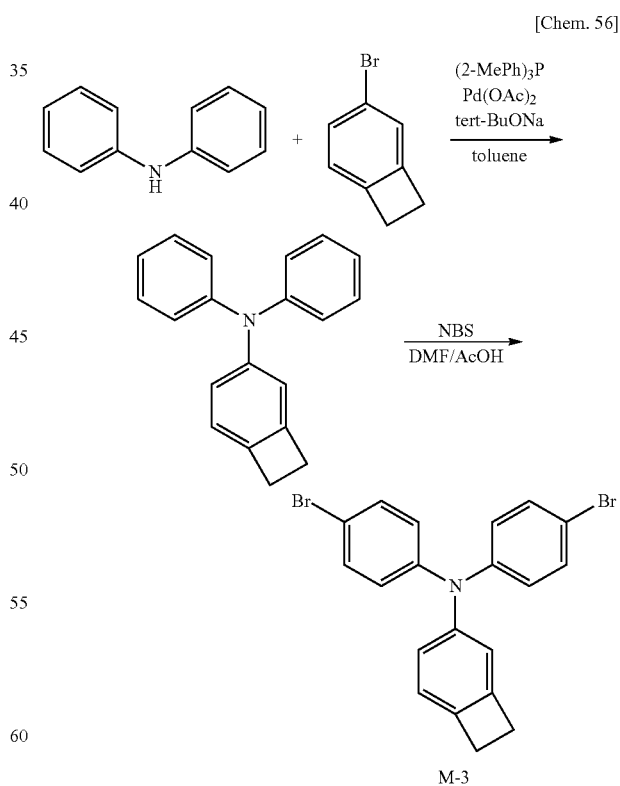

[Chem. 56]

Into a 500 mL three-neck round flask the inside of which was purged with a nitrogen gas, 196 mg of palladium (II) acetate, 731 mg of tris(2-methylphenyl)phosphine, and 100 mL of toluene were charged and the resultant mixture was stirred at room temperature. Then, to the mixture, 20.0 g of diphenylamine, 23.8 g of 3-bromobicyclo[4.2.0]octa-1,3,5-triene, and 400 mL of toluene were added and then 22.8 g of sodium-tert-butoxide was added thereto, followed by heating and refluxing the resultant reaction mixture for 22 hours. To the reaction solution, 30 mL of 1 mol/L hydrochloric acid was added to quench the reaction. The resultant reaction mixture was washed with 100 mL of a 2 mol/L aqueous solution of sodium carbonate and the organic phase was flowed through alumina. The effluents were collected and then the solvent was distilled off therefrom under reduced pressure. To the resultant yellow oily residue, isopropyl alcohol was added and the resultant mixture was stirred to filter a generated precipitate. The precipitate was subjected to recrystallization in isopropyl alcohol to obtain 3-N,N-diphenylaminobicyclo [4.2.0]octa-1,3,5-triene. Into a 250 mL round flask, the obtained 3-N,N-diphenylaminobicyclo[4.2.0]octa-1,3,5-triene (8.00 g) and 100 mL of dimethylformamide (DMF) containing 5 drops of glacial acetic acid were charged and the resultant reaction mixture was stirred. Thereto, N-bromosuccinimide (NBS) (10.5 g) was added and the resultant reaction mixture was stirred for 5 hours. The resultant reaction mixture was poured into 600 mL of methanol/water (volume ratio: 1/1) to quench the reaction and then, a precipitate was generated. The precipitate was filtered and was subjected to recrystallization in isopropyl alcohol, thus obtaining N,N-bis (4-bromophenyl)-N-(bicyclo[4.2.0]octa-1,3,5-triene-3-yl)-amine.

$^1$H-NMR (300 MHz, CDCl$_3$): δ [ppm] 3.11-3.15 (m, 4H), 6.80 (br, 1H), 6.87-6.92 (m, 5H), 6.96 (d, 1H), 7.27-7.33 (m, 4H).

Synthesis Example 8

Synthesis of Conjugated Polymer Compound IL

In a nitrogen gas atmosphere, a mixture of 9,9-dioctyl-(1, 3,2-dioxaborolane-2-yl)-fluorene (21.218 g), 9,9-dioctyl-2, 7-dibromofluorene (5.487 g), N,N-bis(4-bromophenyl)-N', N'-bis(4-n-butylphenyl)-1,4-phenylenediamine (16.377 g), N,N-bis(4-bromophenyl)-N-(bicyclo[4.2.0.]octa-1,3,5-triene-3-yl)-amine (2.575 g) obtained in Synthesis Example 7, methyltrioctylammonium chloride (trade name: Aliquat (registered trade mark) 336; manufactured by Aldrich Corp) (5.17 g), and toluene (400 mL) was heated and stirred. Then, to the resultant reaction mixture, bistriphenylphosphine-palladium dichloride (56.2 mg) and a 17.5% by weight aqueous solution of sodium carbonate (109 mL) were added and the resultant reaction mixture was stirred under heating and refluxing for 6 hours. To the resultant reaction liquid, phenylboronic acid (0.49 g) was added and under refluxing, the resultant reaction mixture was stirred for 2 hours. From the reaction liquid, the aqueous phase was separated and removed and then a solution in which sodium N,N-diethyldithiocarbamate trihydrate (24.3 g) was dissolved in ion-exchanged water (240 mL) was added, followed by stirring at 85° C. for 2 hours. The organic phase and the aqueous phase were separated from each other and the organic phase was washed sequentially with ion-exchanged water twice, with a 3% by weight aqueous solution of acetic acid twice, and with ion-exchanged water twice. The organic phase was dropped into methanol to precipitate a polymer compound and the polymer compound was filtered and dried to obtain a solid. The obtained solid was dissolved in toluene and the resultant solution was flowed through a silica gel column and an alumina column through which toluene was flowed beforehand. The resultant solution was dropped into methanol to precipitate a polymer compound and the polymer compound was filtered and dried, thus obtaining 26.23 g of a conjugated polymer compound IL. With regard to polystyrene-equivalent Mn and Mw of the conjugated polymer compound IL, Mn was $7.8 \times 10^4$ and Mw was $2.6 \times 10^5$.

Here, N,N-bis(4-bromophenyl)-N',N'-bis(4-n-butylphenyl)-1,4-phenylenediamine used for the synthesis was synthesized by a method described in European Patent No. 1310539.

The conjugated polymer compound IL is presumed, from the charged ratios of monomers, to be a conjugated polymer compound having the following structural units in the following molar ratios and having a structure in which a structural unit of (PA) and a structural unit selected from structural units of (PB) are alternating polymerized.

[Chem. 57]

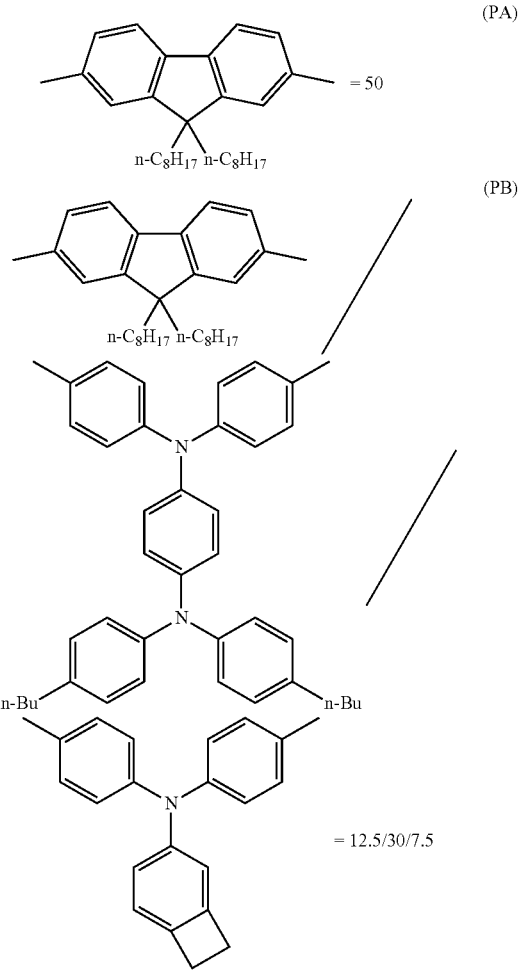

Synthesis Example 9

Synthesis of Conjugated Polymer Compound P-01

In a nitrogen gas atmosphere, a mixture of 2,5-bis(4,4,5,5-tetramethyl-1,3,2-dioxaborolane-2-yl)-1,4-dihexylbenzene (2.742 g) obtained in Synthesis Example 6, 9,9-bis(4-n-hexylphenyl)-2,7-dibromofluorene (3.545 g), and toluene (55 mL) was heated and stirred. Then, to the resultant reaction mixture, palladium (II) acetate (1.9 mg), tris(2-methoxyphenyl) phosphine (11.7 mg), and a 20% by weight aqueous solution of tetraethylammonium hydroxide (18.5 mL) were added and the resultant reaction mixture was stirred under heating and refluxing for 5 hours. To the resultant reaction liquid, phenylboronic acid (67.1 mg), palladium (II) acetate (2.0 mg), tris(2-methoxyphenyl)phosphine (11.6 mg), and a 20% by weight aqueous solution of tetraethylammonium hydroxide (18.5 mL) were added and the resultant reaction solution was stirred for 17 hours under refluxing. From the reaction liquid, the aqueous phase was separated and removed and then a solution in which sodium N,N-diethyldithiocarbamate trihydrate (3.35 g) was dissolved in ion-exchanged water (33 mL) was added, followed by stirring at 85° C. for 2 hours. The organic phase and the aqueous phase were separated from each other and the organic phase was washed sequentially with ion-exchanged water twice, with a 3% by weight aqueous solution of acetic acid twice, and with ion-exchanged water twice. The organic phase was dropped into methanol to precipitate a polymer compound and the polymer compound was filtered and dried to obtain a solid. The obtained solid was dissolved in toluene and the resultant solution was flowed through a silica gel column and an alumina column through which toluene was flowed beforehand. The resultant solution was dropped into methanol to precipitate a polymer compound and the polymer compound was filtered and dried, thus obtaining 3.18 g of a conjugated polymer compound P-01. With regard to polystyrene-equivalent Mn and Mw of the conjugated polymer compound P-01, Mn was $3.5 \times 10^4$ and Mw was $1.0 \times 10^5$.

The conjugated polymer compound P-01 is presumed, from the charged ratios of monomers, to be a conjugated polymer compound having the following structural units in the following molar ratios and having a structure in which the structural units are alternating polymerized.

[Chem. 58]

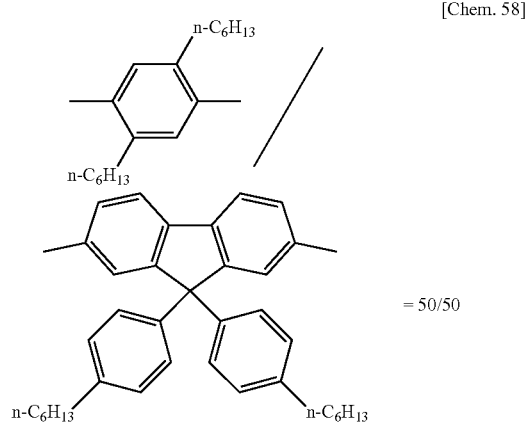

Synthesis Example 10

Synthesis of Conjugated Polymer Compound P-02

In a nitrogen gas atmosphere, a mixture of 9,9-bis(4-n-hexylphenyl)-2,7-bis(4,4,5,5-tetramethyl-1,3,2-dioxaborolane-2-yl)-fluorene (7.389 g), 9,9-dioctyl-2,7-dibromofluorene (4.936 g), N,N'-bis(4-bromophenyl)-N,N'-bis(2,6-dimethyl-4-tert-butylphenyl)-1,4-phenylenediamine (0.740 g), methyltrioctylammonium chloride (trade name: Aliquat (registered trade mark) 336; manufactured by Aldrich Corp) (1.29 g), and toluene (100 mL) was heated and stirred. Then, to the resultant reaction mixture, bistriphenylphosphine-palladium dichloride (7.0 mg) and a 17.5% by weight aqueous solution of sodium carbonate (27 mL) were added and the resultant reaction mixture was stirred under heating and refluxing for 4 hours. To the resultant reaction liquid, a solution in which sodium N,N-diethyldithiocarbamate trihydrate (6.1 g) was dissolved in ion-exchanged water (60 mL) was added and stirred at 85° C. for 2 hours. The organic phase and the aqueous phase were separated from each other and the organic phase was washed sequentially with ion-exchanged water twice, with a 3% by weight aqueous solution of acetic acid twice, and with ion-exchanged water twice. The organic phase was dropped into methanol to precipitate a polymer compound and the polymer compound was filtered and dried to obtain a solid. The obtained solid was dissolved in toluene and the resultant solution was flowed through a silica gel column and an alumina column through which toluene was flowed beforehand. The resultant solution was dropped into methanol to precipitate a polymer compound and the polymer compound was filtered and dried, thus obtaining 5.86 g of a conjugated polymer compound P-02. With regard to polystyrene-equivalent Mn and Mw of the conjugated polymer compound P-02, Mn was $1.1 \times 10^5$ and Mw was $3.6 \times 10^5$.

Here, N,N'-bis(4-bromophenyl)-N,N'-bis(2,6-dimethyl-4-tert-butylphenyl)-1,4-phenylenediamine used for the synthesis was synthesized by a method described in European Patent No. 1394188.

The conjugated polymer compound P-02 is presumed, from the charged ratios of monomers, to be a conjugated polymer compound having the following structural units in the following molar ratios and having a structure in which a structural unit of (PA) and a structural unit selected from structural units of (PB) are alternating polymerized.

[Chem. 59]

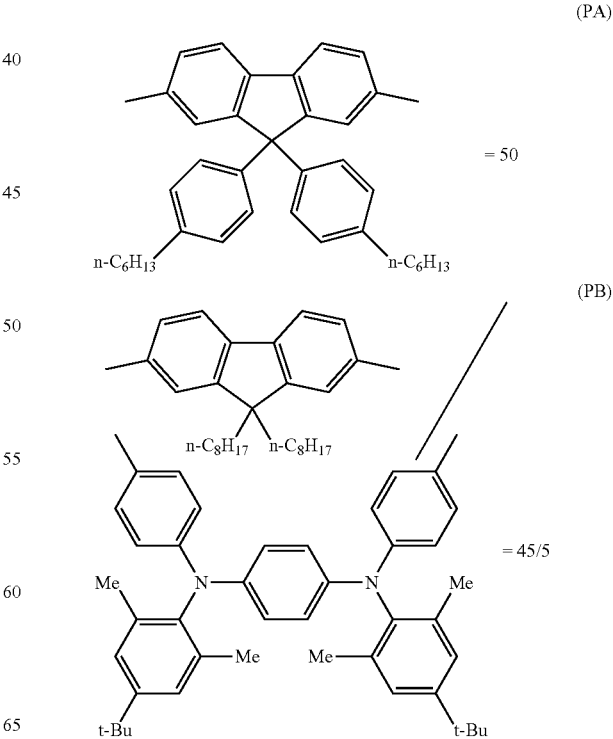

Comparative Example 1

Manufacture of organic EL device Ref 01

A glass substrate having an ITO film of thickness of 45 nm provided thereon by a sputtering method was prepared. Onto the glass substrate, AQ-1200 (manufactured by Plextronics, Inc.), which is a polythiophene-sulfonic acid-based hole injection material, was applied by a spin coating method to form a film in thickness of 50 nm and then the resultant film was dried on a hot plate at 170° C. for 15 minutes. Then, a 0.7% by weight xylene solution of the conjugated polymer compound IL was applied thereonto by a spin coating method (3,200 rpm) so as to form a film having a thickness of about 20 nm. Thereafter, in a nitrogen atmosphere having an oxygen concentration and a water concentration of each 10 ppm or less (based on the weight), the glass substrate was subjected to a thermal treatment on a hot plate at 180° C. for 60 minutes. Thereonto, a composition Ref 01 prepared by mixing a 2.2% by weight xylene solution of the conjugated polymer compound P-01 and a 2.2% by weight xylene solution of the light-emitting material 01 so that the ratio (weight ratio) of conjugated polymer compound P-01: light-emitting material 01 became 90:10 was applied by a spin coating method (2,540 rpm) to form a film (thickness: about 80 nm). Then, in a nitrogen atmosphere having an oxygen concentration and a water concentration of each 10 ppm or less (based on the weight), the resultant film was dried at 130° C. for 10 minutes. Thereonto, sodium fluoride (thickness: about 3 nm) and aluminum (thickness: about 80 nm) were sequentially deposited to form a cathode. After the deposition, by sealing with a glass substrate, an organic EL device Ref 01 was manufactured. The deposition of the metal was initiated after the vacuum degree reached $1 \times 10^{-4}$ Pa or less.

When a voltage was applied to the obtained organic EL device Ref 01, the device exhibited an EL light emission (peak wavelength: 515 nm) attributed to the light-emitting material 01. The maximum luminous efficiency of the device was 15.40 cd/A.

After the current value was set so that the obtained organic EL device Ref 01 had an initial luminance of 8,000 cd/m$^2$, the organic EL device was driven at the constant current to measure a change in luminance with time. As the result thereof, the luminance half-lifetime of the organic EL device Ref 01 was 4.6 hours.

Example 1

Manufacture of Organic EL Device 01

An organic EL device (hereinafter referred to as an "organic EL device 01") was obtained in the same manner as Comparative Example 1, except that a composition 01 prepared by mixing a 2.2% by weight xylene solution of the conjugated polymer compound P-01, a 2.2% by weight xylene solution of the borane compound B-012, and a 2.2% by weight xylene solution of the light-emitting material 01 so that the ratio (weight ratio) of conjugated polymer compound P-01: borane compound B-012: light-emitting material 01 became 80:10:10 was used instead of the composition Ref 01 and that a condition for forming a film of the composition 01 by a spin coating method was set at 2,100 rpm.

When a voltage was applied to the obtained organic EL device 01, the device exhibited an EL light emission (peak wavelength: 515 nm) attributed to the light-emitting material 01. The maximum luminous efficiency of the device was 43.20 cd/A.

After the current value was set so that the obtained organic EL device 01 had an initial luminance of 8,000 cd/m$^2$, the organic EL device was driven at the constant current to measure a change in luminance with time. As the result thereof, the luminance half-lifetime of the organic EL device 01 was 9.0 hours.

That is, the organic EL device 01 exhibited a longer luminance half-lifetime by 2 times compared to the organic EL device Ref 01.

Example 2

Manufacture of Organic EL Device 02

An organic EL device (hereinafter referred to as an "organic EL device 02") was obtained in the same manner as Comparative Example 1, except that a composition 02 prepared by mixing a 2.2% by weight xylene solution of the conjugated polymer compound P-01, a 2.2% by weight xylene solution of the borane compound B-012, and a 2.2% by weight xylene solution of the light-emitting material 01 so that the ratio (weight ratio) of conjugated polymer compound P-01: borane compound B-012: light-emitting material 01 became 60:30:10 was used instead of the composition Ref 01 and that a condition for forming a film of the composition 02 by a spin coating method was set at 1,450 rpm.

When a voltage was applied to the obtained organic EL device 02, the device exhibited an EL light emission (peak wavelength: 515 nm) attributed to the light-emitting material 01. The maximum luminous efficiency of the device was 30.90 cd/A.

After the current value was set so that the obtained organic EL device 02 had an initial luminance of 8,000 cd/m$^2$, the organic EL device was driven at the constant current to measure a change in luminance with time. As the result thereof, the luminance half-lifetime of the organic EL device 02 was 10.4 hours.

That is, the organic EL device 02 exhibited a longer luminance half-lifetime by 2.3 times compared to the organic EL device Ref 01.

Comparative Example 2

Manufacture of Organic EL device Ref 02

An organic EL device (hereinafter referred to as an "organic EL device Ref 02") was obtained in the same manner as Comparative Example 1, except that a 1.2% by weight xylene solution of the conjugated polymer compound P-02 (composition Ref 02) was used instead of the composition Ref 01 and a condition for forming a film of the composition Ref 02 by a spin coating method was set at 2,230 rpm.

When a voltage was applied to the obtained organic EL device Ref 02, the device exhibited an EL light emission having a peak wavelength of 470 nm. The maximum luminous efficiency of the device was 7.84 cd/A.

After the current value was set so that the obtained organic EL device Ref 02 had an initial luminance of 2,500 cd/m$^2$, the organic EL device was driven at the constant current to measure a change in luminance with time. As the result thereof, the luminance half-lifetime of the organic EL device Ref 02 was 0.14 hours.

Comparative Example 3

Manufacture of Organic EL device Ref 03

An organic EL device (hereinafter referred to as an "organic EL device Ref 03") was obtained in the same manner as Comparative Example 1, except that a composition Ref 03 prepared by mixing a 1.2% by weight xylene solution of the conjugated polymer compound P-02 and a 1.2% by weight xylene solution of 4,4'-bis(9-carbazolyl-2,2'-dimethyl-biphenyl (product name: CDBP; manufactured by Luminescence Technology Corp.) so that the ratio (weight ratio) of conjugated polymer compound P-02: CDBP became 90:10 was used instead of the composition Ref 01 and that a condition for forming a film of the composition Ref 03 by a spin coating method was set at 2,230 rpm.

After the current value was set so that the obtained organic EL device 03 had an initial luminance of 2,500 cd/m$^2$, the organic EL device was driven at the constant current to measure a change in luminance with time. As the result thereof, the luminance half-lifetime of the organic EL device Ref 03 was 0.49 hours.

Example 3

Manufacture of Organic EL Device 03

An organic EL device (hereinafter referred to as an "organic EL device 03") was obtained in the same manner as Comparative Example 1, except that a composition 03 prepared by mixing a 1.2% by weight xylene solution of the conjugated polymer compound P-02 and a 1.2% by weight xylene solution of the borane compound B-012 so that the ratio (weight ratio) of conjugated polymer compound P-02: borane compound B-012 became 90:10 was used instead of the composition Ref 01 and that a condition for forming a film of the composition 03 by a spin coating method was set at 2,100 rpm.

When a voltage was applied to the obtained organic EL device 03, the device exhibited an EL light emission having a peak wavelength of 425 nm. The maximum luminous efficiency of the device was 4.38 cd/A.

After the current value was set so that the obtained organic EL device 03 had an initial luminance of 2,500 cd/m$^2$, the organic EL device was driven at the constant current to measure a change in luminance with time. As the result thereof, the luminance half-lifetime of the organic EL device 03 was 2.2 hours.

That is, the organic EL device 03 exhibited a longer luminance half-lifetime by 16 times compared to the organic EL device Ref 02 and by 4.5 times compared to the organic EL device Ref 03.

Example 4

Manufacture of Organic EL Device 04

An organic EL device (hereinafter referred to as an "organic EL device 04") was obtained in the same manner as Comparative Example 1, except that a composition 04 prepared by mixing a 1.2% by weight xylene solution of the conjugated polymer compound P-02 and a 1.2% by weight xylene solution of the borane compound B-012 so that the ratio (weight ratio) of conjugated polymer compound P-02: borane compound B-012 became 80:20 was used instead of the composition Ref 01 and that a condition for forming a film of the composition 04 by a spin coating method was set at 1,740 rpm.

When a voltage was applied to the obtained organic EL device 04, the device exhibited an EL light emission having a peak wavelength of 490 nm. The maximum luminous efficiency of the device was 4.04 cd/A.

After the current value was set so that the obtained organic EL device 04 had an initial luminance of 2,500 cd/m$^2$, the organic EL device was driven at the constant current to measure a change in luminance with time. As the result thereof, the luminance half-lifetime of the organic EL device 04 was 4.6 hours.

That is, the organic EL device 04 exhibited a longer luminance half-lifetime by 33 times compared to the organic EL device Ref 02 and by 9.4 times compared to the organic EL device Ref 03.

As described above, it was confirmed that by using the composition of the present invention containing the conjugated polymer compound (P1) and the borane compound (B1), the luminance half-lifetime of the device is remarkably improved.

The compositions of the light-emitting layer and light-emitting device characteristics of the organic EL devices manufactured in Examples and Comparative Examples are summarized in Table 1 below.

TABLE 1

| | Light-emitting layer | | Light-emitting device characteristics | | | |
| | | | Maximum | Initial | Luminance | Luminance |
| | Composition | Composition (weight ratio) | luminous efficiency (cd/A) | luminance (cd/m$^2$) | half-lifetime (hr) | half-lifetime ratio |
|---|---|---|---|---|---|---|
| Comparative Example 1 | Conjugated polymer compound P-01/ Light-emitting material 01 | 90/10 | 15.40 | 8000 | 4.6 | — |
| Example 1 | Conjugated polymer compound P-01/ Borane compound B-012/ Light-emitting material 01 | 80/10/10 | 43.20 | 8000 | 9.0 | 2.0 times compared to Comparative Example 1 |
| Example 2 | Conjugated polymer compound P-01/ Borane compound B-012/ Light-emitting material 01 | 60/30/10 | 30.90 | 8000 | 10.4 | 2.3 times compared to Comparative Example 1 |
| Comparative Example 2 | Conjugated polymer compound P-02 | 100 | 7.84 | 2500 | 0.14 | — |
| Comparative Example 3 | Conjugated polymer compound P-02/ CDBP*[1] | 90/10 | — | 2500 | 0.49 | — |

TABLE 1-continued

| | Light-emitting layer | | Light-emitting device characteristics | | | |
|---|---|---|---|---|---|---|
| | Composition | Composition (weight ratio) | Maximum luminous efficiency (cd/A) | Initial luminance (cd/m$^2$) | Luminance half-lifetime (hr) | Luminance half-lifetime ratio |
| Example 3 | Conjugated polymer compound P-02/ Borane compound B-012 | 90/10 | 4.38 | 2500 | 2.2 | 16 times compared to Comparative Example 2 4.5 times compared to Comparative Example 3 |
| Example 4 | Conjugated polymer compound P-02/ Borane compound B-012 | 80/20 | 4.04 | 2500 | 4.6 | 33 times compared to Comparative Example 2 9.4 times compared to Comparative Example 3 |

*$^1$4,4'-bis(9-carbazolyl)-2,2'-dimethyl-biphenyl

As can be seen from the Table, it was confirmed that the organic EL device manufactured using the composition of the present invention containing the conjugated polymer compound (P1) and the borane compound (B1) can remarkably improve the luminance half-lifetime in comparison with a conventional organic EL device containing no borane compound.

The invention claimed is:

1. A composition comprising:
a borane compound represented by Formula (B1):

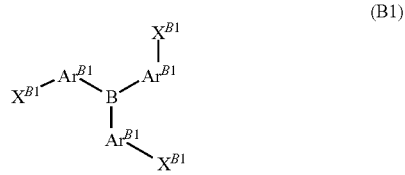

wherein three $Ar^{B1}$ each independently represent an arylene group optionally having a substituent or a divalent aromatic heterocyclic group optionally having a substituent; and three $X^{B1}$ each independently represent an aromatic amino group optionally having a substituent, a monovalent aromatic heterocyclic group optionally having a substituent, an alkyl group optionally having a substituent, or a hydrogen atom; and
a conjugated polymer compound represented by Formula (P1):

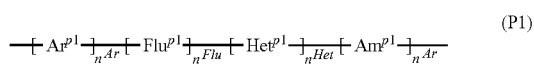

wherein a structural unit $Ar^{p1}$ represents an arylene group optionally having a substituent, with the proviso that the structural unit $Ar^{p1}$ is different from a structural unit $Flu^{p1}$; a structural unit $Flu^{p1}$ represents a fluorenediyl group optionally having a substituent; a structural unit $Het^{p1}$ represents a divalent aromatic heterocyclic group optionally having a substituent; a structural unit $Am^{p1}$ represents a divalent aromatic amine residue optionally having a substituent; $n^{Ar}$, $n^{Flu}$, $n^{Het}$ and $n^{Am}$ are numbers representing molar ratios in the conjugated polymer compound for the structural unit $Ar^{p1}$, the structural unit $Flu^{p1}$, the structural unit $Het^{p1}$ and the structural unit $Am^{p1}$, respectively, and $n^{Ar}$, $n^{Flu}$, $n^{Het}$ and $n^{Am}$ are numbers satisfying $0.4 \leq n^{Flu} \leq 1$, $0.23 \leq n^{Ar} \leq 0.6$, $0 \leq n^{Het} \leq 0.6$ and $0 \leq n^{Am} \leq 0.6$ when defining $n^{Ar}+n^{Flu}+n^{Het}+n^{Am}=1$; polymerization type of the structural unit $Ar^{p1}$, the structural unit $Flu^{p1}$, the structural unit $Het^{p1}$ and the structural unit $Am^{p1}$ in the conjugated polymer compound may be any of alternating polymerization, random polymerization, block polymerization and graft polymerization; when the structural unit $Ar^{p1}$ is plurally present, they may be the same as or different from each other; when the structural unit $Flu^{p1}$ is plurally present, they may be the same as or different from each other; when the structural unit $Het^{p1}$ is plurally present, they may be the same as or different from each other; and when the structural unit $Am^{p1}$ is plurally present, they may be the same as or different from each other.

2. The composition according to claim 1, wherein at least one of the three $Ar^{B1}$ is an arylene group optionally having a substituent.

3. The composition according to claim 1, wherein the three $Ar^{B1}$ are each independently a group represented by Formula (Ar-001):

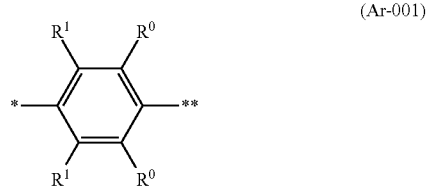

wherein two $R^0$ and two $R^1$ each independently represent a hydrogen atom, an alkyl group, an aryl group, or an aralkyl group; and a symbol "*" represents a binding position to a boron atom and a symbol "**" represents a binding position to $X^{B1}$.

4. The composition according to claim 3, wherein the two $R^1$ are an alkyl group.

5. The composition according to claim 1, wherein the three $Ar^{B1}$ are each independently a group represented by Formula (Ar-007):

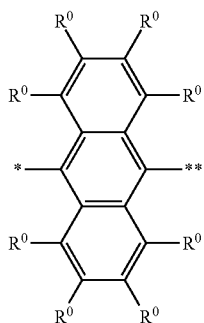

(Ar-007)

wherein a plurality of $R^0$ each independently represent a hydrogen atom, an alkyl group, an aryl group, or an aralkyl group; and a symbol "*" represents a binding position to a boron atom and a symbol "**" represents a binding position to $X^{B1}$.

6. The composition according to claim 1, wherein at least one of the three $X^{B1}$ is an aromatic amino group optionally having a substituent.

7. The composition according to claim 1, wherein the three $X^{B1}$ are each independently a group represented by Formula (X-001):

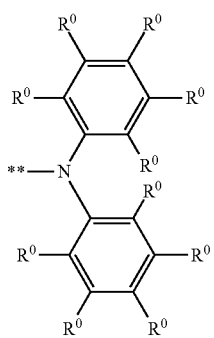

(X-001)

wherein a plurality of $R^0$ each independently represent a hydrogen atom, an alkyl group, an aryl group, or an aralkyl group; and a symbol "**" represents a binding position to $Ar^{B1}$.

8. The composition according to claim 1, wherein at least one of the three $X^{B1}$ is a monovalent aromatic heterocyclic group optionally having a substituent.

9. The composition according to claim 1, wherein the three $X^{B1}$ are each independently a group represented by Formula (X-101):

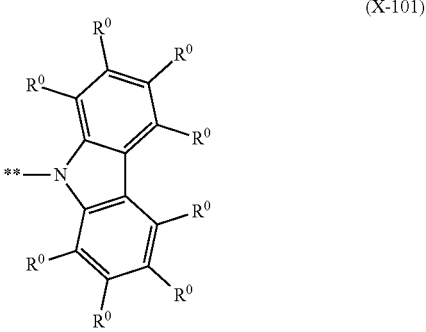

(X-101)

wherein a plurality of $R^0$ each independently represent a hydrogen atom, an alkyl group, an aryl group, or an aralkyl group; and a symbol "**" represents a binding position to $Ar^{B1}$.

10. The composition according to claim 3, wherein the plurality of $R^0$ are each independently a hydrogen atom or an alkyl group.

11. The composition according to claim 1, wherein the $n^{Het}$ and the $n^{Am}$ are 0.

12. The composition according to claim 1, wherein the $n^{Ar}$ and the $n^{Het}$ are 0.

13. The composition according to claim 1, further comprising a phosphorescent light-emitting metal complex.

14. The composition according to claim 1, further comprising a solvent or a dispersion medium.

15. A film manufactured using the composition of claim 1.

16. A device comprising the film of claim 15.

17. The device according to claim 16, wherein the device is an organic electroluminescent device.

\* \* \* \* \*